United States Patent
Shitagaki et al.

(10) Patent No.: US 9,876,187 B2
(45) Date of Patent: Jan. 23, 2018

(54) LIGHT-EMITTING ELEMENT, LIGHT-EMITTING DEVICE, AND ELECTRONIC APPLIANCE

(75) Inventors: Satoko Shitagaki, Kanagawa (JP); Tsunenori Suzuki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1431 days.

(21) Appl. No.: 12/237,042

(22) Filed: Sep. 24, 2008

(65) Prior Publication Data
US 2009/0085474 A1   Apr. 2, 2009

(30) Foreign Application Priority Data
Sep. 27, 2007  (JP) ................... 2007-250934

(51) Int. Cl.
*H01J 1/62*  (2006.01)
*H01L 51/50*  (2006.01)

(52) U.S. Cl.
CPC .... *H01L 51/5048* (2013.01); *H01L 2251/552* (2013.01)

(58) Field of Classification Search
None
See application file for complete search history.

(56) References Cited

U.S. PATENT DOCUMENTS 6,727,644 B2  4/2004 Hatwar et al.
6,806,491 B2  10/2004 Qiu et al.
7,098,474 B2  8/2006 Kanno et al.
7,345,417 B2  3/2008 Shitagaki et al.
(Continued)

FOREIGN PATENT DOCUMENTS

CN  001457105 A  11/2003
CN  001501751 A  6/2004
(Continued)

OTHER PUBLICATIONS

Hamada, Y. et al, "Improved Luminous Efficiency of Organic Light Emitting Diodes by Carrier Trapping Dopants," Japanese Journal of Applied Physics, vol. 40, part 2, No. 7B, Jul. 15, 2001, pp. L753-L755.
(Continued)

*Primary Examiner* — J. L. Yang
(74) *Attorney, Agent, or Firm* — Husch Blackwell LLP

(57) ABSTRACT

In a light-emitting element including an EL layer between a pair of electrodes, between an electrode functioning as an anode and a fourth layer having a light-emitting property (light-emitting layer), the EL layer includes at least a first layer having a hole-injecting property (hole-injecting layer), a second layer having a hole-transporting property (first hole-transporting layer), and a third layer having a hole-transporting property (second hole-transporting layer). The absolute value of the highest occupied molecular orbital level (HOMO level) of the second layer is larger than the absolute value of the highest occupied molecular orbital level (HOMO level) of each of the first layer and the third layer. With such a structure, the rate of transport of holes injected from the electrode functioning as an anode is reduced and emission efficiency of the light-emitting element is improved.

42 Claims, 33 Drawing Sheets

(56) References Cited

U.S. PATENT DOCUMENTS

| | | |
|---|---|---|
| 7,419,727 B2 | 9/2008 | Kojima et al. |
| 7,420,203 B2 | 9/2008 | Tsutsui et al. |
| 7,449,832 B2 | 11/2008 | Itai |
| 7,473,923 B2 | 1/2009 | Tsutsui et al. |
| 7,528,542 B2 | 5/2009 | Kawamura et al. |
| 7,583,020 B2 | 9/2009 | Yamazaki |
| 7,615,925 B2 | 11/2009 | Suzuki et al. |
| 7,649,211 B2 | 1/2010 | Ohsawa |
| 7,659,659 B2 | 2/2010 | Fukuoka et al. |
| 7,732,811 B2 | 6/2010 | Shitagaki et al. |
| 7,800,299 B2 | 9/2010 | Fukuoka et al. |
| 7,807,839 B2 | 10/2010 | Inoue et al. |
| 7,816,668 B2 | 10/2010 | Kawakami et al. |
| 7,875,879 B2 | 1/2011 | Suzuki et al. |
| 7,897,964 B2 | 3/2011 | Kawakami et al. |
| 7,902,742 B2 | 3/2011 | Suzuki et al. |
| 7,919,773 B2 | 4/2011 | Kawakami et al. |
| 7,956,349 B2 | 6/2011 | Tsutsui et al. |
| 7,956,353 B2 | 6/2011 | Tsutsui et al. |
| 7,968,904 B2 | 6/2011 | Itai |
| 8,148,891 B2 | 4/2012 | Tung et al. |
| 8,153,275 B2 | 4/2012 | Hamada et al. |
| 8,471,461 B2 | 6/2013 | Ueno et al. |
| 8,592,052 B2 | 11/2013 | Tsuji et al. |
| 8,704,212 B2 | 4/2014 | Kawakami et al. |
| 8,709,540 B2 | 4/2014 | Yamazaki |
| 8,941,096 B2 | 1/2015 | Tsutsui et al. |
| 9,203,035 B2 | 12/2015 | Kawakami et al. |
| 9,312,507 B2 | 4/2016 | Tsutsui et al. |
| 2004/0229081 A1* | 11/2004 | Arakane et al. ............ 428/690 |
| 2004/0245542 A1 | 12/2004 | Kim |
| 2006/0029828 A1 | 2/2006 | Kanno et al. |
| 2006/0051615 A1 | 3/2006 | Kanno et al. |
| 2006/0142520 A1* | 6/2006 | Jones et al. ............... 526/328.5 |
| 2006/0158102 A1 | 7/2006 | Kawamura et al. |
| 2006/0159955 A1* | 7/2006 | Inoue et al. ............... 428/690 |
| 2006/0251922 A1* | 11/2006 | Liao et al. ................ 428/690 |
| 2007/0085073 A1* | 4/2007 | Inoue et al. ............... 257/40 |
| 2007/0096644 A1 | 5/2007 | Nishimura et al. |
| 2007/0132370 A1 | 6/2007 | Boerner et al. |
| 2007/0141395 A1 | 6/2007 | Chun et al. |
| 2007/0215889 A1 | 9/2007 | Kawakami et al. |
| 2007/0228938 A1* | 10/2007 | Hatwar et al. ............ 313/504 |
| 2008/0006821 A1 | 1/2008 | Suzuki et al. |
| 2009/0072725 A1 | 3/2009 | Suzuki et al. |
| 2009/0079326 A1 | 3/2009 | Seo et al. |
| 2009/0079337 A1 | 3/2009 | Seo et al. |
| 2009/0102368 A1 | 4/2009 | Shitagaki et al. |
| 2010/0109518 A1 | 5/2010 | Suzuki et al. |
| 2010/0171112 A1 | 7/2010 | Ohsawa |
| 2010/0213457 A1 | 8/2010 | Shitagaki et al. |
| 2011/0057560 A1 | 3/2011 | Inoue et al. |
| 2011/0133172 A1 | 6/2011 | Suzuki et al. |
| 2016/0087209 A1 | 3/2016 | Kawakami et al. |

FOREIGN PATENT DOCUMENTS

| | | |
|---|---|---|
| CN | 001682572 A | 10/2005 |
| CN | 001871723 A | 11/2006 |
| CN | 001951947 A | 4/2007 |
| CN | 101041633 A | 9/2007 |
| EP | 0 914 025 A1 | 5/1999 |
| EP | 1 286 568 A1 | 2/2003 |
| EP | 1 318 553 A2 | 6/2003 |
| EP | 1 575 339 A1 | 9/2005 |
| EP | 1 610 594 A1 | 12/2005 |
| EP | 1 643 812 A1 | 4/2006 |
| EP | 1 777 229 A1 | 4/2007 |
| EP | 1 801 899 A2 | 6/2007 |
| EP | 1 919 008 A2 | 5/2008 |
| EP | 2 045 847 A2 | 4/2009 |
| EP | 2 254 155 A1 | 11/2010 |
| EP | 2 275 428 A2 | 1/2011 |
| EP | 2 590 482 A1 | 5/2013 |
| JP | 11-219790 A | 8/1999 |
| JP | 2004-031323 A | 1/2004 |
| JP | 2004-79413 | 3/2004 |
| JP | 2004-119303 A | 4/2004 |
| JP | 2004-362914 A | 12/2004 |
| JP | 2005-510025 | 4/2005 |
| JP | 2005-150084 A | 6/2005 |
| JP | 2005-294187 A | 10/2005 |
| JP | 2006-066890 A | 3/2006 |
| JP | 2006-073640 A | 3/2006 |
| JP | 2007-012946 A | 1/2007 |
| JP | 2007-510303 | 4/2007 |
| JP | 2007-173779 A | 7/2007 |
| JP | 2007-208218 A | 8/2007 |
| JP | 2009-099967 A | 5/2009 |
| JP | 2014-053625 A | 3/2014 |
| KR | 2005-0088417 A | 9/2005 |
| KR | 2006-0002730 A | 1/2006 |
| KR | 10-0721952 B1 | 5/2007 |
| KR | 2007-0091280 A | 9/2007 |
| TW | 200301021 | 6/2003 |
| TW | 550968 | 9/2003 |
| TW | 200424209 | 11/2004 |
| TW | I249368 | 2/2006 |
| TW | 200614869 | 5/2006 |
| TW | 200716513 | 5/2007 |
| TW | 200721564 | 6/2007 |
| TW | 200730030 | 8/2007 |
| TW | 200733804 | 9/2007 |
| WO | WO 03/043383 A1 | 5/2003 |
| WO | WO 2004/091262 A1 | 10/2004 |
| WO | WO 2005/043581 A2 | 5/2005 |
| WO | WO 2007/043354 A1 | 4/2007 |
| WO | WO 2007/044236 A2 | 4/2007 |
| WO | WO 2007/069741 A1 | 6/2007 |
| WO | WO 2007/074879 A1 | 7/2007 |
| WO | WO 2008/120714 A1 | 10/2008 |

OTHER PUBLICATIONS

European Search Report re application No. EP 08016991.5, dated Jul. 22, 2011.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.

Goldsmith, C.R. et al, "C—H Bond Activation by a Ferric Methoxide Complex: Modeling the Rate-Determining Step in the Mechanism of Lipoxygenase," Journal of the American Chemical Society, vol. 124, No. 1, 2002, pp. 83-96.

Ohnishi, T. et al, "A Method of Measuring an Energy Level," *High Molecular EL Materials Development of Light-Emitting High Molecular Compounds*, Kyoritsu Shuppan, Dec. 25, 2004, p. 64-67 (with English translation, pp. 1-3).

Tang, C.W. et al, "Organic Electroluminescent Diodes," Applied Physics Letters, vol. 51, No. 12, Sep. 21, 1987, pp. 913-915.

Shirota, Y. et al, "Multilayered Organic Electroluminescent Device Using a Novel Starburst Molecule, 4,4',4"-tris(3-methylphenylphenylamino)triphenylamine, as a Hole Transport Material," Applied Physics Letters, vol. 65, No. 7, Aug. 15, 1994, pp. 807-809.

Adachi, C. et al, "Molecular Design of Hole Transport Materials for Obtaining High Durability in Organic Electroluminescent Diodes," Applied Physics Letters, vol. 66, No. 20, May 15, 1995, pp. 2679-2681.

Van Slyke, S.A. et al, "Organic Electroluminescent Devices with Improved Stability," Applied Physics Letters, vol. 69, No. 15, Oct. 7, 1996, pp. 2160-2162.

Chinese Office Action re Application No. CN 201210246794.0, dated Jul. 31, 2014.

Korean Office Action re Application No. KR 2008-0094513, dated Apr. 1, 2015.

Taiwan Office Action re Application No. TW 97136736, dated Aug. 21, 2014.

Chinese Office Action re Application No. CN 201210246794.0, dated Dec. 31, 2014.

(56) References Cited

OTHER PUBLICATIONS

Taiwanese Office Action re Application No. TW 104102086, dated Apr. 26, 2016.
Taiwanese Office Action re Application No. TW 104102086, dated Aug. 16, 2016.
Korean Office Action re Application No. KR 2016-0102563, dated Oct. 28, 2016.
Taiwanese Office Action re Application No. TW 104102086, dated Jan. 19, 2017.
Korean Office Action re Application No. KR 2017-0080720, dated Jul. 18, 2017.

* cited by examiner

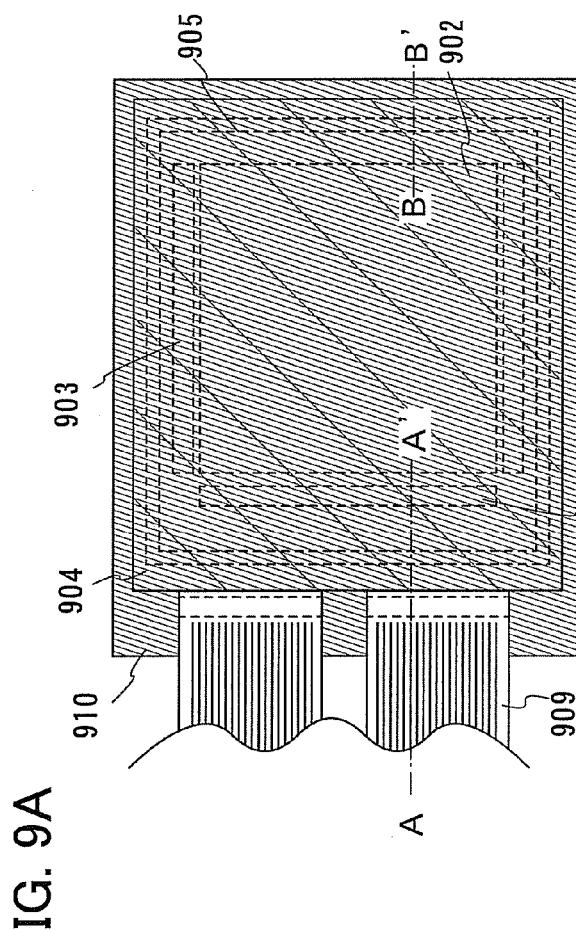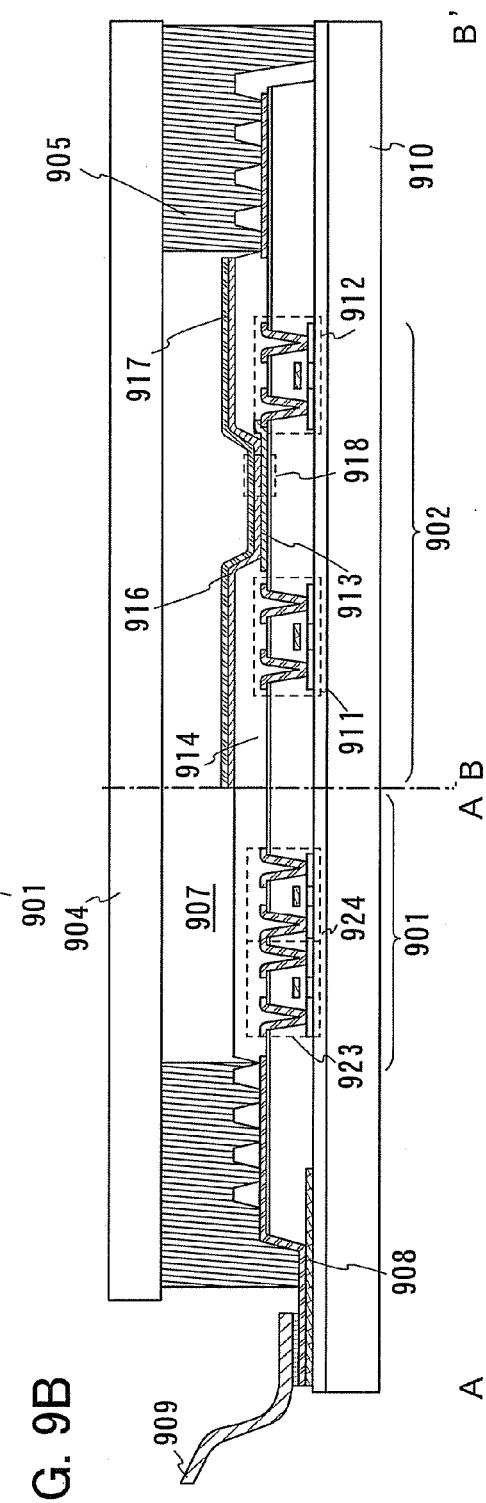
FIG. 9A
FIG. 9B

LIGHT-EMITTING ELEMENT, LIGHT-EMITTING DEVICE, AND ELECTRONIC APPLIANCE

BACKGROUND OF THE INVENTION

1. Field of the Invention

The present invention relates to a current excitation type light-emitting element in which a light-emitting substance is interposed between a pair of electrodes, and a light-emitting device and an electronic appliance each having such a light-emitting element.

2. Description of the Related Art

In recent years, research and development have been actively conducted on light-emitting elements using electroluminescence. In a basic structure of such a light-emitting element, a layer containing a substance having a light-emitting property is interposed between a pair of electrodes. By applying voltage to this element, light emission from the substance having a light-emitting property can be obtained.

Such a light-emitting element, which is a self-luminous element, is advantageous in that pixel visibility is high compared to that of a liquid crystal display, that no backlight is needed, and the like and thought to be suitable for use as a flat panel display element. In addition, such a light-emitting element is highly advantageous in that it can be fabricated to be thin and lightweight. Furthermore, response speed being extremely fast is one of the features, as well.

Furthermore, since such a light-emitting element can be formed into a film form, planar light emission can be easily obtained by forming a large-area element. Because this feature is difficult to achieve with point light sources represented by incandescent light bulbs and LEDs or with line light sources represented by fluorescent lamps, the utility value for surface light sources, which can be applied to a lighting apparatus and the like, is high.

Such light-emitting elements using electroluminescence are broadly classified according to whether the substance having a light-emitting property is an organic compound or an inorganic compound. The present invention relates to a light-emitting element in which an organic compound is used for the substance having a light-emitting property. In that case, by applying voltage to a light-emitting element, electrons and holes are injected from a pair of electrodes into a layer which contains an organic compound having a light-emitting property, so that current flows therethrough. Then, by recombination of these carriers (electrons and holes), the organic compound having a light-emitting property forms an excited state, and emits light when the excited state returns to a ground state.

Because of such a mechanism, such a light-emitting element is called a current-excitation light-emitting element. Note that an excited state of an organic compound can be a singlet excited state or a triplet excited state, and luminescence from a singlet excited state is referred to as fluorescence, and luminescence from a triplet excited state is referred to as phosphorescence.

In improving element characteristics of such a light-emitting element, there are a lot of problems which depend on a substance, and in order to solve the problems, improvement of an element structure, development of a substance, and the like have been carried out.

For example, in Non-Patent Document 1: Tetsuo TSUTSUI and eight others, Japanese Journal of Applied Physics, Vol. 38, L1502 to L1504 (1999), a hole-blocking layer is provided so that a light-emitting element using a phosphorescent substance can emit light efficiently. However, as disclosed in Non-patent Document 1, there are problems in that the hole-blocking layer does not have durability and that the life of the light-emitting element is extremely short.

SUMMARY OF THE INVENTION

In view of the foregoing problems, it is an object of the present invention to provide a light-emitting element that has high emission efficiency and a longer life than a conventional light-emitting element by formation of a light-emitting element having an element structure different from that of the conventional light-emitting element. Furthermore, it is another object of the present invention to provide a light-emitting device and an electronic appliance each having high emission efficiency.

One aspect of the present invention is a light-emitting element including an EL layer between a pair of electrodes. Between an electrode functioning as an anode and a fourth layer having a light-emitting property (a light-emitting layer), the EL layer includes at least a first layer having a hole-injecting property (a hole-injecting layer), a second layer having a hole-transporting property (a first hole-transporting layer), and a third layer having a hole-transporting property (a second hole-transporting layer). The absolute value of the highest occupied molecular orbital level (HOMO level) of the second layer is larger than the absolute values of the highest occupied molecular orbital levels (HOMO levels) of the first layer and the third layer.

Note that in the above structure, the absolute value of the HOMO level of the second layer is larger than the absolute values of the HOMO levels of the first layer and the third layer by 0.1 eV or more.

Further, another aspect of the present invention is a light-emitting element including an EL layer between a pair of electrodes. Between an electrode functioning as an anode and a fourth layer (a light-emitting layer), the EL layer includes at least a first layer (a hole-injecting layer), a second layer (a first hole-transporting layer), and a third layer (a second hole-transporting layer). The absolute value of the highest occupied molecular orbital level (HOMO level) of the second layer is smaller than the absolute values of the highest occupied molecular orbital levels (HOMO levels) of the first layer and the third layer.

Note that in the above structure, the absolute value of the HOMO level of the second layer is smaller than the absolute values of the HOMO levels of the first layer and the third layer by 0.1 eV or more.

That is, by formation of a light-emitting element having one of the two structures described above, the rate of transport of holes injected from the electrode functioning as an anode can be reduced, and therefore the emission efficiency of the light-emitting element can be improved.

Further, besides the above-described structures, between an electrode functioning as a cathode and the fourth layer having a light-emitting property (a light-emitting layer), the EL layer includes at least a fifth layer (a carrier control layer) controlling transport of electrons. The fifth layer includes a first organic compound having an electron-transporting property and a second organic compound having a hole-transporting property. The content of the second organic compound is less than 50% of the total in mass ratio. Note that more preferably, the concentration is controlled so that the content of the second organic compound is greater than or equal to 1 weight % and less than or equal to 20 weight % of the total.

In the above structure, in the case where the fifth layer (carrier control layer) functions kinetically, a difference between the absolute value of the lowest unoccupied molecular orbital level (LUMO level) of the second organic compound and the absolute value of the lowest unoccupied molecular orbital level (LUMO level) of the first organic compound is 0.3 eV or less. A relationship of $P_1/P_2 \geq 3$ is satisfied where the dipole moment of the first organic compound is $P_1$ and the dipole moment of the second organic compound is $P_2$.

In the above structures, preferably, a metal complex is used for the first organic compound and an aromatic amine compound is used for the second organic compound.

Further, besides the above-described structure, in the case where the fifth layer (carrier control layer) functions thermodynamically, the fifth layer includes a first organic compound having an electron-transporting property and a second organic compound having an electron-trapping property. The content of the second organic compound is less than 50% of the total in mass ratio. Note that more preferably, the concentration is controlled so that the content of the second organic compound is greater than or equal to 0.1 weight % and less than or equal to 5 weight % of the total. Further, the absolute value of the LUMO level of the second organic compound is larger than the absolute value of the LUMO level of the first organic compound by 0.3 eV or more. Furthermore, preferably, a metal complex is used for the first organic compound and a coumarin derivative or a quinacridone derivative is used for the second organic compound.

Further, in the above structures, the thickness of the fifth layer is preferably greater than or equal to 5 nm and less than or equal to 20 nm.

Note that in the above structures, the fourth layer (light-emitting layer) preferably includes a substance having an electron-transporting property.

Further, the present invention also covers a light-emitting device using the above-described light-emitting element and an electronic appliance having the light-emitting device. The light-emitting device in this specification refers to an image display device or a light source (including a lighting apparatus). Further, the category of the light-emitting device also includes a module in which a connector such as a flexible printed circuit (FPC), a tape automated bonding (TAB) tape, or a tape carrier package (TCP) is attached to a light-emitting device; a module in which a printed wiring board is provided at an end of a TAB tape or a TCP; and also a module in which an integrated circuit (IC) is directly mounted on a light-emitting element by a chip on glass (COG) method.

According to the present invention, the rate of transport of holes that are carriers of a light-emitting element can be reduced; therefore, the probability of recombination in the light-emitting layer can be increased, and the emission efficiency of the light-emitting layer can be improved. Furthermore, by combining a structure capable of reducing the rate of transport of electrons with the above structure, a light-emitting element having high efficiency and a long life can be obtained. Further, by applying the light-emitting element of the present invention to a light-emitting device and an electronic appliance, a light-emitting device and an electronic appliance each having reduced power consumption can be obtained.

BRIEF DESCRIPTION OF THE DRAWINGS

FIGS. 9A and 9B illustrate an active matrix light-emitting device in Embodiment Mode 4.

DETAILED DESCRIPTION OF THE INVENTION

Hereinafter, embodiment modes of the present invention are described using the accompanying drawings. Note that the present invention is not limited to the description below and a variety of changes can be made in forms and details without departing from the spirit and the scope of the present invention. Therefore, the present invention is not construed as being limited to the description of the embodiment modes given below.

Embodiment Mode 1

In Embodiment Mode 1, a light-emitting element of the present invention, which has a structure that reduces the rate of transport of holes that are carriers of the light-emitting element, is described.

The light-emitting element in Embodiment Mode 1 includes a first electrode functioning as an anode, a second electrode functioning as a cathode, and an EL layer provided between the first electrode and the second electrode. The EL layer may be provided so that it includes at least a hole-injecting layer, a first hole-transporting layer, a second hole-transporting layer, and a light-emitting layer which are stacked in that order from the first electrode side, and that the highest occupied molecular orbital level (HOMO level) of the first hole-transporting layer is deeper (the absolute value is larger) or shallower (the absolute value is smaller) than the HOMO levels of the hole-injecting layer and the second hole-transporting layer. There is no particular limitation on other layers. Further, in the light-emitting element in Embodiment Mode 1, when voltage is applied to each electrode so that the potential of the first electrode 102 is higher than that of the second electrode 104, light can be emitted.

Figure 1A:
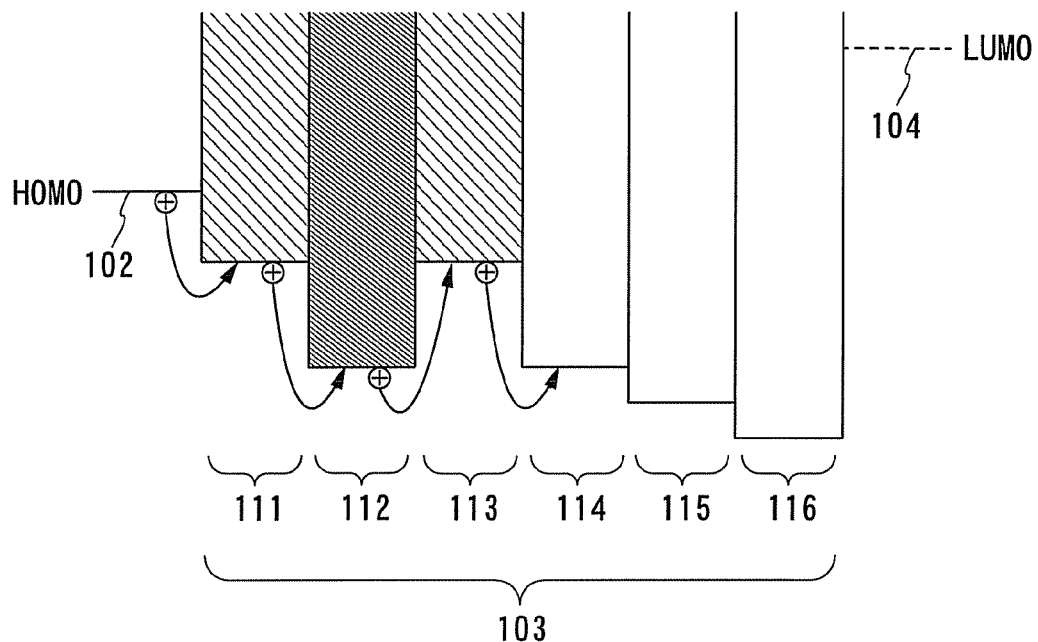
FIGS. 1A and 1B each illustrate a band structure of a light-emitting element in Embodiment Mode 1.
Figure 1B:
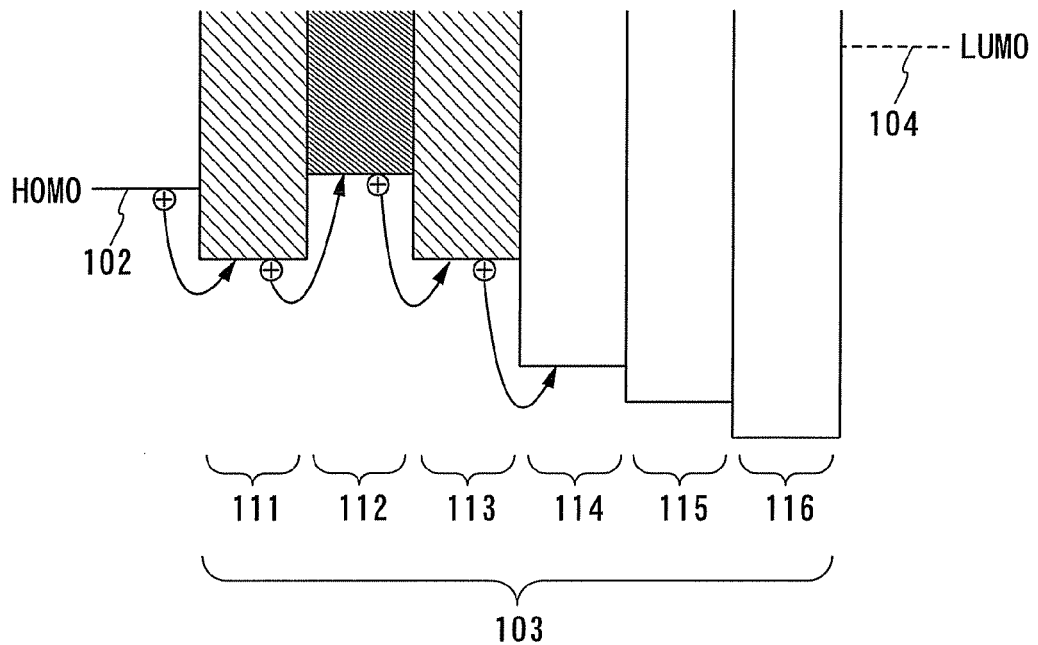

Thus, the case is described in which an EL layer 103 includes, from the first electrode 102 side, a first layer (hole-injecting layer) 111, a second layer (first hole-transporting layer) 112, a third layer (second hole-transporting layer) 113, a fourth layer (light-emitting layer) 114, a fifth layer (electron-transporting layer) 115, and a sixth layer (electron-injecting layer) 116, as shown in FIGS. 1A and 1B.

In FIG. 1A, the EL layer 103 of the light-emitting element is provided so that the highest occupied molecular orbital level (HOMO level) of the second layer (first hole-transporting layer) 112 is deeper (the absolute value is larger) than the HOMO levels of the first layer (hole-injecting layer) and the third layer (second hole-transporting layer). With such a structure, the rate of transport of holes during the period from injection from the first electrode 102 to reach to the fourth layer (light-emitting layer) 114 can be reduced. In this case, specifically, the absolute value of the HOMO level of the second layer 112 is preferably larger than the HOMO levels of the first layer 111 and the third layer 113 by 0.1 eV or more.

On the other hand, in FIG. 1B, the EL layer 103 of the light-emitting element is provided so that the highest occupied molecular orbital level (HOMO level) of the second layer (first hole-transporting layer) 112 is shallower (the absolute value is smaller) than the HOMO levels of the first layer (hole-injecting layer) 111 and the third layer (second hole-transporting layer) 113. Also with such a structure, in a similar manner to that of the case shown in FIG. 1A, the rate of transport of holes during the period from injection from the first electrode 102 to reach to the fourth layer (light-emitting layer) 114 can be reduced. In this case, specifically, the absolute value of the HOMO level of the second layer 112 is preferably smaller than the HOMO levels of the first layer 111 and the third layer 113 by 0.1 eV or more.

Note that since the rate of transport of holes injected from the first electrode 102 can be reduced in either case of FIG. 1A or 1B, the carrier balance in the light-emitting element is improved, and higher efficiency of the element can be achieved. Further, which element structure of FIG. 1A or 1B is employed is determined depending on the HOMO levels of substances used for the first layer (hole-injecting layer) 111, the second layer (first hole-transporting layer) 112, and the third layer (second hole-transporting layer) 113.

Further, particularly in the case where the fourth layer (light-emitting layer) 114 contains a substance having an electron-transporting property, the structure of the present invention, such as the structure of FIG. 1A or 1B, is effective. In the case where the fourth layer (light-emitting layer) 114 contains a substance having an electron-transporting property, an emission region is formed near the interface between the fourth layer (light-emitting layer) 114 and the third layer (second hole-transporting layer) 113. In addition, when cations are generated because of excessive holes in the vicinity of this interface, cations serve as a quencher, whereby the emission efficiency decreases significantly. However, since the rate of transport of holes is controlled in the structure of the present invention, generation of cations in the vicinity of the fourth layer (light-emitting layer) 114 can be suppressed and a decrease in emission efficiency can be suppressed. Accordingly, a light-emitting element with high emission efficiency can be formed.

Figure 2A:
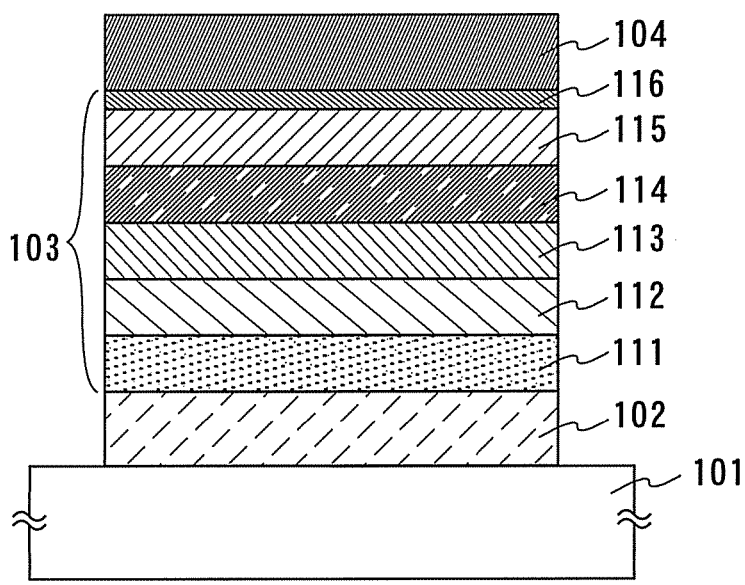
FIGS. 2A and 2B each illustrate a stacked structure of the light-emitting element in Embodiment Mode 1.
Figure 2B:
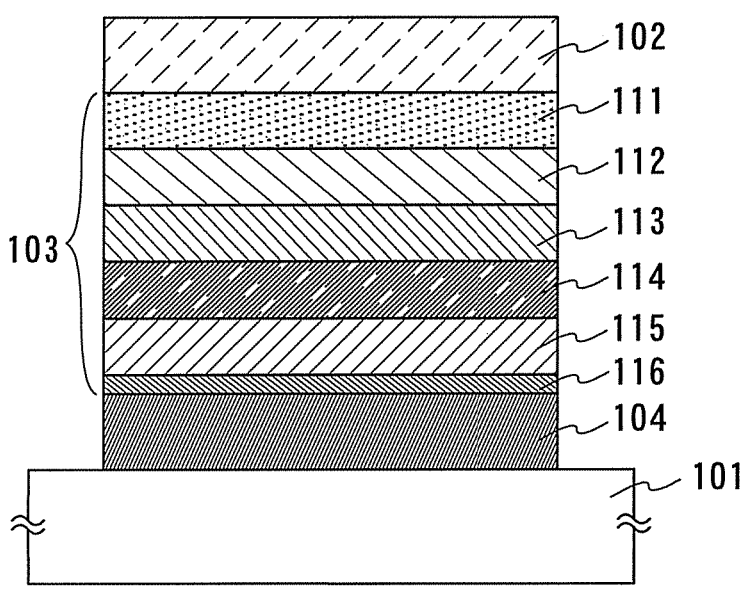

A structure of a light-emitting element in Embodiment Mode 1 is described using FIGS. 2A and 2B. A substrate 101 is used as a support of the light-emitting element. For the substrate 101, glass, quartz, plastics, or the like can be used, for example.

Note that the above substrate 101 may remain in a light-emitting device or an electronic appliance which is a product utilizing the light-emitting element of the present invention, but may only have a function of a support of the light-emitting element without remaining in an end product.

For the first electrode 102 formed over the substrate 101, a metal, an alloy, an electroconductive compound, a mixture thereof, or the like having a high work function (specifically, a work function of 4.0 eV or more) is preferably used. Specifically, indium oxide-tin oxide (ITO: Indium tin oxide), indium tin oxide containing silicon or silicon oxide, indium oxide-zinc oxide (IZO: indium zinc oxide), indium oxide containing tungsten oxide and zinc oxide (IWZO), and the like are given, for example. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitrides of metal materials (e.g., titanium nitride), and the like are given.

Such materials are generally deposited by a sputtering method. For example, indium zinc oxide (IZO) can be deposited by a sputtering method using a target in which 1 wt % to 20 wt % zinc oxide is added to indium oxide; indium oxide containing tungsten oxide and zinc oxide (IWZO) can be deposited by a sputtering method using a target in which 0.5 wt % to 5 wt % tungsten oxide and 0.1 wt % to 1 wt % zinc oxide are added to indium oxide. Alternatively, by application of a sol-gel method or the like, an inkjet method, a spin coating method, or the like may be used for the formation.

Further, in the EL layer 103 formed over the first electrode 102, when a composite material described later is used as a material for the first layer 111 formed in contact with the first electrode 102, any of a variety of metals, alloys, electroconductive compounds, and a mixture thereof can be used as a substance used for the first electrode 102 regardless of whether the work function is high or low. For example, aluminum (Al), silver (Ag), an alloy containing aluminum (AlSi), or the like can also be used.

Alternatively, an element belonging to Group 1 or 2 of the periodic table which is a material having a low work function, that is, an alkali metal such a lithium (Li) or cesium (Cs) or an alkaline-earth metal such as magnesium (Mg), calcium (Ca), or strontium (Sr); an alloy thereof (e.g., MgAg or AlLi); a rare earth metal such as europium (Eu) or ytterbium (Yb); an alloy thereof; or the like can also be used.

Note that in the case where the first electrode 102 is formed using an alkali metal, an alkaline-earth metal, or an alloy thereof, a vacuum evaporation method or a sputtering method can be used. Further alternatively, in the case of using a silver paste or the like, a coating method, an inkjet method, or the like can be used.

For the EL layer 103 formed over the first electrode 102, a known substance can be used, and any of low molecular compounds and high molecular compounds can be used. Note that the substance used to form the EL layer 103 includes not only a structure formed of only an organic compound but also a structure including an inorganic compound as a part.

For forming the EL layer 103, a hole-injecting layer that contains a substance having a high hole-injecting property, a hole-transporting layer that contains a substance having a high hole-transporting property, a light-emitting layer that contains a light-emitting substance, an electron-transporting layer that contains a substance having a high electron-transporting property, an electron-injecting layer that contains a substance having a high electron-injecting property, and the like are combined with each other as appropriate and stacked.

Note that in Embodiment Mode 1, the EL layer 103 is needed to be provided so that it includes at least the hole-injecting layer, the first hole-transporting layer, the second hole-transporting layer, and the light-emitting layer which are stacked in that order from the first electrode 102 side, and that the highest occupied molecular orbital level (HOMO level) of the first hole-transporting layer is deeper (the absolute value is larger) than the HOMO levels of the hole-injecting layer and the second hole-transporting layer.

FIGS. 2A and 2B each illustrate the case where, from the first electrode 102 side, the first layer (hole-injecting layer) 111, the second layer (first hole-transporting layer) 112, the third layer (second hole-transporting layer) 113, the fourth layer (light-emitting layer) 114, the fifth layer (electron-transporting layer) 115, and a sixth layer (electron-injecting layer) 116 are stacked in that order in a similar manner to FIGS. 1A and 1B.

The first layer 111 which is the hole-injecting layer is a layer that contains a substance having a high hole-injecting property. As the substance having a high hole-injecting property, molybdenum oxide, vanadium oxide, ruthenium oxide, tungsten oxide, manganese oxide, or the like can be used. Alternatively, as a low molecular organic compound, a phthalocyanine-based compound such as phthalocyanine (abbreviation: $H_2Pc$), copper(II) phthalocyanine (abbreviation: CuPc), or vanadyl phthalocyanine (abbreviation: VOPc) can be used.

Alternatively, as examples of a low molecular organic compound, there are aromatic amine compounds such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Further alternatively, a high molecular compound (an oligomer, a dendrimer, a polymer, or the like) can be used. For example, there are high molecular compounds such as poly(N-vinylcarbazole) (abbreviation: PVK), poly(4-vinyltriphenylamine) (abbreviation: PVTPA), poly[N-(4-{N'-[4-(4-diphenyamin)phenyl]phenyl-N-phenylamino}phenyl) methacryla mide] (abbreviation: PTPDMA), and poly[N,N'-bis(4-butylphenyl)-N,N'-bis(phenyl)benzidine] (abbreviation: Poly-TPD). Alternatively, a high molecular compound to which acid is added, such as poly(3,4-ethylenedioxythiophene)/poly(styrenesulfonic acid) (PEDOT/PSS), or polyaniline/poly(styrenesulfonic acid) (PAni/PSS), can be used.

Alternatively, for the first layer 111, the composite material in which a substance having an acceptor property is contained in a substance having a high hole-transporting property can be used. Note that by use of the material in which a substance having an acceptor property is contained in a substance having a high hole-transporting property, a material used to form the electrode can be selected regardless of its work function. That is, for the first electrode 102, a material with a low work function can also be used instead of a material with a high work function. Such a composite material can be formed by co-evaporation of a substance having a high hole-transporting property and an acceptor substance. Note that in this specification, composition refers to not only a state where two materials are simply mixed with each other but also a state where charge can be given and received between materials by mixture of a plurality of materials.

As an organic compound used for the composite material, any of a variety of compounds such as aromatic amine compounds, carbazole derivatives, aromatic hydrocarbons, and high molecular compounds (oligomers, dendrimers, polymers, and the like) can be used. Note that the organic compound used for the composite material is preferably an organic compound having a high hole-transporting property. Specifically, a substance having a hole mobility of $10^6$ $cm^2Ns$ or more is preferable. However, any substance other than the above substances may be used as long as it is a substance in which the hole-transporting property is higher than the electron-transporting property. Hereinafter, organic compounds which can be used for the composite material are given in specific terms.

For example, as the organic compounds that can be used for the composite material, there are aromatic amine compounds such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD); carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), and 1,4-bis[4-(N-carbazolyl)phenyl-2,3,5,6-tetraphenylbenzene.

Further, there are aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Furthermore, there are 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenyl-vinyl)biphenyl (abbreviation: DPVBi), and 9,10-bis[4-(2,2-diphenylvinyl)phenyl]anthracene (abbreviation: DPVPA).

Further, as the substance having an acceptor property, an organic compound such as 7,7,8,8-tetracyano-2,3,5,6-tetra-fluoroquinodimethane (abbreviation: F$_4$-TCNQ) or chloranil, or a transition metal oxide can be used. Alternatively, any of oxides of metals belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of their high electron-accepting property. Above all, molybdenum oxide is particularly preferable because it is stable even in the atmosphere, has a low hygroscopic property, and is easy to handle.

Note that the composite material may be formed using the above high molecular compound such as PVK, PVTPA, PTPDMA, or Poly-TPD and the above substance having an acceptor property and then used for the first layer 111.

The second layer 112 which is the first hole-transporting layer and the third layer 113 which is the second hole-transporting layer contain substances each having a high hole-transporting property. As the substance having a high hole-transporting property, for example, it is possible to use any of the following low molecular organic compounds: aromatic amine compounds such as NPB (or ca-NPD), TPD, 4,4'-bis[N-(9,9'-dimethylfluoren-2-yl)-N-phenylamino]biphenyl (abbreviation: DFLDPBi), and 4,4'-bis[N-(spiro-9,9'-bifluoren-2-yl)-N-phenylamino]-1,1'-biphenyl (abbreviation: BSPB); 4,4'-di(N-carbazolyl)biphenyl (abbreviation: CBP); 2,7-di(N-carbazolyl)-spiro-9,9'-bifluorene (abbreviation: SFDCz); 4,4',4''-tris[N-(3-methylphenyl)-N-phenylamino]triphenylamine (abbreviation: MTDATA); N-[4-(9H-carbazol-9-yl)phenyl]-N-phenyl-spiro-9,9'-bifluoren-2-amine (abbreviation: YGASF); N,N'-bis[4-(9H-carbazol-9-yl)phenyl-N,N-diphenylbiphenyl-4,4'-diamine (abbreviation: YGABP); 1,3,5-tri(N-carbazolyl)benzene (abbreviation: TCzB); 4,4',4''-tris(N-carbazolyl)triphenylamine (abbreviation: TCTA); and 4,4'-bis(N-{4-[N-(3-methylphenyl)-N-phenylamino]phenyl}-N-phenylamino)biphenyl (abbreviation: DNTPD). Alternatively, it is possible to use a high molecular compound such as PVK, PVTPA, PTPDMA, or Poly-TPD.

Note that the above substances are mainly substances having a hole mobility of $10^{-6}$ cm$^2$/Vs or more. However, any known substance other than the above substances may be used as long as it is a substance in which the hole-transporting property is higher than the electron-transporting property.

In Embodiment Mode 1, although the above substances can be used for forming the first layer 111, the second layer 112, and the third layer 113, it is necessary to select substances to be used depending on the HOMO levels of the substances so that the highest occupied molecular orbital level (HOMO level) of the substance used for the second layer 112 is deeper (the absolute value is larger) or shallower (the absolute value is smaller) than the HOMO levels of the substances used for the first layer 111 and the third layer 113.

Note that among the above materials, the HOMO level of NPB is −5.27 [eV], the HOMO level of YGASF is −5.44 [eV], the HOMO level of YGABP is −5.40 [eV], and the HOMO level of TCTA is −5.38 [eV]. Therefore, in the case of employing the structure shown in FIG. 1A, a combination in which, for example, a composite material of NPB, the HOMO level of which is −5.27, and molybdenum oxide is used for the first layer 111, YGASF, the HOMO level of which is −5.44, is used for the second layer 112, and NPB, the HOMO level of which is −5.27, is used for the third layer 113 is possible.

On the other hand, among the above materials, the HOMO level of NPB is −5.27 [eV] and the HOMO level of DNTPD is −5.06 [eV]. Therefore, in the case of employing the structure shown in FIG. 1B, a combination in which, for example, a composite material of NPB, the HOMO level of which is −5.27, and molybdenum oxide is used for the first layer 111, DNTPD, the HOMO level of which is −5.06, is used for the second layer 112, and NPB, the HOMO level of which is −5.27, is used for the third layer 113 is possible.

Note that with the above-described structure, a band gap is formed by the first layer 111, the second layer 112, and the third layer 113, and therefore the rate of transport of holes injected from the first electrode 102 can be suppressed. Thus, the amount of holes injected into the fourth layer 114 can be controlled.

The fourth layer 114 is a light-emitting layer containing a substance having a high light-emitting property. For the fourth layer 114, any of low molecular organic compounds given below can be used.

As a light-emitting material which exhibits bluish light, there are N,N'-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), and the like.

As a light-emitting material which exhibits greenish light emission, there are N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N'-triphenyl-1,4-phenylenediamine (abbreviation: 2DPAPA), N-[9,10-bis(1,1'-biphenyl-2-yl)-2-anthryl]-N,N',N'-tiphenyl-1,4-phenylenediamine (abbreviation: 2DPABPhA), N-[9,10-bis(1,1'-biphenyl-2-yl)]-N-[4-(9H-carbazol-9-yl)phenyl]-N- phenylanthracen-2-amine (abbreviation: 2YGABPhA), N,N,9-triphenylanthracen-9-amine (abbreviation: DPhAPhA), and the like.

As a light-emitting material which exhibits yellowish light emission, there are rubrene, 5,12-bis(1,1'-biphenyl-4-yl)-6,11-diphenyltetracene (abbreviation: BPT), and the like. Furthermore, as a light-emitting material which exhibits reddish light emission, there are N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), and the like.

Further, the fourth layer 114 may have a structure in which the above substance having a high light-emitting property is dispersed in another substance. Note that in the case of the dispersing, the concentration of the substance to be dispersed is set to be preferably 20% or less of the total. Further, as a substance in which the substance having a light-emitting property is dispersed, a known substance can be used. It is preferable to use a substance having a lowest unoccupied molecular orbital level (LUMO level) deeper (the absolute value is larger) than that of the substance having a light-emitting property and a highest occupied molecular orbital level (HOMO level) shallower (the absolute value is smaller) than that of the substance having a light-emitting property.

Specifically, a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]-quinolinato)beryllium(II) (abbreviation: BeBq$_2$), bis(2-methyl-8-quinolinolato)(4-phenylphenolato) aluminum(III) (abbreviation: BAlq), bis(8-quinolinolato)zinc(II) (abbreviation: Znq), bis[2-(2-benzoxazolyl)phenolato]zinc(II) (abbreviation: Zn(BOX)$_2$), or bis[2-(2-benzothiazolyl)phenolato]zinc(II) (abbreviation: Zn(BTZ)$_2$) can be used.

Alternatively, a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), or bathocuproine (abbreviation: BCP) can be used.

Alternatively, a condensed aromatic compound such as 9-[4-(N-carbazolyl)]phenyl-10-phenylanthracene (abbreviation: CzPA), 3,6-diphenyl-9-[4-(10-phenyl-9-anthryl)phenyl]-9H-carbazole (abbreviation: DPCzPA), 9, 10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), or 3,3',338-(benzene-1,3,5-triyl)tripyrene (abbreviation: TPB3) can be used.

Alternatively, as a substance in which the substance having a light-emitting property is dispersed, a plurality of kinds of substances can be used. For example, in order to suppress crystallization, a substance for suppressing crystallization, such as rubrene, may be further added. Furthermore, NPB, Alq, or the like may be added in order to efficiently transfer energy to the substance having a light-emitting property. Thus, with a structure in which a substance having a high light-emitting property is dispersed in another substance, crystallization of the fourth layer 114 can be suppressed. Furthermore, concentration quenching caused by the high concentration of the substance having a light-emitting property can also be suppressed.

Further, in particular, among the above substances, a substance having an electron-transporting property is preferably used so that the substance having a light-emitting property is dispersed therein to form the fourth layer 114. Specifically, it is possible to use any of the above metal complexes and heterocyclic compounds; CzPA, DNA, and t-BuDNA among the above condensed aromatic compounds; and further high molecular compounds to be given later as a substance that can be used for the fifth layer 115.

Alternatively, for the fourth layer 114, a high molecular compound given below can also be used.

As a light-emitting material which exhibits bluish light emission, there are poly(9,9-dioctylfluorene-2,7-diyl) (abbreviation: POF), poly[(9,9-dioctylfluorene-2,7-diyl-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene] }(abbreviation: TAB-PFH), and the like.

As a light-emitting material which exhibits greenish light emission, there are poly(p-phenylenevinylene) (abbreviation: PPV), poly[(9,9-dihexylfluorene-2,7-diyl)-alt-co-(benzo[2,1,3]thiadiazol-4,7-diyl)](abbreviation: PFBT), poly[(9,9-dioctyl-2,7-divinylenefluorenylene)-alt-co-(2-methoxy-5-(2-ethylhexyloxy)-1,4-phenylene)], and the like.

As a light-emitting material which exhibits light emission in the range of orangish to reddish, there are poly[2-methoxy-5-(2'-ethylhexoxy)-1,4-phenylenevinylene] (abbreviation: MEH-PPV), poly(3-butylthiophene-2,5-diyl), poly{[9,9-dihexyl-2,7-bis(1-cyanovinylene)fluorenylene]-alt-co-[2,5-bis(N,N-diphenyl amino)-1,4-phenylene]}, poly {[2-methoxy-5-(2-ethylhexyloxy)-1,4-bis(1-cyanovinylenephenylene)]-alt-co-[2,5-bis(N,N-diphenylamino)-1,4-phenylene]} (abbreviation: CN-PPV-DPD), and the like.

The fifth layer 115 is an electron-transporting layer that contains a substance having a high electron-transporting property. For the fifth layer 115, for example, as a low molecular organic compound, a metal complex, such as Alq, Almq$_3$, BeBq$_2$, BAlq, Znq, ZnPBO, or ZnBTZ, or the like can be used. Alternatively, instead of the metal complex, a heterocyclic compound such as PBD, OXD-7, TAZ, TPBI, BPhen, or BCP can be used. The substances given here are mainly substances having an electron mobility of $10^6$ cm$^2$/Vs or more. Note that any substance other than the above substances may be used for the electron-transporting layer as long as it is a substance in which the electron-transporting property is higher than the hole-transporting property. Further, the electron-transporting layer is not limited to a single layer but may have a stacked structure of two or more layers formed of the above substances.

For the fifth layer 115, a high molecular compound can also be used. For example, poly[(9,9-dihexylfluorene-2,7-diyl)-co-(pyridine-3,5-diyl)] (abbreviation: PF-Py), poly[(9, 9-dioctyllfluorene-2,7-diyl)-co-(2,2'-bipyridine-6,6'-diyl)] (abbreviation: PF-BPy), or the like can be used.

Further, the sixth layer 116 is an electron-injecting layer that contains a substance having a high electron-injecting property. For the sixth layer 116, an alkali metal, an alkaline earth metal, or a compound thereof such as lithium fluoride (LiF), cesium fluoride (CsF), or calcium fluoride (CaF$_2$) can be used. Alternatively, a layer formed of a substance having an electron-transporting property which contains an alkali metal, an alkaline earth metal, or a compound thereof, specifically, a layer formed of Alq which contains magnesium (Mg), or the like may be used. Note that in this case, electrons can be more efficiently injected from the second electrode 104.

For the second electrode 104, a metal, an alloy, an electroconductive compound, a mixture thereof, or the like having a low work function (specifically, a work function of 3.8 eV or less) can be used. As specific examples of such cathode materials, elements that belong to Group 1 and 2 of the periodic table, that is, alkali metals such as lithium (Li) and cesium (Cs), alkaline earth metals such as magnesium (Mg), calcium (Ca), and strontium (Sr), alloys containing them (MgAg or AlLi), rare earth metals such as europium (Eu) and ytterbium (Yb), alloys containing them, and the like are given.

Note that in the case where the second electrode 104 is formed using an alkali metal, an alkaline-earth metal, or an alloy thereof, a vacuum evaporation method or a sputtering method can be used. Alternatively, in the case of using a silver paste or the like, a coating method, an inkjet method, or the like can be used Note that by the provision of the sixth layer 116, the second electrode 104 can be formed using any of a variety of conductive materials such as Al, Ag, ITO, and indium tin oxide containing silicon or silicon oxide regardless of whether the work function is high or low. These conductive materials can be deposited by a sputtering method, an inkjet method, a spin coating method, or the like.

Further, as a formation method of the EL layer 103 in which the first layer 111, the second layer 112, the third layer 113, the fourth layer 114, the fifth layer 115, and the sixth layer 116 are stacked in that order, any of a variety of methods can be employed regardless of whether the method is a dry process or a wet process. For example, a vacuum evaporation method, an inkjet method, a spin coating method, or the like can be used. It is to be noted a different formation method may be employed for each layer.

The second electrode 104 can also be formed by a wet process such as a sol-gel method using a paste of a metal material instead of a dry process such as a sputtering method or a vacuum evaporation method or.

In the above-described light-emitting element of the present invention, current flows due to a potential difference generated between the first electrode 102 and the second electrode 104 and holes and electrons recombine in the EL layer 103, so that light is emitted. Then, this emitted light is extracted through one or both of the first electrode 102 and the second electrode 104. Accordingly, one or both of the first electrode 102 and the second electrode 104 is/are an electrode having a light-transmitting property.

Figure 3A:
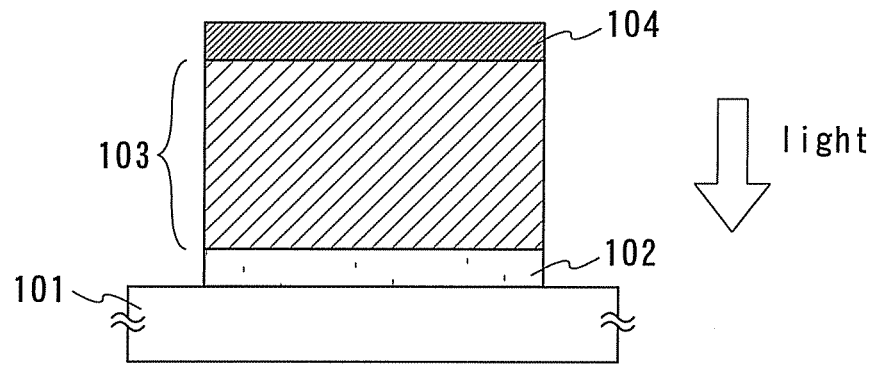
FIGS. 3A to 3C each illustrate a mode of light emission of the light-emitting element in Embodiment Mode 1.
Figure 3B:
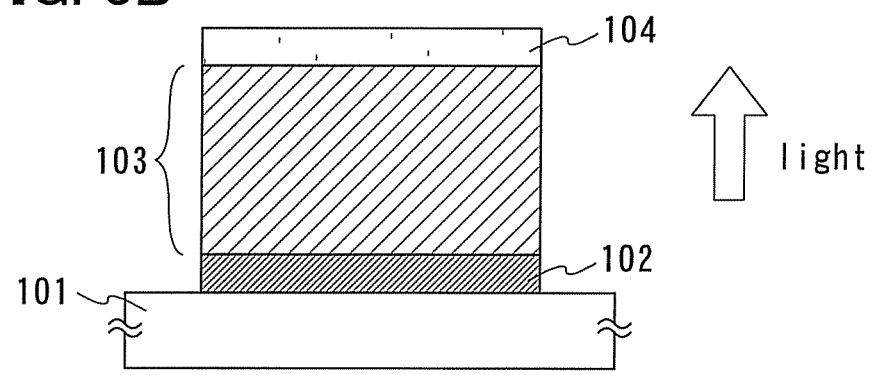
Figure 3C:
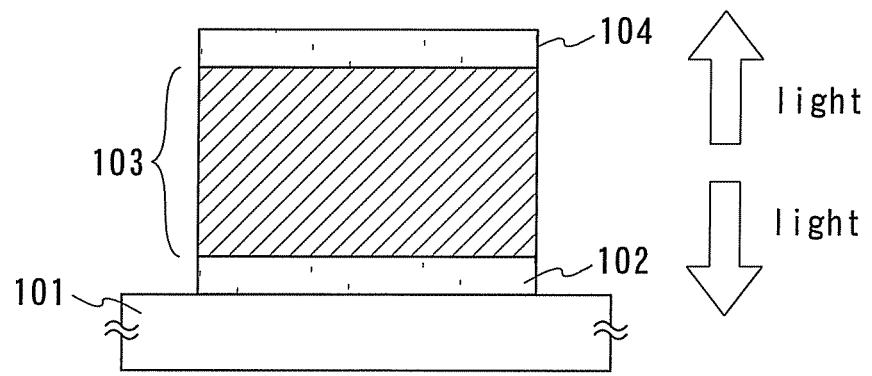

Note that when only the first electrode 102 is an electrode having a light-transmitting property, light emitted from the EL layer 103 is extracted from the substrate 101 side through the first electrode 102, as shown in FIG. 3A. Alternatively, when only the second electrode 104 is an electrode having a light-transmitting property, light emitted from the EL layer 103 is extracted from the opposite side to the substrate 101 side through the second electrode 104, as shown in FIG. 3B. Further alternatively, when the first electrode 102 and the second electrode 104 are both electrodes having a light-transmitting property, light emitted from the EL layer 103 is extracted to both the substrate 101 side and the opposite side, through the first electrode 102 and the second electrode 104, as shown in FIG. 3C.

Note that the structure of the layers provided between the first electrode 102 and the second electrode 104 is not limited to the above structure. Note that any structure other than the above structure may be used as long as it includes at least the first layer 111 which is the hole-injecting layer, the second layer 112 which is the first hole-transporting layer, the third layer 113 which is the second hole-transporting layer, and the fourth layer 114 which is the light-emitting layer, and substances are selected so that the highest occupied molecular orbital level (HOMO level) of the substance used for the second layer 112 is deeper (the absolute value is larger) or shallower (the absolute value is smaller) than the HOMO levels of the substances used for the first layer 111 and the third layer 113.

Alternatively, as shown in FIG. 2B, a structure may be employed in which the second electrode 104 functioning as a cathode, the EL layer 103, and the first electrode 102 functioning as an anode are stacked in that order over the substrate 101. Note that the EL layer 103 in this case has a structure in which the sixth layer 116, the fifth layer 115, the fourth layer 114, the third layer 113, the second layer 112, and the first layer 111 are stacked in that order over the second electrode 104.

Note that by use of the light-emitting element of the present invention, a passive matrix light-emitting device or an active matrix light-emitting device in which drive of the light-emitting element is controlled by a thin film transistor (TFT) can be manufactured.

Note that there is no particular limitation on the structure of the TFT in the case of manufacturing an active matrix light-emitting device. For example, a staggered TFT or an inverted staggered TFT can be used as appropriate. Further, a driver circuit formed over a TFT substrate may be formed of both of an n-type TFT and a p-type TFT or only either an n-type TFT or a p-type TFT. Furthermore, there is no particular limitation on the crystallinity of a semiconductor film used for the TFT. An amorphous semiconductor film may be used, or a crystalline semiconductor film may be used.

In the light-emitting element described in Embodiment Mode 1, the band gap is formed by the first layer 111, the second layer 112, and the third layer 113 which are provided between the first electrode 102 and the fourth layer 114 which is the light-emitting layer, and therefore the rate of transport of holes injected from the first electrode 102 can be suppressed. Thus, the amount of holes injected into the fourth layer 114 can be controlled. Accordingly, the carrier balance of the whole light-emitting element can be improved, and an element having high efficiency can be formed.

Embodiment Mode 2

In Embodiment Mode 2, a light-emitting element of the present invention, which has a structure that reduces the rate of transport of electrons in addition to the structure described in Embodiment Mode 1, which reduces the rate of transport of holes, is described.

The light-emitting element in Embodiment Mode 2 includes a first electrode, a second electrode, and an EL layer provided between the first electrode and the second electrode. The EL layer may be provided so that it includes at least a hole-injecting layer, a first hole-transporting layer, a second hole-transporting layer, a light-emitting layer, and a carrier control layer which are stacked in that order from the first electrode side, and that the highest occupied molecular orbital level (HOMO level) of the first hole-transporting layer is deeper (the absolute value is larger) or shallower (the absolute value is smaller) than the HOMO levels of the hole-injecting layer and the second hole-transporting layer. There is no particular limitation on other layers.

Figure 4A:
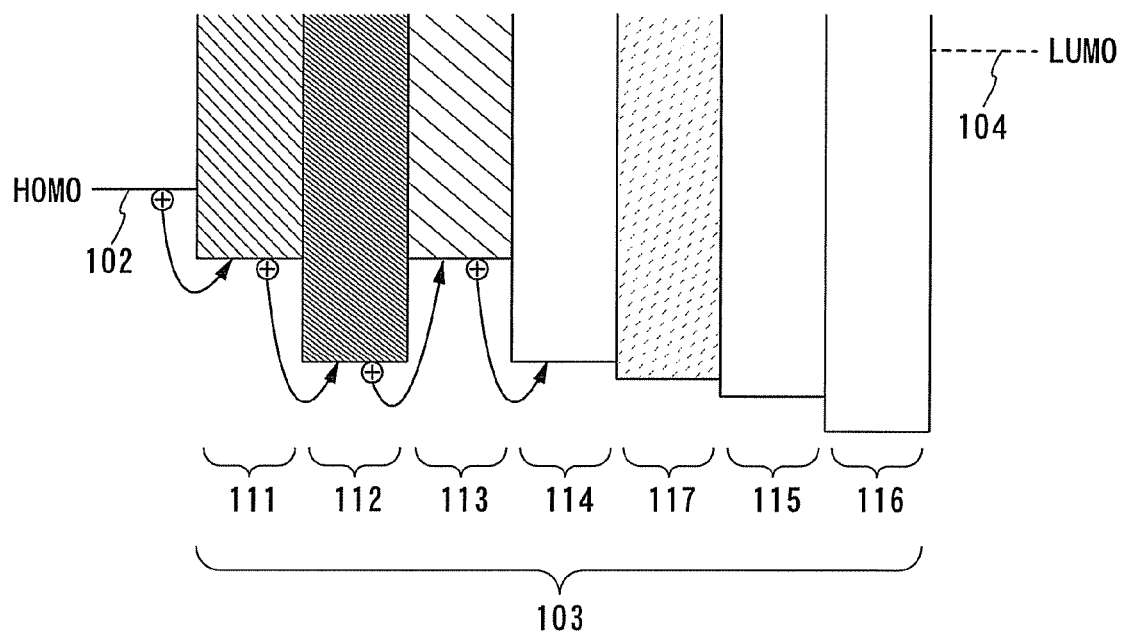
FIGS. 4A and 4B each illustrate a band structure of a light-emitting element in Embodiment Mode 2.
Figure 4B:
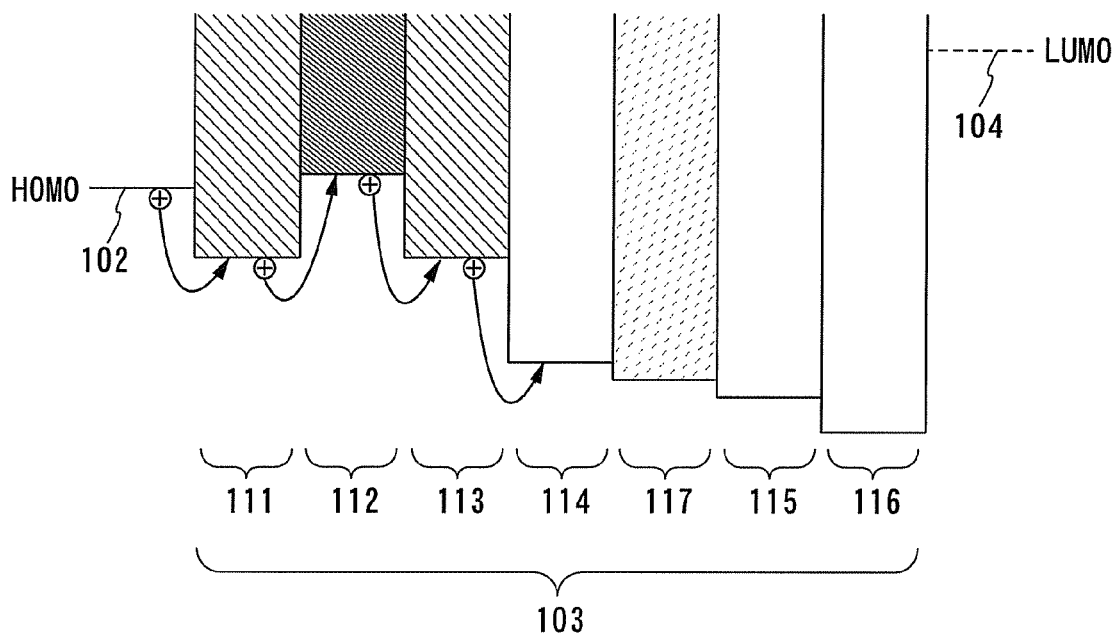

Thus, the case is described in which the EL layer 103 includes, from the first electrode 102 side, the first layer (hole-injecting layer) 111, the second layer (first hole-transporting layer) 112, the third layer (second hole-transporting layer) 113, the fourth layer (light-emitting layer) 114, a seventh layer 117 (a carrier control layer), the fifth layer (electron-transporting layer) 115, and the sixth layer (electron-injecting layer) 116, as shown in FIGS. 4A and 4B.

In FIG. 4A, the EL layer 103 of the light-emitting element is provided so that the highest occupied molecular orbital level (HOMO level) of the second layer (first hole-transporting layer) 112 is deeper (the absolute value is larger) than the HOMO levels of the first layer (hole-injecting layer) and the third layer (second hole-transporting layer). With such a structure, the rate of transport of holes during the period from injection from the first electrode 102 to reach to the fourth layer (light-emitting layer) 114 can be reduced. In this case, specifically, the absolute value of the HOMO level of the second layer 112 is preferably larger than the HOMO levels of the first layer 111 and the third layer 113 by 0.1 eV or more.

On the other hand, in FIG. 4B, the EL layer 103 of the light-emitting element is provided so that the highest occupied molecular orbital level (HOMO level) of the second layer (first hole-transporting layer) 112 is shallower (the absolute value is smaller) than the HOMO levels of the first layer (hole-injecting layer) 111 and the third layer (second hole-transporting layer) 113. Also with such a structure, in a similar manner to that of the case shown in FIG. 4A, the rate of transport of holes during the period from injection from the first electrode 102 to reach to the fourth layer (light-emitting layer) 114 can be reduced. In this case, specifically, the absolute value of the HOMO level of the second layer 112 is smaller than the HOMO levels of the first layer 111 and the third layer 113 by 0.1 eV or more.

Note that the rate of transport of holes injected from the first electrode 102 can be reduced in either case of FIG. 4A or 4B.

Further, in the case of either structure of FIG. 4A or 4B, by the provision of the seventh layer 117 (carrier control layer) between the first electrode 102 and the fourth layer (light-emitting layer) 114, the rate of transport of electrons during the period from injection from the second electrode 104 to reach to the fourth layer (light-emitting layer) 114 can be reduced.

This improves the balance of carriers (electrons and holes) that recombine in the fourth layer (light-emitting layer) 114, and higher efficiency of the element can be achieved. Note that which element structure of or FIGS. 4A and 4B is formed is determined depending on the HOMO levels of substances used for the first layer (hole-injecting layer) 111, the second layer (first hole-transporting layer) 112, and the third layer (second hole-transporting layer) 113.

Further, particularly in the case where the fourth layer (light-emitting layer) 114 contains a substance having an electron-transporting property, the structure of the present invention, such as the structure of FIG. 4A or 4B, is effective. In the case where the fourth layer (light-emitting layer) 114 contains a substance having an electron-transporting property, an emission region is formed near the interface between the fourth layer (light-emitting layer) 114 and the third layer (second hole-transporting layer) 113. In addition, when cations are generated because of excessive holes in the vicinity of this interface, cations serve as a quencher, whereby the emission efficiency decreases significantly. However, since the rate of transport of holes is reduced in the structure of the present invention, generation of cations in the vicinity of the fourth layer (light-emitting layer) 114 can be suppressed and a decrease in emission efficiency can be suppressed. Accordingly, a light-emitting element with high emission efficiency can be formed.

In Embodiment Mode 2, the first electrode 102 functions as an anode and the second electrode 104 functions as a cathode. In other words, when voltage is applied to each electrode so that the potential of the first electrode 102 is higher than that of the second electrode 104, light can be emitted.

Figure 5A:
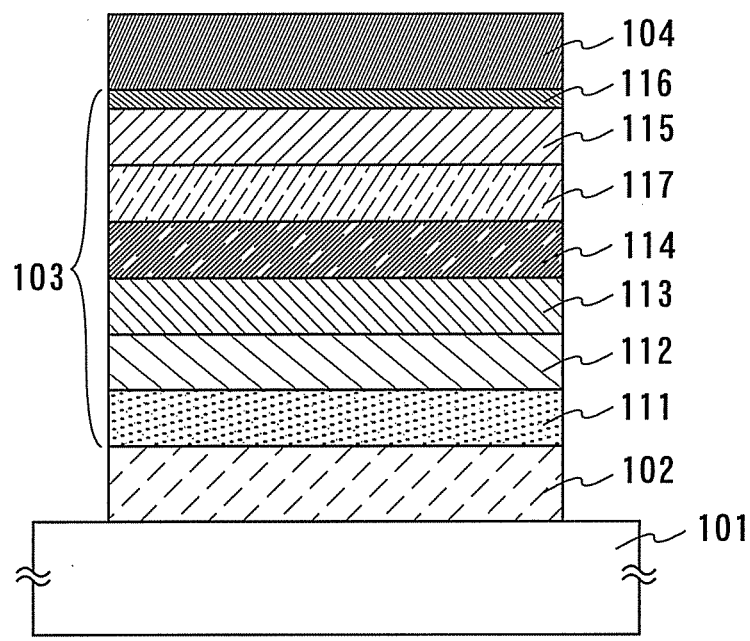
FIGS. 5A and 5B each illustrate a stacked structure of the light-emitting element in Embodiment Mode 2.
Figure 5B:
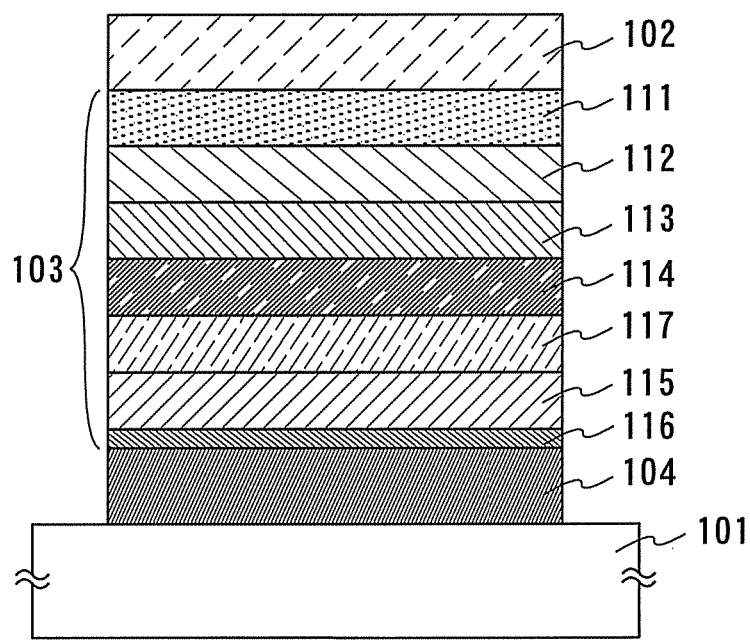

Next, a structure of a light-emitting element in Embodiment Mode 2 is described using FIGS. 5A and 5B. The substrate 101 is used as a support of the light-emitting element. Note that for the substrate 101, glass, quartz, plastics, or the like can be used, for example.

For the first electrode 102 formed over the substrate 101, a metal, an alloy, an electroconductive compound, a mixture thereof, or the like having a high work function (specifically, a work function of 4.0 eV or more) is preferably used, and a substance similar to those described in Embodiment Mode 1 can be used.

Further, in the EL layer 103 formed over the first electrode 102, the structure of the first layer (hole-injecting layer) 111, the second layer (hole-transporting layer) 112, the third layer (hole-transporting layer) 113, and the fourth layer (light-emitting layer) 114 which are stacked in that order from the first electrode 102 side, and a formation method and a material which can be used for each layer are similar to those of Embodiment Mode 1. Therefore, description thereof is omitted in Embodiment Mode 2.

In addition to the structure described in Embodiment Mode 1, Embodiment Mode 2 has a feature of providing, between the fourth layer (light-emitting layer) 114 and the second electrode 104, the seventh layer (hereinafter, referred to as a carrier control layer) 117 that reduces the rate of transport of carriers (electrons); however, for the structure of the carrier control layer, two kinds of methods (a method for kinetically controlling the rate of transport of carriers and a method for thermodynamically controlling the rate of transport of carriers) can be used.

Figure 6A:
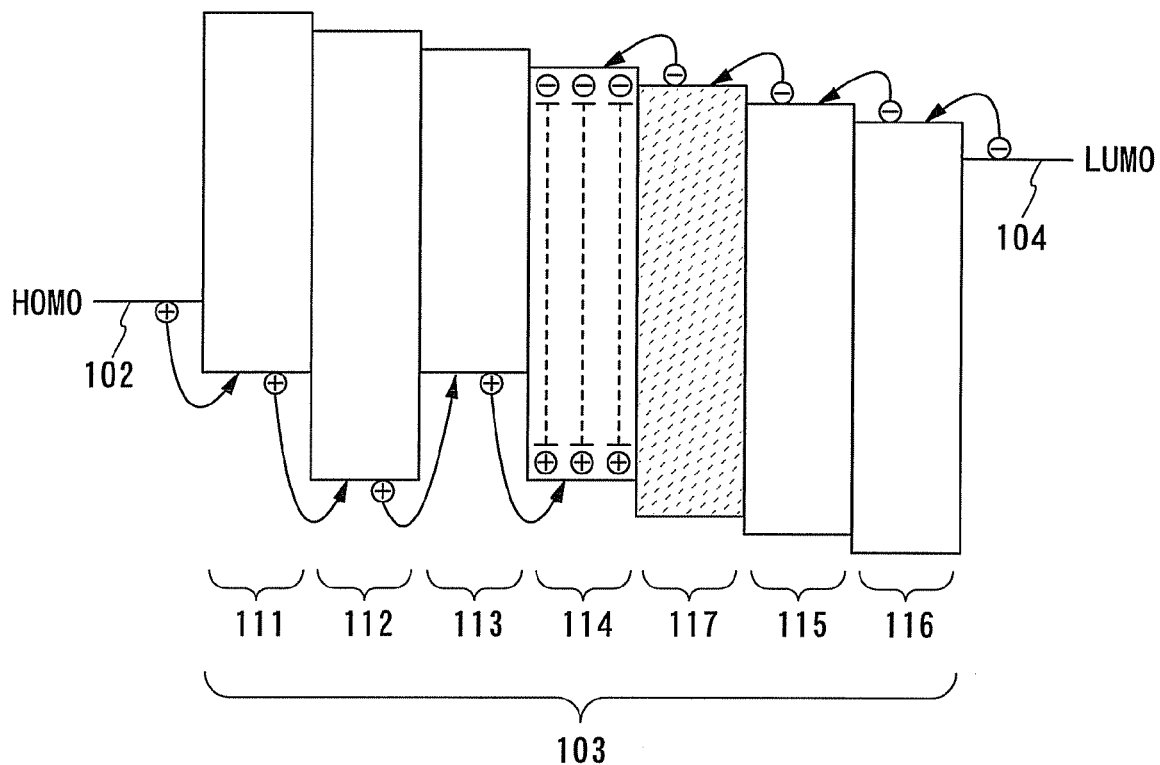
FIGS. 6A and 6B each illustrate a mode of a light emission of the light-emitting element in Embodiment Mode 2.
Figure 6B:
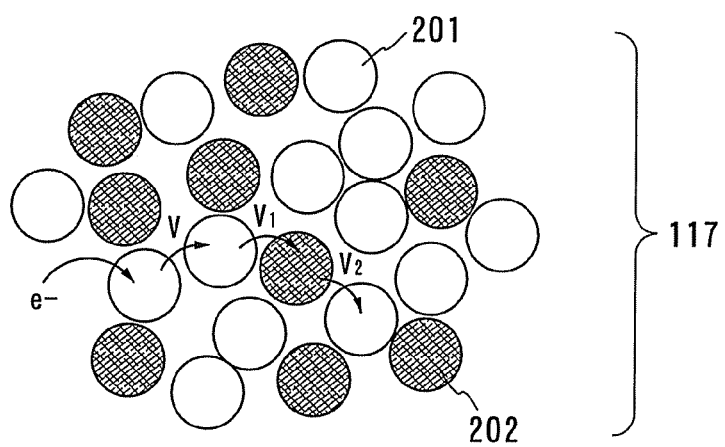

As the first method, the case of kinetically reducing the rate of transport of carriers (electrons) by the seventh layer (carrier control layer) 117 is described. FIGS. 6A and 6B are conceptual diagrams thereof.

The EL layer 103 is formed between the second electrode 104 and the second electrode 104. As a plurality of layers included in the EL layer 103, from the first electrode 102 side, the first layer (hole-injecting layer) 111, the second layer (hole-transporting layer) 112, the third layer (hole-transporting layer) 113, the fourth layer (light-emitting layer) 114, the seventh layer (carrier control layer) 117, the fifth layer (electron-transporting layer) 115, and the sixth layer (electron-injecting layer) 116 are formed in that order.

The seventh layer (carrier control layer) 117 is formed of two or more kinds of organic compounds. Here, the case where the seventh layer (carrier control layer) 117 is formed of two kinds of organic compounds, a first organic compound 201 and a second organic compound 202, as shown in FIG. 6B, is described. Note that an organic compound having a high electron-transporting property (an electron-transporting organic compound) is used as the first organic compound 201 and an organic compound having a high hole-transporting property (a hole-transporting organic compound) is used as the second organic compound 202.

Further, the organic compounds used for the second organic compound 202 and the first organic compound 201 have LUMO levels close to each other. Specifically, a difference between the absolute value of the lowest unoccupied molecular orbital level (LUMO level) of the second organic compound 202 and the absolute value of the LUMO level of the first organic compound 201 is preferably 0.3 eV or less, more preferably 0.2 eV or less. That is, preferably, electrons that are carriers are easily transported between the first organic compound 201 and the second organic compound 202.

In this case, since the second organic compound 202 has a LUMO level as close as that of the first organic compound 201, electrons can be injected. The rate ($v_1$) of electron injection from the first organic compound 201 having an electron-transporting property into the second organic compound 202 having a hole-transporting property or the rate ($v_2$) of electron injection from the second organic compound 202 into the first organic compound 201 is smaller than the rate (v) of electron injection between the first organic compounds 201.

Thus, by forming the seventh layer 117 using the first organic compound 201 having an electron-transporting property and the second organic compound 202 having a hole-transporting property, the rate of transport of electrons in the seventh layer 117 can be reduced compared to the case where the seventh layer 117 is formed of only the first organic compound 201. That is, by forming the seventh layer 117 using the first organic compound 201 and the second organic compound 202, the rate of transport of carriers (electrons) in the seventh layer 117 can be reduced.

Note that in the case where the seventh layer 117 is formed of the first organic compound 201 and the second organic compound 202, the concentration is preferably controlled so that the content of the second organic compound 202 is less than 50% of the total in mass ratio. Further preferably, the concentration is controlled so that the content of the second organic compound 202 is greater than or equal to 1 weight % and less than or equal to 20 weight % of the total.

Note that as the first organic compound 201 contained in the seventh layer 117, specifically, there are metal complexes such as Alq, Almq$_3$, BeBq$_2$, BAlq, Znq, ZnPBO, and ZnBTZ; heterocyclic compounds such as PBD, OXD-7, TAZ, TPBI, BPhen, and BCP; and condensed aromatic compounds such as CzPA, DPCzPA, DPPA, DNA, t-BuDNA, BANT, DPNS, DPNS2, and TPB3. Alternatively, a high molecular compound such as poly[(9,9-dihexylfluorene-2,7-diyl)-co-(pyridine-3,5-diyl)](abbreviation: PF-Py) or poly[(9,9-dioctyllfluorene-2,7-diyl)-co-(2,2'-bipyridine-6,6'-diyl)] (abbreviation: PF-BPy) can be used.

Further, for the second organic compound 202 contained in the seventh layer 117, specifically, a condensed aromatic hydrocarbon such as 9,10-diphenylanthracene (abbreviation: DPAnth) or 6,12-dimethoxy-5,11-diphenylchrysene; or an aromatic amine compound such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB can be used. Alternatively, a high molecular compound such as PVK, PVTPA, PTPDMA, or Poly-TPD can be used.

The above materials are combined with each other to form the seventh layer 117, and accordingly transport of electrons from the first organic compound 201 to the second organic compound 202 or from the second organic compound 202 to the first organic compound 201 is suppressed so that the rate of transport of electrons of the seventh layer 117 can be suppressed. Further, since the seventh layer 117 has a structure in which the second organic compound 202 is dispersed in the first organic compound 201, crystallization or aggregation over time is not easily caused. Thus, the above-described effect of suppressing electron transport does not easily change over time. As a result, also, the carrier balance does not easily change over time. This leads to an increase in the life of the light-emitting element, that is, improvement in reliability.

Note that among the combinations described above, a combination of a metal complex as the first organic compound 201 and an aromatic amine compound as the second organic compound 202 is preferable. A metal complex has a large dipole moment as well as a high electron-transporting property, whereas an aromatic amine compound has a relatively small dipole moment as well as a high hole-transporting property. Thus, by combination of substances whose dipole moments greatly differ from each other, the above-described effect of suppressing electron transport can be further increased. Specifically, where the dipole moment of the first organic compound 201 is $P_1$ and the dipole moment of the second organic compound 202 is $P_2$, a combination satisfying $P_1/P_2 \geq 3$ is preferable.

For example, the dipole moment of Alq that is a metal complex is 9.40 debye, and the dipole moment of 2PCAPA that is an aromatic amine compound is 1.15 debye. Accordingly, in the case where an organic compound having an electron-transporting property, such as a metal complex, is used as the first organic compound 201 and an organic compound having a hole-transporting property, such as an aromatic amine compound, is used as the second organic compound 202, $P_1/P_2 \geq 3$ is preferably satisfied.

Further, an emission color of the second organic compound contained in the seventh layer 117 and an emission color of the substance having a high light-emitting property which is contained in the fourth layer (light-emitting layer) 114 are preferably similar colors. Specifically, a difference between the peak value of the emission spectrum of the second organic compound and the peak value of the emission spectrum of the substance having a high light-emitting property is preferably within 30 nm. The difference within 30 nm allows the emission color of the second organic compound and the emission color of the substance having a high light-emitting property to be similar colors. Therefore, if the second organic compound emits light due to a change in voltage or the like, a change in emission color can be suppressed.

Figure 7:
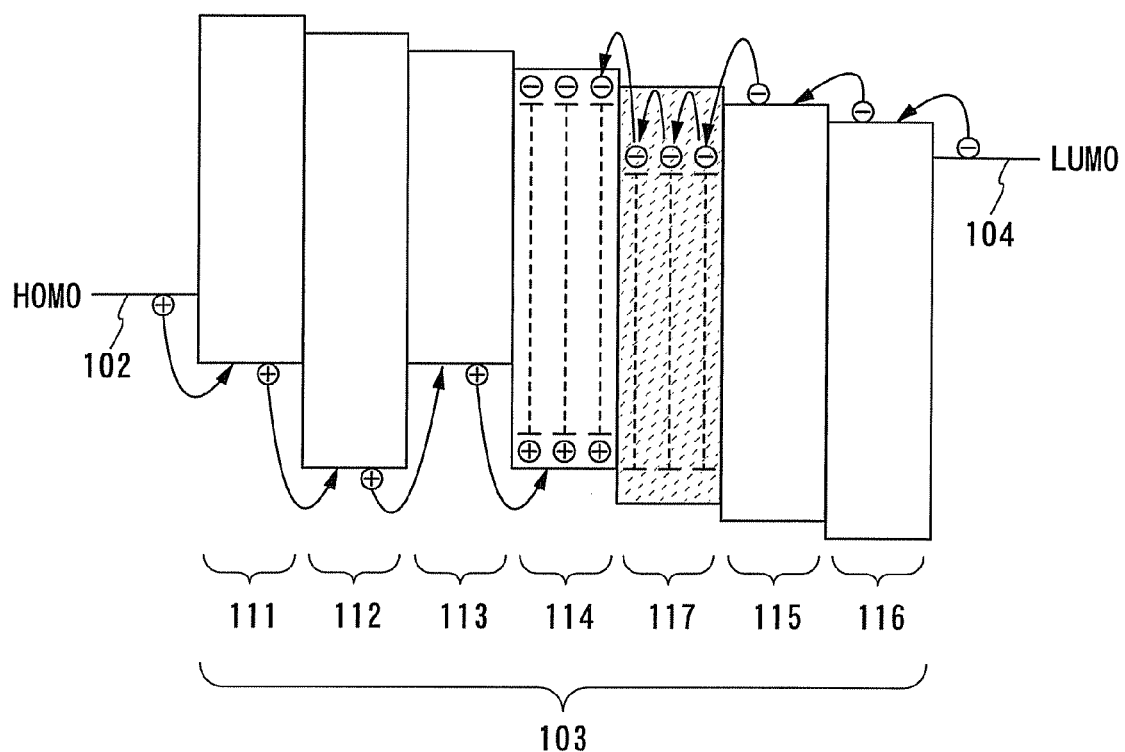
FIG. 7 illustrates a band structure of the light-emitting element in Embodiment Mode 2.

As the second method, the case of thermodynamically reducing the rate of transport of carriers (electrons) by the seventh layer (carrier control layer) 117 is described. FIG. 7 is a conceptual diagram thereof (a band diagram).

The EL layer 103 is included between the first electrode 102 and the second electrode 104. As a plurality of layers included in the EL layer 103, from the first electrode 102 side, the first layer (hole-injecting layer) 111, the second layer (hole-transporting layer) 112, the third layer (hole-transporting layer) 113, the fourth layer (light-emitting layer) 114, the seventh layer (carrier control layer) 117, the fifth layer (electron-transporting layer) 115, and the sixth layer (electron-injecting layer) 116 are formed in that order.

The seventh layer (carrier control layer) 117 is formed of two or more kinds of organic compounds. Here, the case where the seventh layer (carrier control layer) 117 is formed of two kinds of organic compounds, a first organic compound and a second organic compound is described. Note that an organic compound having a high electron-transporting property (an electron-transporting organic compound) is used as the first organic compound and an organic compound having a function of trapping electrons (an electron-trapping organic compound) is used as the second organic compound.

Further, the organic compounds used as the first organic compound and the second organic compound have LUMO levels that are greatly different from each other. Specifically, the absolute value of the lowest unoccupied molecular orbital level (LUMO level) of the second organic compound is preferably larger than the absolute value of the LUMO level of the first organic compound by 0.3 eV or more.

As shown in FIG. 7, a hole is injected from the first electrode 102 into the fourth layer (light-emitting layer) 114 through the first layer 111, the second layer 112, and the third layer 113. On the other hand, an electron is injected from the second electrode 104 into the seventh layer (carrier control layer) 117 through the sixth layer 116 and the fifth layer 115. Since the seventh layer 117 is formed of the first organic compound having an electron-transporting property and the second organic compound having an electron-trapping property, an electron injected into the seventh layer 117 enters the LUMO level of the second organic compound, not that of the first organic compound. Accordingly, the rate of transport of electrons can be reduced.

Thus, by forming the seventh layer 117 using the first organic compound having an electron-transporting property and the second organic compound having an electron-trapping property, the rate of transport of electrons in the seventh layer 117 can be reduced compared to the case where the seventh layer 117 is formed of only the first organic compound. That is, by forming the seventh layer 117 using the first organic compound and the second organic compound, rate of transport of carriers (electrons) in the seventh layer 117 can be reduced.

Note that in the case where the seventh layer 117 is formed of the first organic compound and the second organic compound, the concentration is controlled so that the content of the second organic compound is preferably less than 50% of the total in mass ratio. Further preferably, the concentration is controlled so that the content of the second organic compound is greater than or equal to 0.1 weight % and less than or equal to 5 weight % of the total.

Note that for the first organic compound contained in the seventh layer 117, specifically, a metal complex such as Alq, Almq$_3$, BeBq$_2$, BAlq, Znq, ZnPBO, or ZnBTZ; a heterocyclic compound such as PBD, OXD-7, TAZ, TPBI, BPhen, or BCP; or a condensed aromatic compound such as CzPA, DPCzPA, DPPA, DNA, t-BuDNA, BANT, DPNS, DPNS2, or TPB3 can be used.

Alternatively, a high molecular compound such as poly[(9,9-dihexylfluorene-2,7-diyl)-co-(pyridine-3,5-diyl)] (abbreviation: PF-Py) or poly[(9,9-dioctyllfluorene-2,7-diyl)-co-(2,2'-bipyridine-6,6'-diyl)] (abbreviation: PF-BPy) can be used. In particular, a metal complex is preferably stable with respect to electrons.

Further, for the second organic compound contained in the seventh layer 117, any of substances given below can be used. Note that although the second organic compound itself may emit light, in that case, the emission color of the fourth layer (light-emitting layer) 114 and the emission color of the second organic compound are preferably similar colors in order to keep the color purity of the light-emitting element.

For example, in the case where an organic compound contained in the fourth layer 114 is an organic compound that exhibits bluish light emission, such as YGA2S or YGAPA, the second organic compound is preferably a compound which exhibits emission in the range of blue to blue green light, such as acridone, coumarin 102, coumarin 6H, coumarin 480D, or coumarin 30.

Further, when the organic compound contained in the fourth layer (light-emitting layer) 114 is an organic compound that exhibits greenish light emission, such as 2PCAPA, 2PCABPhA, 2DPAPA, 2DPABPhA, 2YGABPhA, or DPhAPhA, the second organic compound is preferably a compound that exhibits light emission in the range of bluish green to yellowish green, such as N,N-dimethyluinacridone (abbreviation: DMQd), N,N-diphenylquinacridone (abbreviation: DPQd), 9,18-dihydrobenzo[h]benzo[7,8]quino[2,3-b]acridine-7,16-dione (abbreviation: DMNQd-1), 9,18-dihydro-9,18-dimethylbenzo[h]benzo[7,8]quino[2,3-b]acridine-7,16-dione (abbreviation: DMNQd-2), coumarin 30, coumarin 6, coumarin 545T, or coumarin 153.

Alternatively, when the organic compound contained in the fourth layer (light-emitting layer) 114 is an organic compound which exhibits yellowish light emission, such as rubrene or BPT, the second organic compound is preferably a substance which exhibits light emission in the range of yellowish green to golden yellow, such as DMQd or (2-{2-[4-(9H-carbazol-9-yl)phenyl]ethenyl}-6-methyl-4H-pyran-4-ylidene)propanedinitrile (abbreviation: DCMCz).

Alternatively, when the organic compound contained in the fourth layer (light-emitting layer) 114 is an organic compound which exhibits reddish light emission, such as p-mPhTD or p-mPhAFD, the second organic compound is preferably a substance which exhibits light emission in the range of orange to red, such as 2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ ]quinolizin-9-yl)ethenyl]-4H-pyran-4-ylidene}propanedinitrile (abbreviation: DCM2), {2-(1,1-dimethylethyl)-6-[2-(2,3,6,7-tetramethyl-1,1,7,7-tetramethyl-1H,5H-benzo[i]quinolizin-9-yl)ethenyl]-4H-pyran-4-ylidene}propanedinitrile (abbreviation: DCJTB), or Nile red.

Further, when the light-emitting material contained in the fourth layer (light-emitting layer) 114 is a phosphorescent compound, the second organic compound is preferably also a phosphorescent compound. For example, when the light-emitting material is Ir(btp)$_2$(acac) given above, which exhibits red light emission, the second organic compound may be a red phosphorescent compound such as (acetylacetonato)bis[2,3-bis(4-fluorophenyl)quinoxalinato]iridium(II) (abbreviation: Ir(Fdpq)$_2$(acac)). Note that these compounds are compounds having low LUMO levels among compounds that are used for light-emitting elements. Thus, by adding such a compound to the above first organic compound, an excellent electron-trapping property can be exhibited.

For the second organic compound, among the compounds given above, a quinacridone derivative such as DMQd, DPQd, DMNQd-1, or DMNQd-2 is chemically stable and thus preferably used. That is, by applying a quinacridone derivative, the life of the light-emitting element can be particularly extended. Further, since a quinacridone derivative exhibits greenish light emission, the element structure of the light-emitting element of the present invention is particularly effective for a greenish light-emitting element. Since green is a color that needs the highest luminance in manufacturing a full-color display, a greenish light-emitting element deteriorates faster than light-emitting elements of other colors in some cases. However, such a problem can be suppressed by applying the invention.

Note that as described above, the absolute value of the LUMO level of the second organic compound is preferably larger than the absolute value of the LUMO level of the first organic compound by 0.3 eV or more. Therefore, the first organic compound may be selected as appropriate so as to satisfy the above-described condition depending on the kind of the substance used for the second organic compound.

Furthermore, the emission color of the substance having a high light-emitting property contained in the fourth layer 114 and the emission color of the second organic compound contained in the seventh layer 117 are preferably similar colors. Thus, a difference between the peak value of the emission spectrum of the substance having a high light-emitting property and the peak value of the emission spectrum of the second organic compound is preferably within 30 nm. The difference within 30 nm allows the emission color of the substance having a high light-emitting property and the emission color of the second organic compound to be similar colors. Therefore, if the second organic compound emits light due to a change in voltage or the like, a change in emission color can be suppressed.

Note that the second organic compound does not necessarily emit light. For example, in the case where the substance having a high light-emitting property has higher emission efficiency, it is preferable to control the concentration of the second organic compound in the seventh layer 117 so that only light emission of the substance having a high light-emitting property can be obtained (to set the concentration of the second organic compound to be slightly lower than that of the substance having a high light-emitting property so that light emission of the second organic compound can be suppressed). In this case, the emission color of the substance having a high light-emitting property and the emission color of the second organic compound are similar colors (i.e., they have substantially the same levels of energy gaps). Therefore, energy is not easily transferred from the substance having a high light-emitting property to the second organic compound, and thus high emission efficiency can be achieved.

Note that in such a case, the second organic compound is preferably a coumarin derivative such as coumarin 102, coumarin 6H, coumarin 480D, coumarin 30, coumarin 6, coumarin 545T, or coumarin 153. Because a coumarin derivative has a relatively low electron-trapping property, the concentration of the coumarin derivative added to the first organic compound may be relatively high. That is, the concentration can be easily controlled, and a layer having desired properties for controlling transport of carriers can be formed. Further, since a coumarin derivative has high emission efficiency, a decrease in efficiency of the whole light-emitting element can be suppressed even if the second organic compound emits light.

Note that the seventh layer 117 in the present invention can be formed by the above-described two kinds of methods (a method for kinetically controlling transport of carriers and a method for thermodynamically controlling transport of carriers), and the thickness of the seventh layer 117 is preferably greater than or equal to 5 nm and less than or equal to 20 nm in either structure. This is because if the thickness is larger, an excessive decrease in rate of transport of electrons leads to an increase in driving voltage, whereas if the thickness is smaller, a function of controlling carrier transport could be impaired.

Further, since the seventh layer 117 in the present invention is a layer for controlling the rate of transport of electrons, the seventh layer 117 may be formed between the second electrode 104 and the fourth layer (light-emitting layer) 114. More preferably, the seventh layer 117 is formed in contact with the fourth layer (light-emitting layer) 114. By the provision so as to be in contact with the fourth layer (light-emitting layer) 114, injection of electrons into the fourth layer (light-emitting layer) 114 can be directly controlled; thus, a change in carrier balance in the fourth layer (light-emitting layer) 114 over time can be further suppressed, and a large effect can be obtained in terms of improvement in element life.

Note that in the case where the seventh layer 117 is formed in contact with the fourth layer (light-emitting layer) 114, the first organic compound contained in the seventh layer 117 and the organic compound which is contained in the fourth layer (light-emitting layer) 114 in large amounts are preferably different organic compounds. In particular, in the case where the fourth layer (light-emitting layer) 114 contains a compound (a third organic compound) in which a substance having a high light-emitting property is dispersed and the substance having a high light-emitting property (a fourth organic compound), the third organic compound and the first organic compound are preferably different organic compounds. With such a structure, the transport of carriers (electrons) from the seventh layer 117 to the fourth layer (light-emitting layer) 114 is suppressed also between the first organic compound and the third organic compound, and the effect obtained by the provision of the seventh layer 117 can be further enhanced.

Further, since the seventh layer 117 contains two or more kinds of substances, the carrier balance can be precisely controlled by controlling a combination of substances, the mixture ratio thereof, the thickness of the layer, or the like. Thus, the carrier balance can be controlled more easily than in the conventional manner. Furthermore, since transport of carriers is controlled using the organic compound, the mixture ratio of which is smaller in the seventh layer 117, the carrier balance does not easily change compared to the case of control using one substance. Accordingly, a light-emitting element which does not easily change over time and has a long life can be realized.

In the EL layer 103, although the fifth layer (electron-transporting layer) 115 and the sixth layer (electron-injecting layer) 116 are stacked in that order over the above-described seventh layer (carrier control layer) 117, the structure thereof, a formation method, and a material that can be used for each layer are similar to those of Embodiment Mode 1. Therefore, description thereof is omitted in Embodiment Mode 2.

Next, the second electrode 104 is formed over the sixth layer (electron-injecting layer) 116. Note that a formation method and a material that can be used for the second electrode 104 are also similar to those of Embodiment Mode 1. Therefore, the description thereof is omitted in Embodiment Mode 2.

Also in Embodiment Mode 2, when only the first electrode 102 is an electrode having a light-transmitting property, light emitted from the EL layer 103 is extracted from the substrate 101 side through the first electrode 102, as shown in FIG. 3A. Alternatively, when only the second electrode 104 is an electrode having a light-transmitting property, light emitted from the EL layer 103 is extracted from the opposite side to the substrate 101 side through the second electrode 104, as shown in FIG. 3B. Further alternatively, when the first electrode 102 and the second electrode 104 are both electrodes having a light-transmitting property, light emitted from the EL layer 103 is extracted to both the substrate 101 side and the opposite side, through the first electrode 102 and the second electrode 104, as shown in FIG. 3C.

Note that the structure of the layers provided between the first electrode 102 and the second electrode 104 is not limited to the above structure. Note that any structure other than the above structure may be used as long as it includes at least the first layer 111 which is the hole-injecting layer, the second layer 112 which is the first hole-transporting layer, the third layer 113 which is the second hole-transporting layer, the fourth layer 114 which is the light-emitting layer, and the seventh layer 117 which is the carrier control layer, and substances are selected so that the highest occupied molecular orbital level (HOMO level) of the substance used for the second layer 112 is deeper (the absolute value is larger) or shallower (the absolute value is smaller) than the HOMO levels of the substances used for the first layer 111 and the third layer 113.

Alternatively, as shown in FIG. 5B, a structure in which the second cathode 104 functioning as a cathode, the EL layer 103, and the first electrode 102 functioning as an anode are stacked in that order over the substrate 101 may be employed. Note that the EL layer 103 in this case has a structure in which the sixth layer 116, the fifth layer 115, the seventh layer 117, the fourth layer 114, the third layer 113, the second layer 112, and the first layer 111 are stacked in that order over the second electrode 104.

Note that by use of the light-emitting element of the present invention, a passive matrix light-emitting device or an active matrix light-emitting device in which drive of the light-emitting element is controlled by a thin film transistor (TFT) can be manufactured.

Note that there is no particular limitation on the structure of the TFT in the case of manufacturing an active matrix light-emitting device. For example, a staggered TFT or an inverted staggered TFT can be used as appropriate. Further, a driver circuit formed over a TFT substrate may be formed of both of an n-type TFT and a p-type TFT or only either an n-type TFT or a p-type TFT. Furthermore, there is no particular limitation on the crystallinity of a semiconductor film used for the TFT. An amorphous semiconductor film may be used, or a crystalline semiconductor film may be used.

In the light-emitting element described in Embodiment Mode 2, the band gap is formed by the first layer 111, the second layer 112, and the third layer 113 which are provided between the first electrode 102 and the fourth layer 114 which is the light-emitting layer, and therefore the rate of transport of holes injected from the first electrode 102 can be suppressed. Accordingly, since generation of cations in the vicinity of the fourth layer (light-emitting layer) 114 can be suppressed, a decrease in emission efficiency can be suppressed. Thus, the carrier balance can be improved, and an element having high efficiency can be formed.

On the other hand, the seventh layer 117 is provided between the second electrode 104 and the fourth layer (light-emitting layer) 114 to reduce the rate of transport of carriers (electrons); accordingly, an emission region, which has been so far formed near the interface between the fourth layer (light-emitting layer) 114 and the third layer (hole-transporting layer) 113 because of the fast transport rate, can be formed more centrally in the fourth layer (light-emitting layer) 114 than in the conventional manner.

Further, the seventh layer 117 is provided to reduce the rate of transport of carriers (electrons); accordingly, it is possible to prevent deterioration of the third layer (hole-transporting layer) 113, which is caused by carriers (electrons) which reach, from the fourth layer (light-emitting layer) 114, the third layer (hole-transporting layer) 113 without contributing to light emission. Furthermore, by reducing the rate of transport of carriers (electrons), it is possible not only to control the amount of carriers (electrons) injected into the fourth layer (light-emitting layer) 114 but also to inhibit the controlled amount of carriers (electrons) from changing over time. Thus, since a decrease in the probability of recombination by deterioration of the balance over time can be prevented, improvement in element life (suppression of deterioration of luminance over time) can also be achieved.

In the case of the structure described in this embodiment mode, since the rate of transport of holes and electrons which are injected into the fourth layer 114 is controlled so as to be reduced, the carrier balance in the fourth layer 114 improves and the probability of the recombination increases; therefore, the emission efficiency can be improved.

Note that Embodiment Mode 2 can be combined with any of the structures described in Embodiment Mode 1, as appropriate.

Embodiment Mode 3

Figure 8:
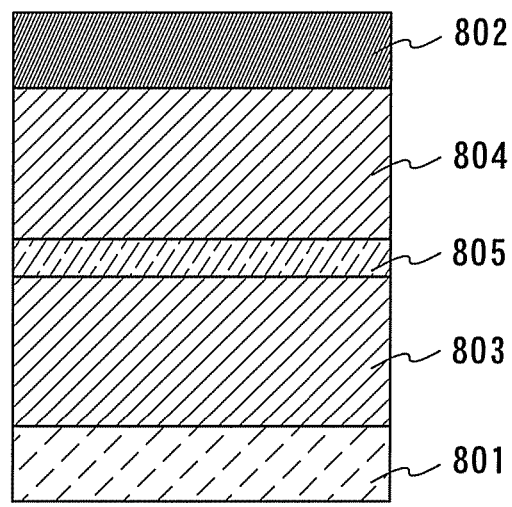
FIG. 8 illustrates a stacked structure of a light-emitting element in Embodiment Mode 3.

In Embodiment Mode 3, a light-emitting element having a plurality of EL layers of the light-emitting elements described in Embodiment Mode 1 and 2 (hereinafter, referred to as a stacked-type element) is described using FIG. 8. This light-emitting element is a stacked-type light-emitting element that has a plurality of EL layers (a first EL layer 803 and a second EL layer 804) between a first electrode 801 and a second electrode 802. Note that although a structure of two EL layers is described in Embodiment Mode 3, a structure of three or more EL layers may be employed.

In Embodiment Mode 3, the first electrode 801 functions as an anode and the second electrode 802 functions as a cathode. Note that the first electrode 801 and the second electrode 802 can be made to have structures similar to those described in Embodiment Mode 1. Further, for the plurality of EL layers (the first EL layer 803 and the second EL layer 804), structures similar to those described in Embodiment Mode 1 and 2 can be used. Note that structures of the first EL layer 803 and the second EL layer 804 may be the same or different from each other and can be similar to those described in Embodiment Mode 1 or 2.

Further, a charge generation layer 805 is provided between the plurality of EL layers (the first EL layer 803 and the second EL layer 804). The charge generation layer 805 has a function of injecting electrons into one of the EL layers and injecting holes into the other of the EL layers when voltage is applied to the first electrode 801 and the second electrode 802. In Embodiment Mode 3, when voltage is applied so that the potential of the first electrode 801 is higher than that of the second electrode 802, the charge generation layer 805 injects electrons into the first EL layer 803 and injects holes into the second EL layer 804.

Note that the charge generation layer 805 preferably has a light-transmitting property in terms of light extraction efficiency. Further, the charge generation layer 805 functions even when it has lower conductivity than the first electrode 801 and the second electrode 802.

The charge generation layer 805 may have either a structure in which an acceptor substance is added to a substance having a high hole-transporting property or a structure in which a donor substance is added to a substance having a high electron-transporting property. Alternatively, both of these structures may be stacked.

In the case of the structure in which an acceptor substance is added to a substance having a high hole-transporting property, as the substance having a high hole-transporting property, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]-1,1'-biphenyl (abbreviation: BSPB) or the like can be used. The substances given here mainly are substances having a hole mobility of $10^{-6}$ cm$^2$/(V·s) or more. However, any substance other than the above substances may be used as long as it is a substance in which the hole-transporting property is higher than the electron-transporting property.

Further, as examples of the substance having an acceptor property, 7,7,8,8-tetracyano-2,3,5,6-tetrafluoroquinodimethane (abbreviation: F$_4$-TCNQ), chloranil, and the like can be given. In addition, a transition metal oxide can be given. In addition, oxides of metals that belong to Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable since their electron-accepting properties are high. Above all, molybdenum oxide is particularly preferable because it is stable even in the atmosphere, has a low hygroscopic property, and is easy to handle.

On the other hand, in the case of the structure in which a donor substance is added to a substance having a high electron-transporting property, as the substance having a high electron-transporting property, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-benzoxazolyl)phenolato]zinc(II) (abbreviation: Zn(BOX)$_2$), or bis [2-(2-benzothiazolyl)phenolato]zinc(II) (abbreviation: Zn(BTZ)$_2$), or the like can be used. Further alternatively, instead of the metal complex, 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials given here are mainly materials having an electron mobility of $10^{-6}$ cm$^2$/(V·s) or more. However, any substance other than the above substances may be used as long as it is a substance in which the electron-transporting property is higher than the hole-transporting property.

Further, for the donor material, an alkali metal, an alkaline earth metal, a rare earth metal, a metal that belongs to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used for the donor material.

Note that by forming the charge generation layer 805 using any of the above materials, an increase in driving voltage in the case where the EL layers are stacked can be suppressed.

Although the light-emitting element having two EL layers is described in Embodiment Mode 3, the present invention can be similarly applied to a light-emitting element in which three or more EL layers are stacked. By arranging a plurality of EL layers to be partitioned from each other with a charge generation layer between a pair of electrodes, like the light-emitting element according to Embodiment Mode 3, emission from a region of high luminance can be realized at a low current density, and thus an element with a long life can be achieved. Further, when a lighting apparatus is an application example, a drop in voltage due to the resistance of an electrode material can be suppressed, and thus uniform emission in a large area can be achieved. Further, a light-emitting device which can be driven at low voltage and has low power consumption can be realized.

Further, when the EL layers have different emission colors, a desired emission color can be obtained from the whole light-emitting element. For example, in the light-emitting element having two EL layers, when an emission color of the first EL layer and an emission color of the second EL layer are made to be complementary colors, it is possible to obtain a light-emitting element from which white light is emitted from the whole light-emitting element. Note that the complementary colors refer to colors that can produce an achromatic color when they are mixed. That is, white light emission can be obtained by mixture of light from substances whose emission colors are complementary colors.

Also in a light-emitting element having three EL layers, for example, white light can be similarly obtained from the whole light-emitting element when an emission color of a first EL layer is red, an emission color of a second EL layer is green, and an emission color of a third EL layer is blue.

Note that Embodiment Mode 3 can be combined with any of the structures described in Embodiment Modes 1 and 2, as appropriate.

Embodiment Mode 4

In Embodiment Mode 4, a light-emitting device having a light-emitting element of the present invention in a pixel portion is described using FIGS. 9A and 9B. Note that FIG. 9A is a top view showing the light-emitting device and FIG. 9B is a cross-sectional view taken along lines A-A' and B-B' of FIG. 9A.

In FIG. 9A, a portion 901, indicated by a dotted line, is a driver circuit portion (a source side driver circuit); a portion 902, indicated by a dotted line, is a pixel portion; and a portion 903, indicated by a dotted line, is a driver circuit portion (a gate side driver circuit). Further, a portion 904 is a sealing substrate; a portion 905 is a sealant; and a portion enclosed by the sealant 905 is a space 907.

Note that a leading wiring 908 is a wiring for transmitting signals to be input to the source side driver circuit 901 and the gate side driver circuit 903 and receives signals such as a video signal, a clock signal, a start signal, and a reset signal from a flexible printed circuit (FPC) 909 that is to be an external input terminal. Note that only the FPC is shown here; however, the FPC may be provided with a printed wiring board (PWB). Further, the light-emitting device in this specification includes not only a light-emitting device itself but also a light-emitting device attached with an FPC or a PWB.

Next, a cross-sectional structure is described using FIG. 9B. Although the driver circuit portion and the pixel portion are formed over an element substrate 910, one pixel in the pixel portion 902 and the source side driver circuit 901 which is the driver circuit portion are shown here. Note that a CMOS circuit that is a combination of an n-channel TFT 923 and a p-channel TFT 924 is formed as the source side driver circuit 901. Further, each driver circuit portion may be any of a variety of circuits such as a CMOS circuit, a PMOS circuit, and an NMOS circuit. In this embodiment mode, although a driver-integrated type structure in which a driver circuit is formed over a substrate is described, a driver circuit is not necessarily formed over a substrate but can be formed externally from a substrate.

Further, the pixel portion 902 is formed of a plurality of pixels each including a switching TFT 911, a current control TFT 912, and a first electrode 913 which is electrically connected to a drain of the current control TFT 912. Note that an insulator 914 is formed to cover an end portion of the first electrode 913.

Further, the insulator 914 is desirably formed so as to have a curved surface with curvature at an upper end portion or a lower end portion thereof in order to make the coverage be favorable. For example, by using positive type photosensitive acrylic as a material of the insulator 914, the insulator 914 can be formed to have a curved surface with a curvature radius (greater than or equal to 0.2 µm and less than or equal to 3 m) only at the upper end portion. Further, either a negative type material becomes insoluble in an etchant by light irradiation or a positive type material which becomes soluble in an etchant by light irradiation can be used as the insulator 914.

An EL layer 916 and a second electrode 917 are formed over the first electrode 913. Here, as a material used for the first electrode 913, any of a variety of metals, alloys, and electroconductive compounds, or a mixture thereof can be used. When the first electrode 913 is used as an anode, it is preferable to use, among these materials, any of metals, alloys, and electroconductive compounds, a mixture thereof, or the like having a high work function (a work function of 4.0 eV or more). For example, it is possible to use a single layer film of an indium tin oxide film containing silicon, an indium zinc oxide film, a titanium nitride film, a chromium film, a tungsten film, a Zn film, a Pt film, or the like; a stacked film of a three-layer structure of a titanium nitride film and a film containing aluminum as its main component; a three-layer structure of a titanium nitride film, a film containing aluminum as its main component, and a titanium nitride film; or the like. Note that when a stacked structure is employed, resistance as a wiring is low, a good ohmic contact is formed, and further the first electrode 913 can be made to function as an anode.

Further, the EL layer 916 is formed by any of a variety of methods such as an evaporation method using an evaporation mask, an inkjet method, and a spin coating method. The EL layer 916 has the structure described in Embodiment Mode 1 or 2. Further, as a material used for the EL layer 916, a low molecular compound or a high molecular compound (including an oligomer and a dendrimer) may be used. Further, as the material used for the EL layer, not only an organic compound but also an inorganic compound may be used.

Further, as a material used for the second electrode 917, any of a variety of metals, alloys, and electroconductive compounds, or a mixture thereof can be used. When the second electrode 917 is used as a cathode, it is preferable to use, among these materials, any of metals, alloys, and electroconductive compounds, a mixture thereof, or the like having a low work function (a work function of 3.8 eV or less). For example, elements belonging to Group 1 and 2 of the periodic table, that is, alkali metals such a lithium (Li) and cesium (Cs) and alkaline earth metals such as magnesium (Mg), calcium (Ca), and strontium (Sr); alloys thereof (MgAg or AlLi); and the like are given.

Note that in the case where light generated in the EL layer 916 is transmitted through the second electrode 917, for the second electrode 917, a stack of a metal thin film with a reduced thickness and a transparent conductive film (indium tin oxide (ITO), indium tin oxide containing silicon or silicon oxide, indium zinc oxide (IZO), or indium oxide containing tungsten oxide and zinc oxide (IWZO)) can also be used.

Furthermore, a structure is provided in which the sealing substrate 904 is attached using the sealant 905 to the element substrate 910 so that the light-emitting element 918 is provided in the space 907 surrounded by the element substrate 910, the sealing substrate 904, and the sealant 905. Note that the space 907 is filled with a filler. There are cases where the space 907 is filled with an inert gas (nitrogen, argon, or the like), and where the space 907 may be filled with the sealant 905.

Note that an epoxy-based resin is preferably used for the sealant 905. Further, it is preferable that these materials hardly transmit water or oxygen. Further, as the sealing substrate 904, instead of a glass substrate or a quartz substrate, a plastic substrate formed of fiberglass-reinforced plastic (FRP), polyvinyl fluoride (PVF), polyester, acrylic, or the like can be used.

As described above, an active matrix light-emitting device having the light-emitting element of the present invention can be obtained.

Figure 10A:
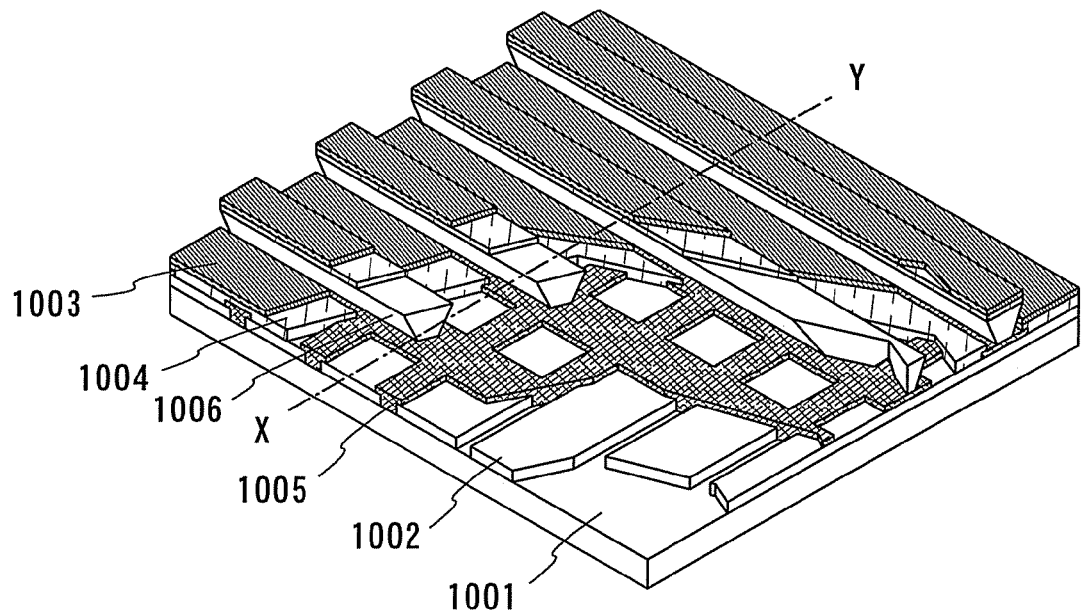
FIGS. 10A and 10B illustrate a passive matrix light-emitting device in Embodiment Mode 4.
Figure 10B:
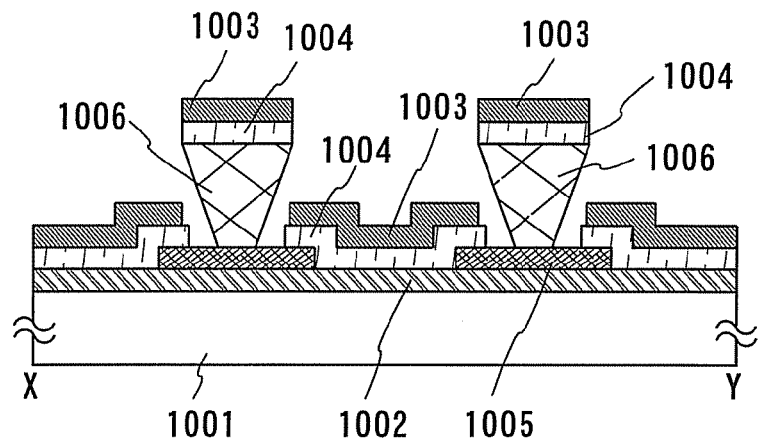

Further, the light-emitting element of the present invention can be used for a passive matrix light-emitting device instead of the above active matrix light-emitting device. FIGS. 10A and 10B are a perspective view and a cross-sectional view of a passive matrix light-emitting device using the light-emitting element of the present invention. Note that FIG. 10A is a perspective view of the light-emitting device and FIG. 10B is a cross-sectional view taken along a line X-Y of FIG. 10A.

In FIGS. 10A and 10B, an EL layer 1004 is provided between a first electrode 1002 and a second electrode 1003 over a substrate 1001. An end portion of the first electrode 1002 is covered by an insulating layer 1005. In addition, a partition layer 1006 is provided over the insulating layer 1005. Sidewalls of the partition layer 1006 have a slant such that a distance between one sidewall and the other sidewall becomes narrower as the sidewalls gets closer to a surface of the substrate. In other words, a cross section taken in the direction of a shorter side of the partition layer 1006 has a trapezoidal shape, and the base of the trapezoid (a side of the trapezoid which is parallel to the surface of the insulating layer 1005 and is in contact with the insulating layer 1005) is shorter than the upper side of the trapezoid (a side of the trapezoid which is parallel to the surface of the insulating layer 1005 and is not in contact with the insulating layer 1005). The provision of the partition layer 1006 in this manner can prevent the light-emitting element from being defective due to static electricity or the like.

Accordingly, the passive matrix light-emitting device using the light-emitting element of the present invention can be obtained.

Note that any of the light-emitting devices described in this embodiment mode (the active matrix light-emitting device and the passive matrix light-emitting device) are formed using the light-emitting element of the present invention, which has high emission efficiency, and accordingly a light-emitting device having reduced power consumption can be obtained.

Note that Embodiment Mode 4 can be combined with any of the structures described in Embodiment Modes 1 to 3, as appropriate.

Embodiment Mode 5

In Embodiment Mode 5, an electronic appliance including, as a part thereof, the light-emitting device of the present invention, which is described in Embodiment Mode 4, is described. Examples of the electronic appliance include cameras such as video cameras or digital cameras, goggle type displays, navigation systems, audio playback devices (e.g., car audio systems and audio systems), computers, game machines, portable information terminals (e.g., mobile computers, cellular phones, portable game machines, and electronic books), image playback devices in which a recording medium is provided (specifically, devices that are capable of playing back recording media such as digital versatile discs (DVDs) and equipped with a display unit that can display images), and the like. Specific examples of these electronic appliances are shown in FIGS. 11A to 11D.

Figure 11A:
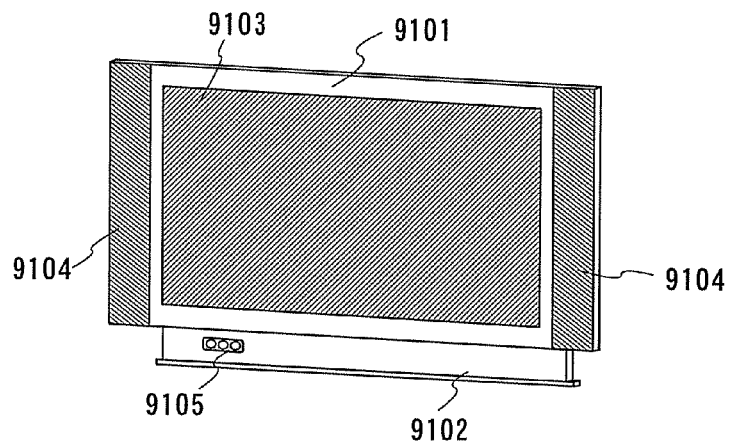
FIGS. 11A to 11D each illustrate an electronic appliance in Embodiment Mode 5.

FIG. 11A shows a television set according to the present invention, which includes a housing 9101, a support base 9102, a display portion 9103, a speaker portion 9104, a video input terminal 9105, and the like. In this television set, the light-emitting device of the present invention can be applied to the display portion 9103. Since the light-emitting device of the present invention has a feature of high emission efficiency, a television set having reduced power consumption can be obtained by applying the light-emitting device of the present invention.

Figure 11B:
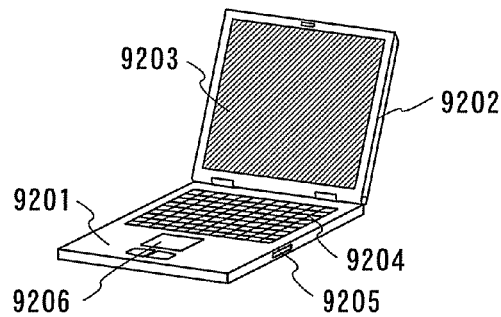

FIG. 11B shows a computer according to the present invention, which includes a main body 9201, a housing 9202, a display portion 9203, a keyboard 9204, an external connection port 9205, a pointing device 9206, and the like. In this computer, the light-emitting device of the present invention can be applied to the display portion 9203. Since the light-emitting device of the present invention has a feature of high emission efficiency, a computer having reduced power consumption can be obtained by applying the light-emitting device of the present invention.

Figure 11C:
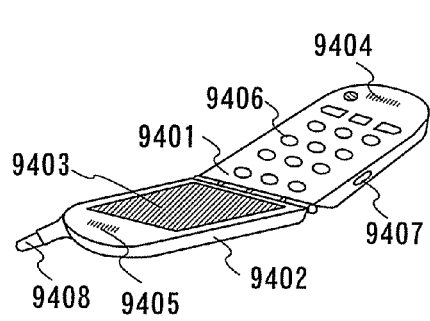

FIG. 11C shows a cellular phone according to the present invention, which includes a main body 9401, a housing 9402, a display portion 9403, an audio input portion 9404, an audio output portion 9405, operation keys 9406, an external connection port 9407, an antenna 9408, and the like. In this cellular phone, the light-emitting device of the present invention can be applied to the display portion 9403. Since the light-emitting device of the present invention has a feature of high emission efficiency, a cellular phone having reduced power consumption can be obtained by applying the light-emitting device of the present invention.

Figure 11D:
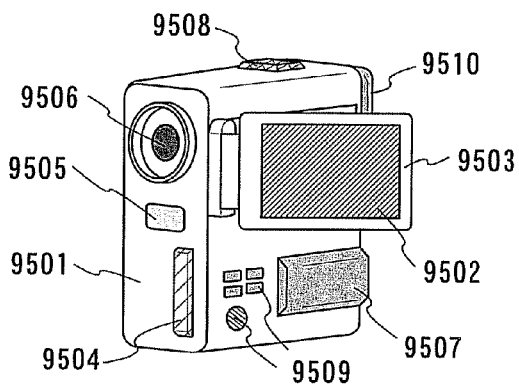

FIG. 11D shows a camera according to the present invention, which includes a main body 9501, a display portion 9502, a housing 9503, an external connection port 9504, a remote control receiver 9505, an image receiver 9506, a battery 9507, an audio input portion 9508, operation keys 9509, an eye piece portion 9510, and the like. In this camera, the light-emitting device of the present invention can be applied to the display portion 9502. Since the light-emitting device of the present invention has a feature of high emission efficiency, a camera having reduced power consumption can be obtained by applying the light-emitting device of the present invention.

As described above, the applicable range of the light-emitting device of the present invention is wide so that this light-emitting device can be applied to electronic appliances of a variety of fields. By applying the light-emitting device of the present invention, an electronic appliance having reduced power consumption can be obtained.

Figure 12:
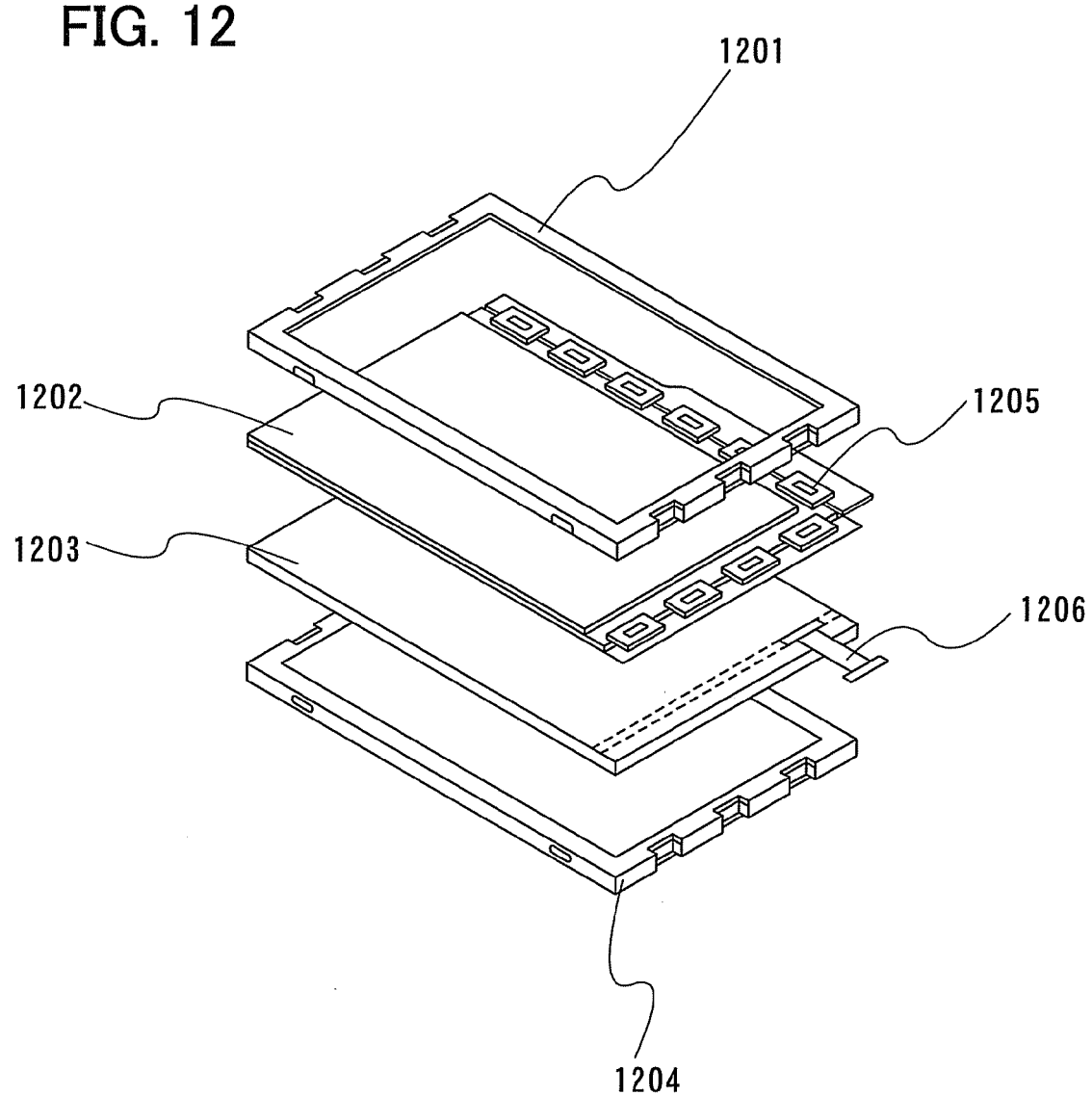
FIG. 12 illustrates a liquid crystal display device using a light-emitting device according to an aspect of the present invention as a backlight.

Further, the light-emitting device of the present invention can also be used as a lighting apparatus. FIG. 12 shows an example of a liquid crystal display device using the light-emitting device of the present invention as a backlight. The liquid crystal display device shown in FIG. 12 includes a housing 1201, a liquid crystal layer 1202, a backlight 1203, and a housing 1204. The liquid crystal layer 1202 is connected to a driver IC 1205. Further, the light-emitting device of the present invention is used as the backlight 1203 to which current is supplied through a terminal 1206.

By use of the light-emitting device of the present invention as a backlight of a liquid crystal display device as described above, a backlight having low power consumption can be obtained. Further, since the light-emitting device of the present invention is a surface emitting lighting apparatus and can be formed to have a large area, a larger-area backlight can also be obtained. Accordingly, a larger-area liquid crystal display device having low power consumption can be obtained.

Figure 13:
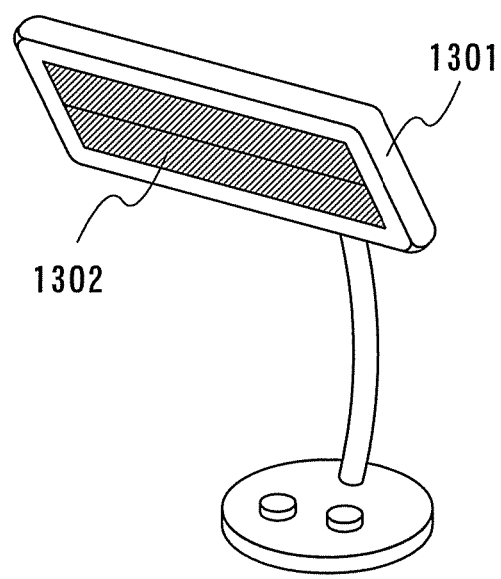
FIG. 13 illustrates a table lamp using a light-emitting device according to an aspect of the present invention.

FIG. 13 shows an example in which the light-emitting device to which the present invention is applied is used as a desk lamp that is a lighting apparatus. The desk lamp shown in FIG. 13 includes a housing 1301 and a light source 1302, and the light-emitting device of the present invention is used as the light source 1302. The light-emitting device of the present invention has the light-emitting element having high emission efficiency and therefore can be used as a desk lamp having low power consumption.

Figure 14:
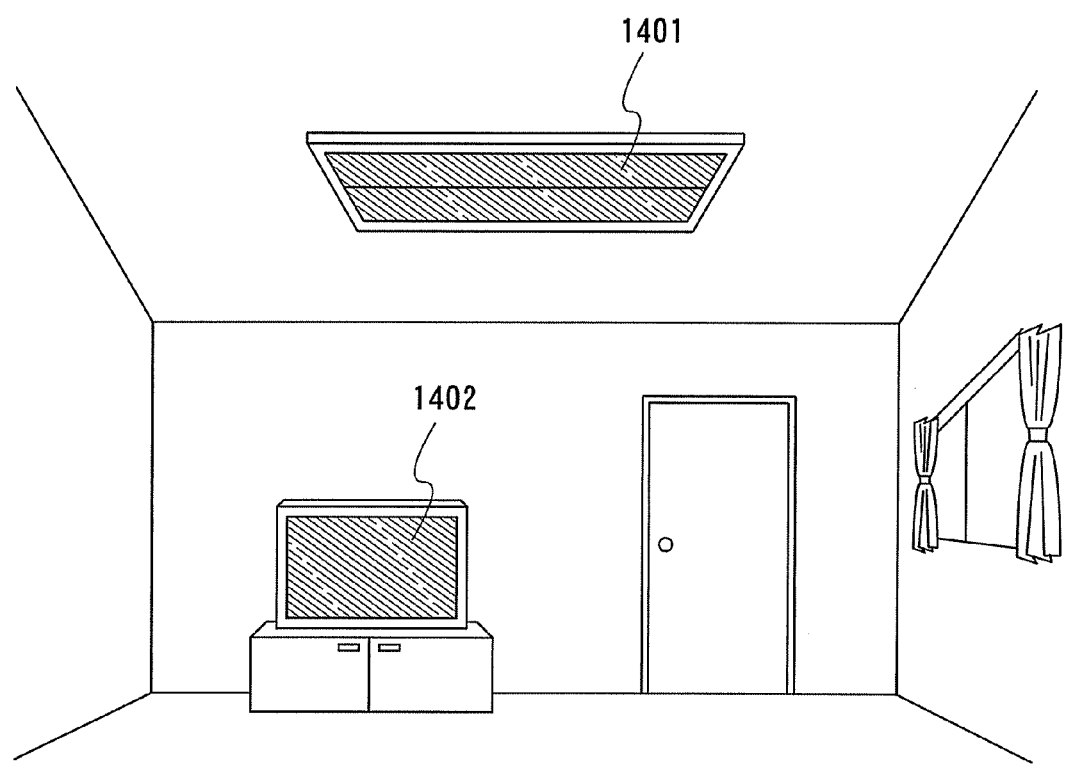
FIG. 14 illustrates an indoor lighting apparatus using a light-emitting device according to an aspect of the present invention.

FIG. 14 shows an example in which the light-emitting device to which the present invention is applied is used as an indoor lighting apparatus 3001. The light-emitting device of the present invention can be formed to have a large area and therefore can be used as a large-area lighting device. Further, the light-emitting device of the invention has the light-emitting element having high emission efficiency and therefore can be used as a lighting apparatus having low power consumption. Thus, in a room where a light-emitting device to which the present invention is applied is used as the indoor lighting device 1401, a television set 1402 according to the present invention, as described using FIG. 11A, is placed; then, public broadcasting and movies can be watched.

Note that Embodiment Mode 5 can be combined with any of the structures described in Embodiment Modes 1 to 5, as appropriate.

Example 1

Figure 15A:
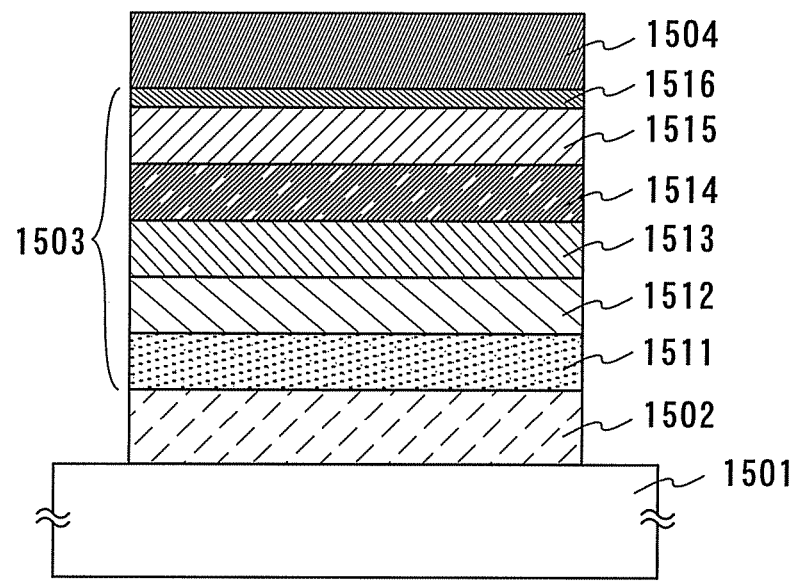
FIGS. 15A and 15B each illustrate an element structure of a light-emitting element in Example 1.
Figure 15B:
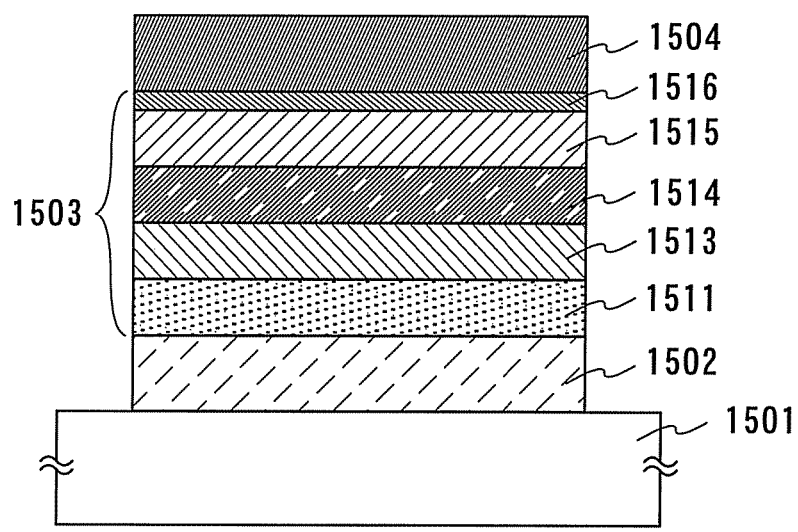

In Example 1, fabrication methods of light-emitting elements having the structure described in Embodiment Mode 1, which are light-emitting elements of the present invention, and measurement results of the element characteristics thereof are described. Note that the element structure of the light-emitting elements described in this example (light-emitting elements 1 to 3) are shown in FIG. 15A and the element structure of a light-emitting element to be compared to these light-emitting elements is shown in FIG. 15B. Further, structural formulae of organic compounds used in Example 1 are shown below.

31
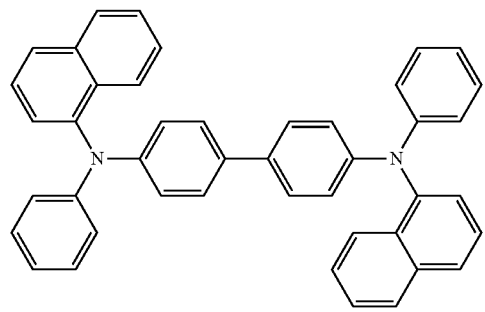
NPB
32
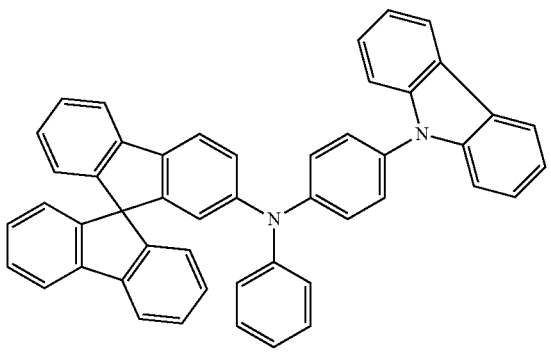
YGASF
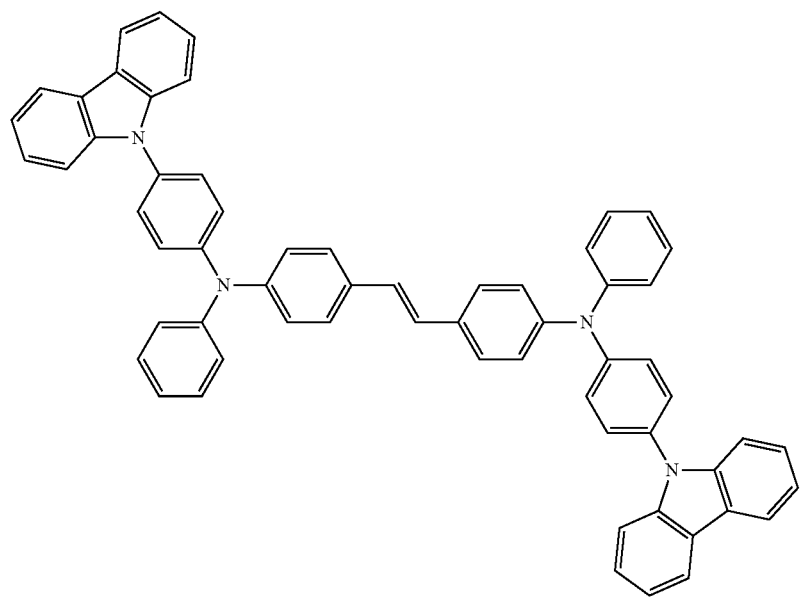
YGA2S
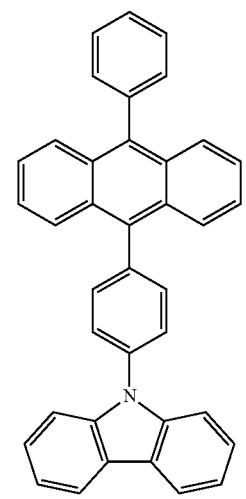
CzPA
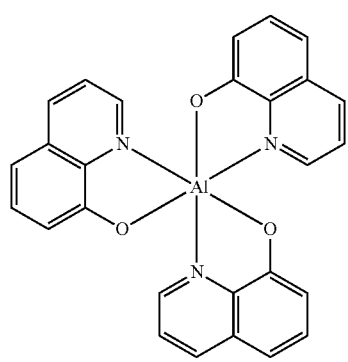
Alq
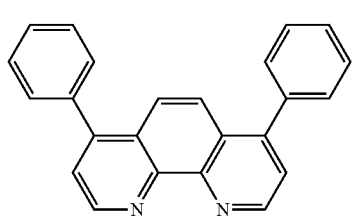
BPhen -continued

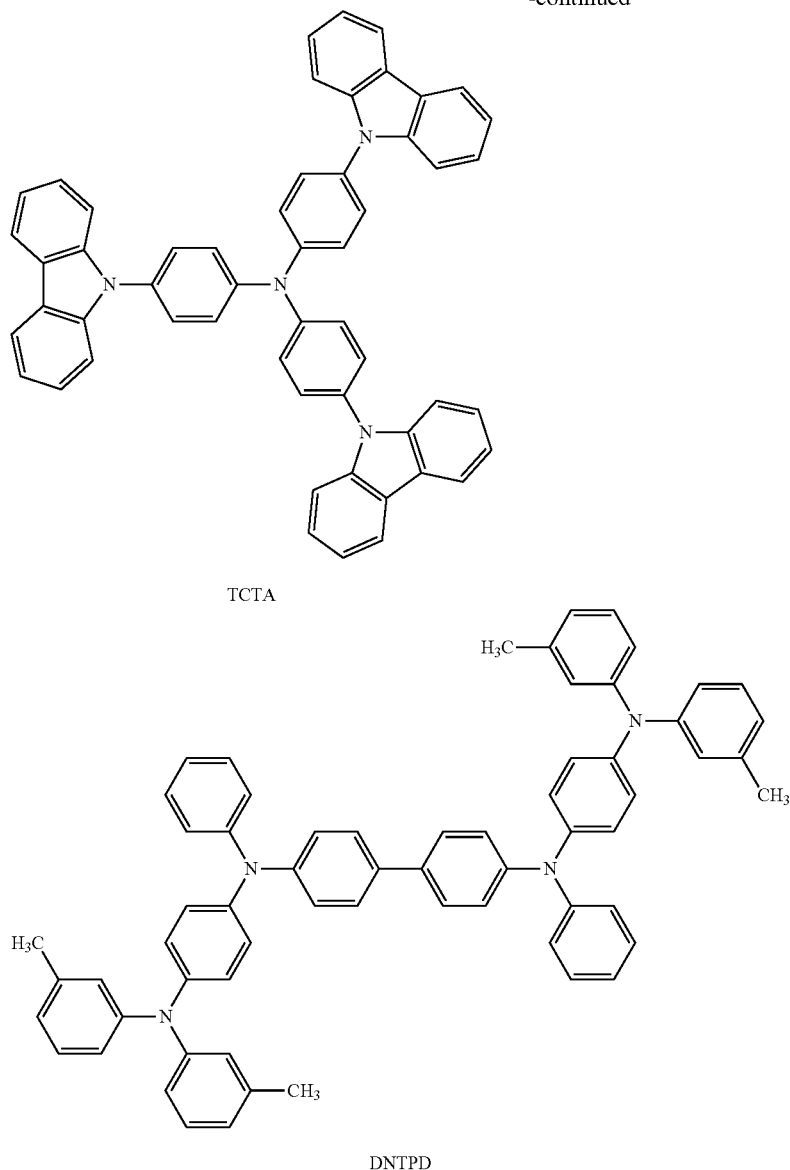

TCTA

DNTPD (Fabrication of Light-Emitting Element 1)

The light-emitting element 1 is a light-emitting element having the structure described using FIG. 1A in Embodiment Mode 1. Specifically, the light-emitting element 1 is a light-emitting element of the case where the HOMO level of a second layer 1512 of FIG. 15A is deeper (the absolute value is larger) than the HOMO levels of a first layer 1511 and a third layer 1513.

First, indium tin oxide containing silicon oxide was deposited over a glass substrate 1501 by a sputtering method to form a first electrode 1502. Note that the thickness thereof was set to be 110 nm and the area thereof was set to be 2 mm×2 mm.

Next, an EL layer 1503 in which a plurality of layers is stacked over the first electrode 1502 is formed. In this example, the EL layer 1503 has a structure in which the first layer 1511 which is the hole-injecting layer, a second layer 1512 which is the hole-transporting layer, the third layer 1513 which is the hole-transporting layer, a fourth layer 1514 which is the light-emitting layer, a fifth layer 1515 which is the electron-transporting layer, and a sixth layer 1516 which is the electron-injecting layer are stacked in that order.

The substrate provided with the first electrode 1502 was fixed on a substrate holder that was provided in a vacuum evaporation apparatus so that a surface provided with the first electrode 1502 faced downward. The pressure in the vacuum evaporation apparatus was reduced to approximately $10^{-4}$ Pa. Then, over the first electrode 1502, 4,4'-bis [N-(1-naphthyl)-N-phenylamino]biphenyl (abbreviation: NPB) and molybdenum(VI) oxide were co-evaporated to form the first layer 1511 which is the hole-injecting layer. The thickness thereof was set to be 30 nm, and the evaporation rate was adjusted such that the weight ratio of NPB to molybdenum(VI) oxide was adjusted to be 4:1 (=NPB: molybdenum oxide). Note that a co-evaporation method is an evaporation method in which evaporation is performed using a plurality of evaporation sources in one treatment chamber at the same time.

Next, N-[4-(9H-carbazol-9-yl)phenyl]-N-phenyl-spiro-9,9'-bifluoren-2-amine (abbreviation: YGASF) was deposited over the first layer 1511 to a thickness of 10 nm by an evaporation method using resistive heating to form the second layer 1512 which is the hole-transporting layer.

Next, 4,4'-bis[N-(1-naphthyl)-N-phenylamino]biphenyl (abbreviation: NPB) was deposited over the second layer 1512 to a thickness of 20 nm by an evaporation method using resistive heating to form the third layer 1513 which is the hole-transporting layer.

Next, the fourth layer 1514 which is the light-emitting layer is formed over the third layer 1513. By co-evaporation of 9-[4-(N-carbazolyl)phenyl]-10-phenylanthracene (abbreviation: CzPA) and N,N'-bis[4-(9H-carbazol-9-yl)phenyl]-N,N'-diphenylstilbene-4,4'-diamine (abbreviation: YGA2S), the fourth layer 1514 with a thickness of 30 nm was formed. Here, the evaporation rate was adjusted such that the weight ratio of CzPA to YGA2S was adjusted to be 1:0.04 (=CzPA:YGA2S).

Furthermore, tris(8-quinolinolato)aluminum(III) (abbreviation: Alq) was deposited over the fourth layer 1514 to a thickness of 20 nm, and bathophenanthroline (abbreviation: BPhen) was deposited thereover to a thickness of 10 nm by an evaporation method using resistive heating to form the fifth layer 1515 that is the electron-transporting layer.

Lithium fluoride (LiF) was deposited over the fifth layer 1515 to a thickness of 1 nm to form the sixth layer 1516 that is the electron-injecting layer.

Lastly, aluminum was deposited to a thickness of 200 nm by an evaporation method using resistive heating to form a second electrode 1504. Accordingly, the light-emitting element 1 was fabricated.

Sealing was performed in a glove box under a nitrogen atmosphere so that the light-emitting element 1 obtained as described above was not exposed to the atmosphere, and then operation characteristics of this light-emitting element were measured. Note that the measurements were performed at room temperature (in an atmosphere kept at 25° C.).

Figure 17:
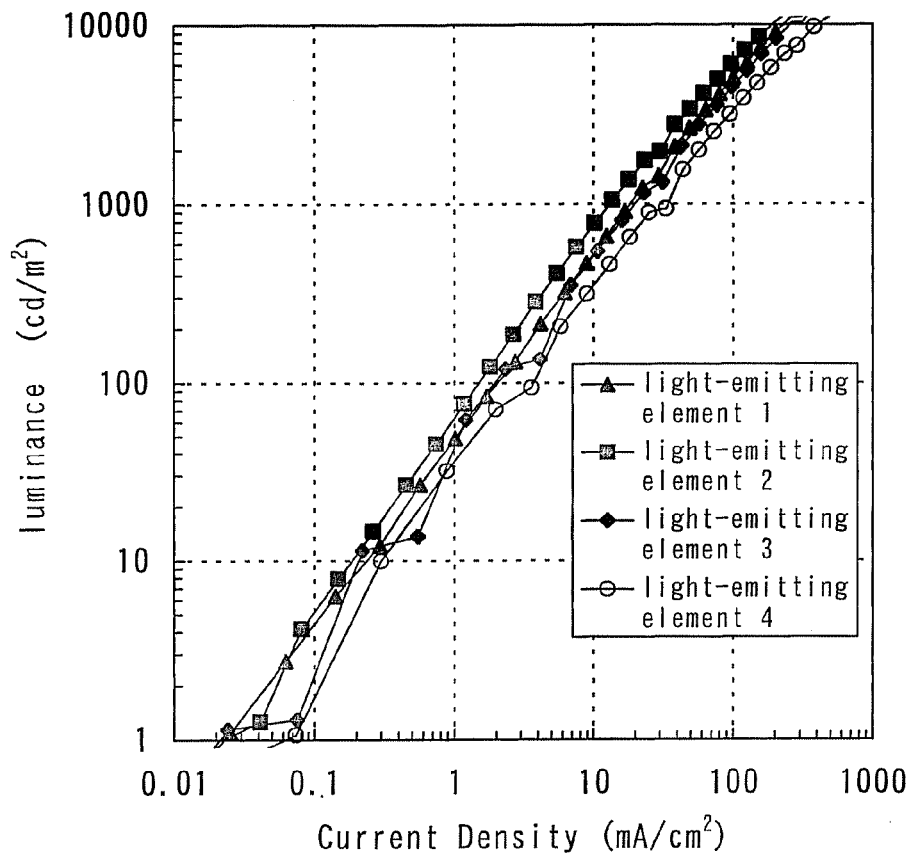
FIG. 17 illustrates current density vs. luminance characteristics of light-emitting elements 1 to 4.
Figure 18:
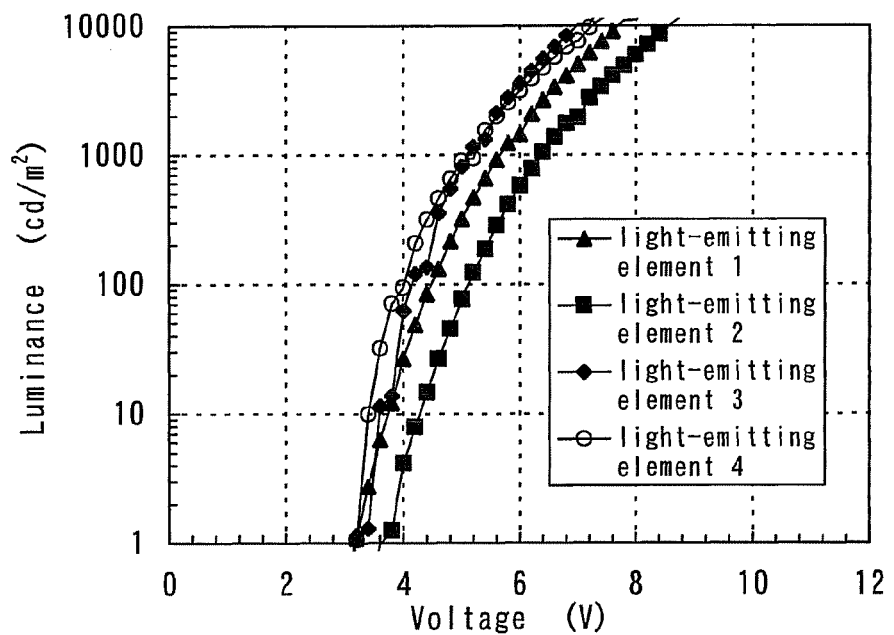
FIG. 18 illustrates voltage vs. luminance characteristics of the light-emitting elements 1 to 4.
Figure 19:
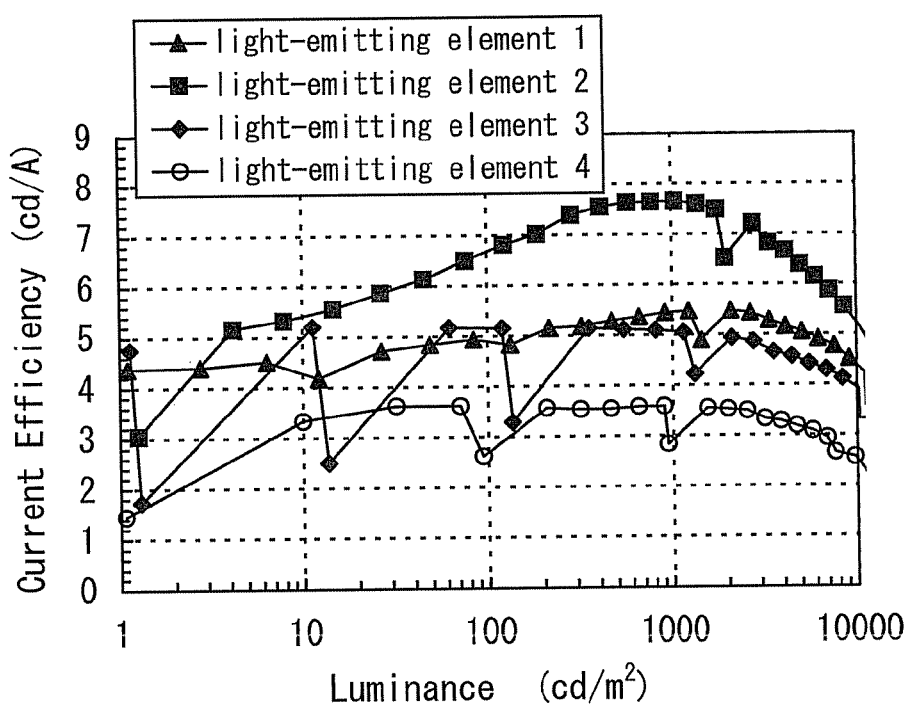
FIG. 19 illustrates luminance vs. current efficiency characteristics of the light-emitting elements 1 to 4.
Figure 20:
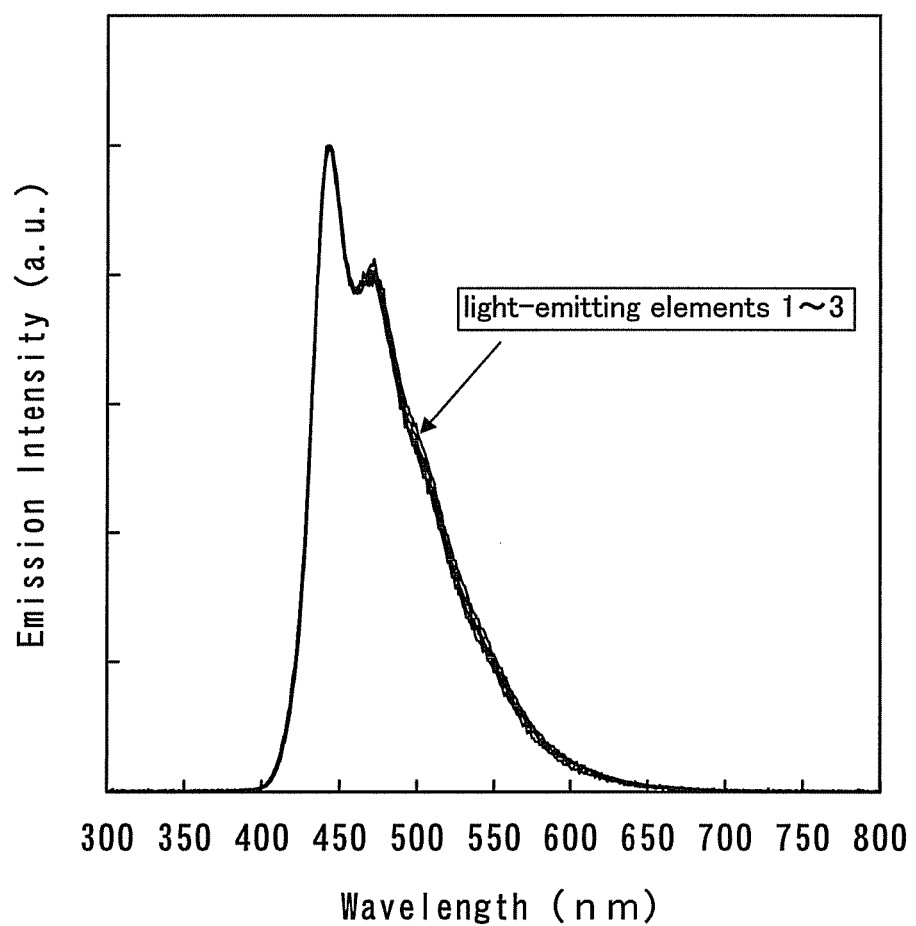
FIG. 20 illustrates emission spectra of the light-emitting elements 1 to 3.

The current density vs. luminance characteristics of the light-emitting element 1 are shown in FIG. 17. In addition, the voltage vs. luminance characteristics are shown in FIG. 18. In addition, the luminance vs. current efficiency characteristics are shown in FIG. 19. In addition, the emission spectrum at current of 1 mA is shown in FIG. 20.

The CIE chromaticity coordinate of the light-emitting element 1 at a luminance of 1000 cd/m$^2$ was (x=0.16, y=0.18), and blue light which derives from YGA2S was emitted. In addition, at a luminance of 1000 cd/m$^2$, the current efficiency was 5.4 cd/A, meaning that high efficiency was exhibited. At a luminance of 1000 cd/m$^2$, the driving voltage was 5.6 V.

(Fabrication of Light-Emitting Element 2)

The light-emitting element 2 is, similarly to the light-emitting element 1, a light-emitting element having the structure described using FIG. 1A in Embodiment Mode 1. Specifically, the light-emitting element 2 is a light-emitting element of the case where the HOMO level of the second layer 1512 of FIG. 15A is deeper (the absolute value is larger) than the HOMO levels of the first layer 1511 and the third layer 1513.

The light-emitting element 2 was fabricated in a similar manner to the light-emitting element 1 except that 4,4',4"-tris(N-carbazolyl)triphenylamine (abbreviation: TCTA) was used instead of YGASF used for the second layer 1512 of the light-emitting element 1.

Sealing was performed in a glove box under a nitrogen atmosphere so that the obtained light-emitting element 2 was not exposed to the atmosphere, and then operation characteristics of this light-emitting element were measured. Note that the measurements were performed at room temperature (in an atmosphere kept at 25° C.).

The current density vs. luminance characteristics of the light-emitting element 2 are shown in FIG. 17. In addition, the voltage vs. luminance characteristics are shown in FIG. 18. In addition, the luminance vs. current efficiency characteristics are shown in FIG. 19. In addition, the emission spectrum at current of 1 mA is shown in FIG. 20.

The CIE chromaticity coordinate of the light-emitting element 2 at a luminance of 1000 cd/m$^2$ was (x=0.16, y=0.18), and blue light which derives from YGA2S was emitted. In addition, at a luminance of 1000 cd/m$^2$, the current efficiency was 7.7 cd/A, meaning that high efficiency was exhibited. At a luminance of 1000 cd/m$^2$, the driving voltage was 6.4 V.

(Fabrication of Light-Emitting Element 3)

Unlike the light-emitting element 1 or the light-emitting element 2, the light-emitting element 3 is a light-emitting element having the structure described using FIG. 1B in Embodiment Mode 1. Specifically, the light-emitting element 3 is a light-emitting element of the case where the HOMO level of the second layer 1512 of FIG. 15A is shallower (the absolute value is smaller) than the HOMO levels of the first layer 1511 and the third layer 1513.

The light-emitting element 3 was fabricated in a similar manner to the light-emitting element 1, using 4, 4'-bis(N-{4-[N-(3-methylphenyl)-N-phenylamino]phenyl}-N-phenylamino)biphenyl (abbreviation: DNTPD) instead of YGASF used for the second layer 1512 of the light-emitting element 1.

Sealing was performed in a glove box under a nitrogen atmosphere so that the obtained light-emitting element 3 was not exposed to the atmosphere, and then operation characteristics of this light-emitting element were measured. Note that the measurements were performed at room temperature (in an atmosphere kept at 25° C.).

The current density vs. luminance characteristics of the light-emitting element 3 are shown in FIG. 17. In addition, the voltage vs. luminance characteristics are shown in FIG. 18. In addition, the luminance vs. current efficiency characteristics are shown in FIG. 19. In addition, the emission spectrum at current of 1 mA is shown in FIG. 20.

The CIE chromaticity coordinate of the light-emitting element 3 at a luminance of 1000 cd/m$^2$ was (x=0.16, y=0.17), and blue light which derives from YGA2S was emitted. In addition, at a luminance of 1000 cd/m$^2$, the current efficiency was 5.1 cd/A, meaning that high efficiency was exhibited. At a luminance of 1000 cd/m$^2$, the driving voltage was 5.2 V.

(Fabrication of Light-Emitting Element 4)

Next, as a light-emitting element for comparison, a light-emitting element 4 having a structure shown in FIG. 15B (a structure in which the second layer 1512 of the above light-emitting elements 1 to 3 is not provided) is fabricated. The fabrication method is described below.

First, indium tin oxide containing silicon oxide was deposited over the glass substrate 1501 by a sputtering method to form the first electrode 1502. Note that the thickness thereof was set to be 110 nm and the area thereof was set to be 2 mm×2 mm.

The substrate provided with the first electrode 1502 was fixed on a substrate holder that was provided in a vacuum evaporation apparatus so that a surface provided with the first electrode 1502 faced downward. The pressure in the vacuum evaporation apparatus was reduced to approximately $10^{-4}$ Pa. Then, over the first electrode 1502, 4,4'-bis[N-(1-naphthyl)-N-phenylamino]biphenyl (abbreviation: NPB) and molybdenum(VI) oxide were co-evaporated to form the first layer 1511 which is the hole-injecting layer. The thickness thereof was set to be 30 nm, and the evaporation rate was adjusted such that the weight ratio of NPB to molybdenum(VI) oxide was adjusted to be 4:1 (=NPB:molybdenum oxide). Note that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited to a thickness of 30 nm by an evaporation method using resistive heating to form the third layer 1513 which is the hole-transporting layer.

Next, the fourth layer 1514 which is the light-emitting layer is formed over the third layer 1513. By co-evaporation of 9-[4-(N-carbazolyl)phenyl]-10-phenylanthracene (abbreviation: CzPA) and N,N'-bis[4-(9H-carbazol-9-yl)phenyl]-N,N-diphenylstilbene-4,4'-diamine (abbreviation: YGA2S), the fourth layer 1514 with a thickness of 30 nm was formed. Here, the evaporation rate was adjusted such that the weight ratio of CzPA to YGA2S was adjusted to be 1:0.04 (=CzPA:YGA2S).

Then, tris(8-quinolinolato)aluminum(III) (abbreviation: Alq) was deposited over the fourth layer 1514 to a thickness of 20 nm, and bathophenanthroline (abbreviation: BPhen) was deposited thereover to a thickness of 10 nm by an evaporation method using resistive heating to form the fifth layer 1515 that is the electron-transporting layer.

Next, lithium fluoride (LiF) was deposited over the fifth layer 1515 to a thickness of 1 nm to form the sixth layer 1516 that is the electron-injecting layer.

Lastly, aluminum was deposited to a thickness of 200 nm by an evaporation method using resistive heating to form the second electrode 1504. Accordingly, the light-emitting element 4 was fabricated.

Sealing was performed in a glove box under a nitrogen atmosphere so that the light-emitting element 4 obtained as described above was not exposed to the atmosphere, and then operation characteristics of the light-emitting element 4 were measured. Note that the measurements were performed at room temperature (in an atmosphere kept at 25° C.).

The current density vs. luminance characteristics of the light-emitting element 4 are shown in FIG. 17. In addition, the voltage vs. luminance characteristics are shown in FIG. 18. In addition, the luminance vs. current efficiency characteristics are shown in FIG. 19.

The CIE chromaticity coordinate of the light-emitting element 4 at a luminance of 1000 cd/m² was (x=0.16, y=0.17), and blue light which derives from YGA2S was emitted similarly to the light-emitting elements 1 to 3. Further, the current efficiency of the light-emitting element 4 was 3.6 cd/A, and thus it is found that the current efficiency was lower than those of the light-emitting elements 1 to 3.

As described above, it can be seen that the light-emitting elements 1 to 3 have higher efficiency than the light-emitting element 4. Thus, it is understood that a light-emitting element having high efficiency can be obtained by applying the present invention.

Example 2

Figure 16A:
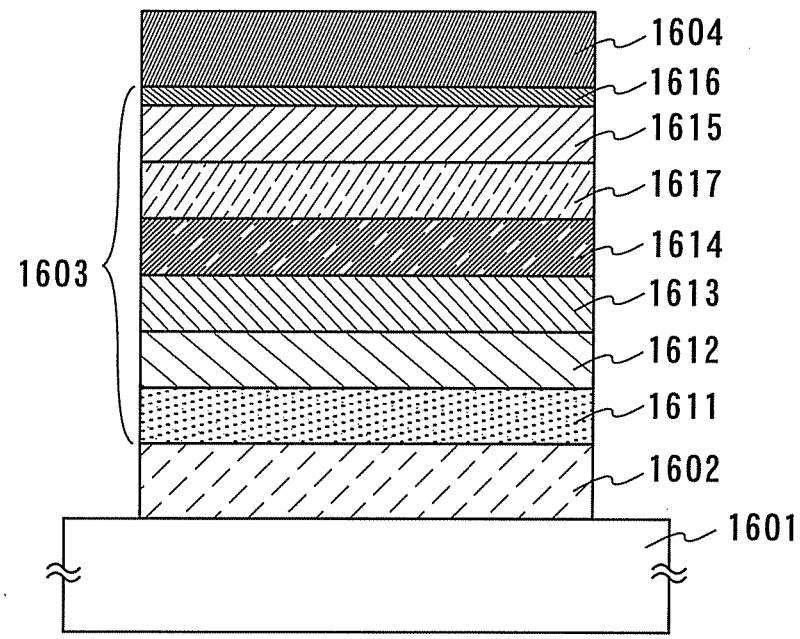
FIGS. 16A and 16B each illustrate an element structure of a light-emitting element in Example 2.
Figure 16B:
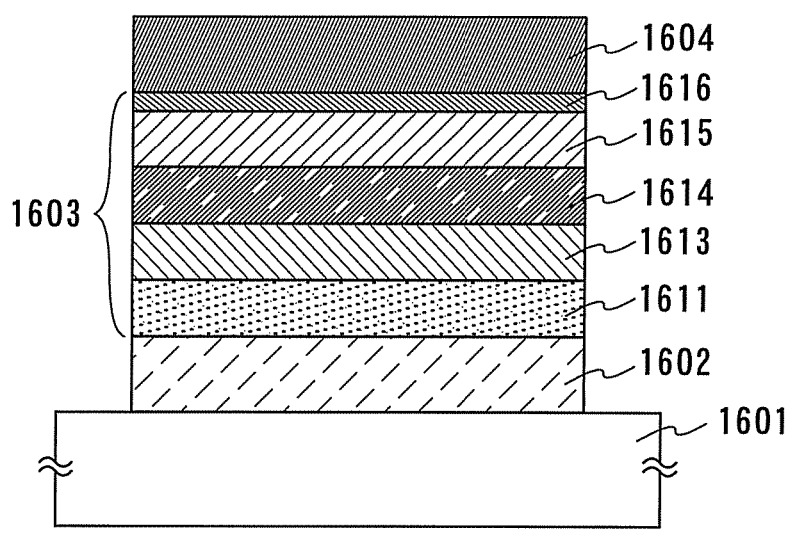

In Example 2, fabrication methods of light-emitting elements having the structure described in Embodiment Mode 2, which are light-emitting elements of the present invention, and measurement results of the element characteristics thereof are described. Note that the element structure of the light-emitting elements described in this example (light-emitting elements 5 to 7) are shown in FIG. 16A and the element structure of a light-emitting element 8 to be compared to these light-emitting elements is shown in FIG. 16B. Further, structural formulae of organic compounds used in Example 2 are shown below. Note that the organic compounds described in Example 1 can be referred to Example 1 and the description thereof is omitted here.

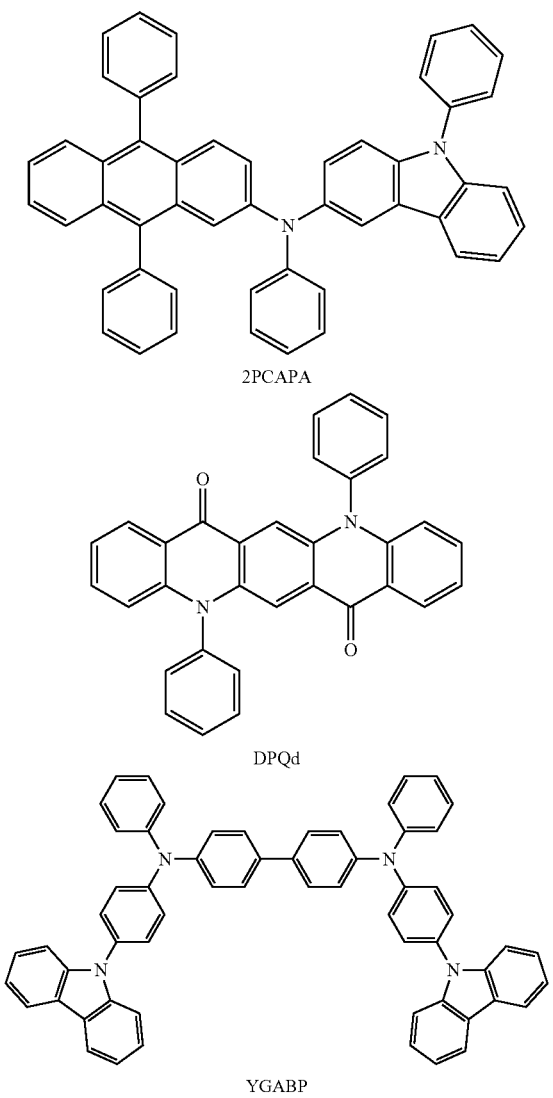

(Fabrication of Light-Emitting Element 5)

The light-emitting element 5 is a light-emitting element having the structure described using FIG. 4A in Embodiment Mode 2. Specifically, the light-emitting element 5 is a light-emitting element of the case where the HOMO level of the second layer 1612 of FIG. 16A is deeper (the absolute value is larger) than the HOMO levels of a first layer 1611 and a third layer 1613. Furthermore, the light-emitting element 5 is a light-emitting element of the case where the seventh layer kinetically controls carriers (electrons) as illustrated in the conceptual diagrams of FIGS. 6A and 6B.

First, indium tin oxide containing silicon oxide was deposited over a glass substrate 1601 by a sputtering method to form a first electrode 1602. Note that the thickness thereof was set to be 110 nm and the area thereof was set to be 2 mm×2 mm.

Next, an EL layer 1603 in which a plurality of layers is stacked over the first electrode 1602 is formed. In this example, the EL layer 1603 has a structure in which the first layer 1611 which is the hole-injecting layer, a second layer 1612 which is the hole-transporting layer, the third layer 1613 which is the hole-transporting layer, a fourth layer 1614 which is the light-emitting layer, a seventh layer 1617 which is the carrier control layer for controlling transport of electron carriers, a fifth layer 1615 which is the electron-transporting layer, and a sixth layer 1616 which is the electron-injecting layer are stacked in that order.

The substrate provided with the first electrode 1602 was fixed on a substrate holder that was provided in a vacuum evaporation apparatus so that a surface provided with the first electrode 1602 faced downward. The pressure in the vacuum evaporation apparatus was reduced to approximately $10^{-4}$ Pa. Then, over the first electrode 1602, 4,4'-bis [N-(1-naphthyl)-N-phenylamino]biphenyl (abbreviation: NPB) and molybdenum(VI) oxide were co-evaporated to form the first layer 1611 which is the hole-injecting layer. The thickness thereof was set to be 30 nm, and the evaporation rate was adjusted such that the weight ratio of NPB to molybdenum(VI) oxide was adjusted to be 4:1 (=NPB: molybdenum oxide). Note that a co-evaporation method is an evaporation method in which evaporation is performed using a plurality of evaporation sources in one treatment chamber at the same time.

Next, N-[4-(9H-carbazol-9-yl)phenyl]-N-phenyl-spiro-9, 9'-bifluoren-2-amine (abbreviation: YGASF) was deposited over the first layer 1611 to a thickness of 10 nm by an evaporation method using resistive heating to form the second layer 1612 that is the hole-transporting layer.

Next, 4,4'-bis[N-(1-naphthyl)-N-phenylamino]biphenyl (abbreviation: NPB) was deposited over the second layer 1612 to a thickness of 20 nm by an evaporation method using resistive heating to form the third layer 1613 that is the hole-transporting layer.

Next, the fourth layer 1614 which is the light-emitting layer is formed over the third layer 1613. By co-evaporation of 9-[4-(N-carbazolyl)phenyl]-10-phenylanthracene (abbreviation: CzPA) and N-(9,10-diphenyl-2-anthryl)-N,9-diphenyl-9H-carbazol-3-amine (abbreviation: 2PCAPA), the fourth layer 1614 with a thickness of 30 nm was formed. Here, the evaporation rate was adjusted such that the weight ratio of CzPA to 2PCAPA could be 1:0.05 (=CzPA: 2PCAPA).

Furthermore, over the fourth layer 1614, tris(8-quinolinolato)aluminum(III) (abbreviation: Alq) and N-(9, 10-diphenyl-2-anthryl)-N,9-diphenyl-9H-carbazol-3-amine (abbreviation: 2PCAPA) were co-evaporated to form the seventh layer 1617 which is the carrier control layer for controlling electron carriers with a thickness of 10 nm. Here, the evaporation rate was adjusted such that the weight ratio of Alq to 2PCAPA could be 1:0.1 (=Alq:2PCAPA).

Then, tris(8-quinolinolato)aluminum(III) (abbreviation: Alq) was deposited over the seventh layer 1617 to a thickness of 30 nm by an evaporation method using resistive heating to form the fifth layer 1615 that is the electron-transporting layer.

Lithium fluoride (LiF) was deposited over the fifth layer 1615 to a thickness of 1 nm to form the sixth layer 1616 that is the electron-injecting layer.

Lastly, aluminum was deposited to a thickness of 200 nm by an evaporation method using resistive heating to form a second electrode 1604. Accordingly, the light-emitting element 5 was fabricated.

Sealing was performed in a glove box under a nitrogen atmosphere so that the light-emitting element 5 of the present invention which is obtained as described above was not exposed to the atmosphere, and then operation characteristics of this light-emitting element were measured. Note that the measurements were performed at room temperature (in an atmosphere kept at 25° C.).

Figure 21:
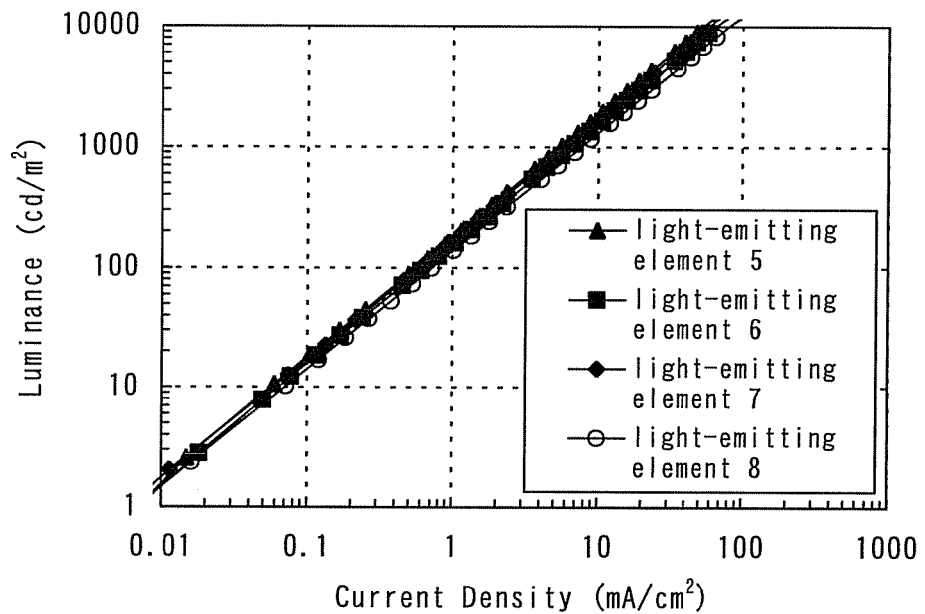
FIG. 21 illustrates current density vs. luminance characteristics of light-emitting elements 5 to 8.
Figure 22:
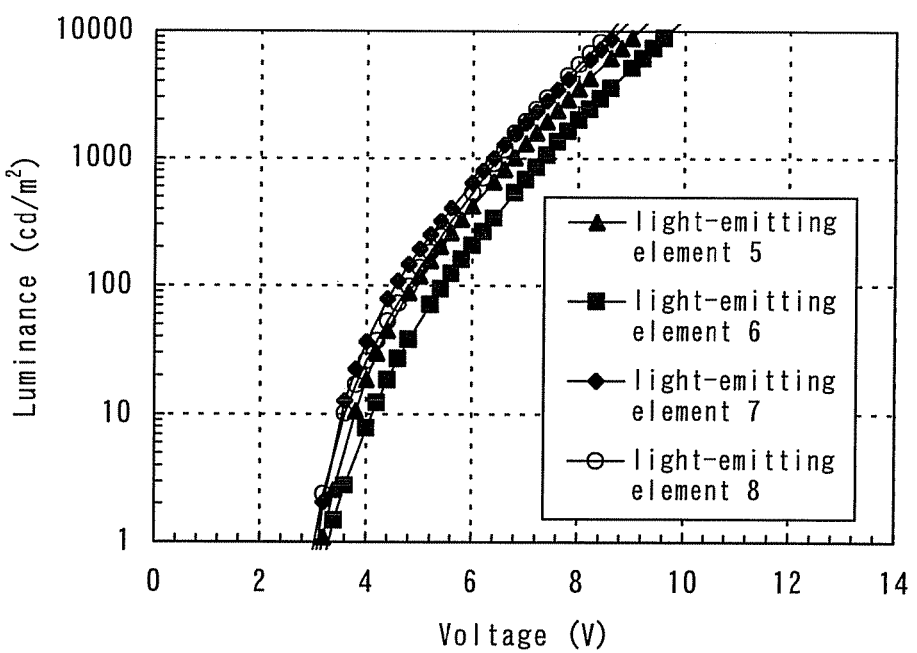
FIG. 22 illustrates voltage vs. luminance characteristics of the light-emitting elements 5 to 8.
Figure 23:
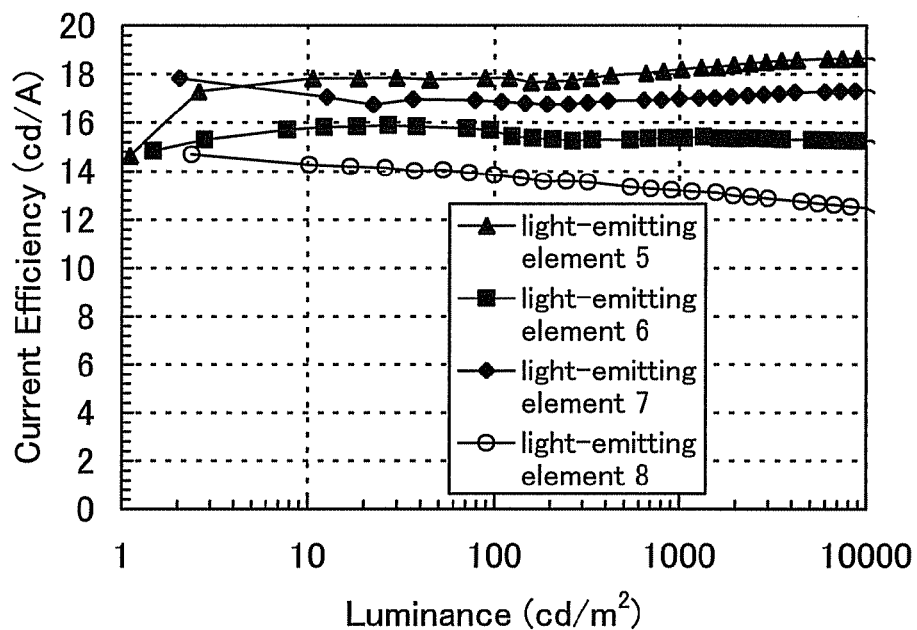
FIG. 23 illustrates luminance vs. current efficiency characteristics of the light-emitting elements 5 to 8.
Figure 24:
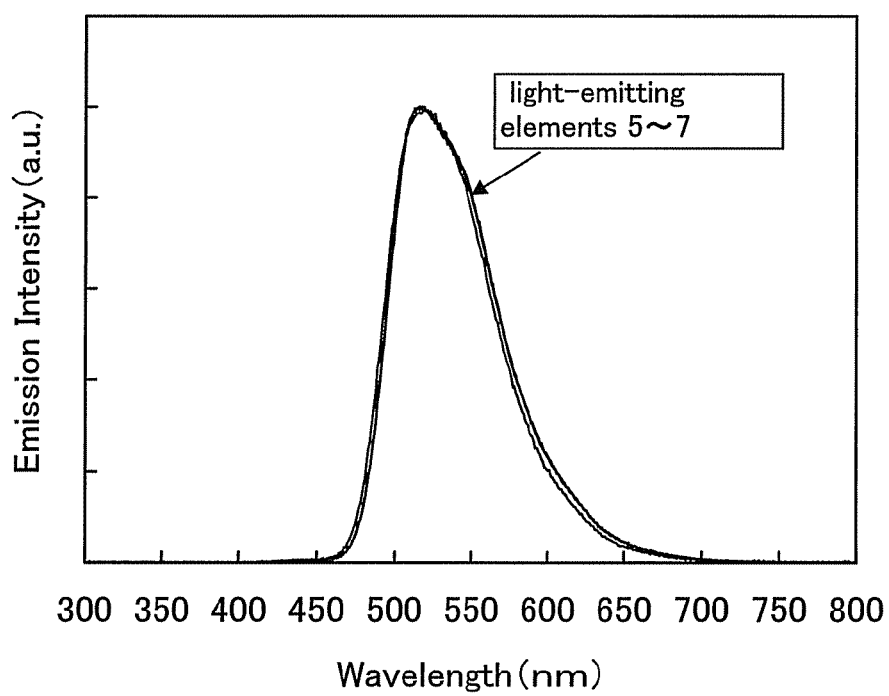
FIG. 24 illustrates emission spectra of the light-emitting elements 5 to 7.
Figure 25:
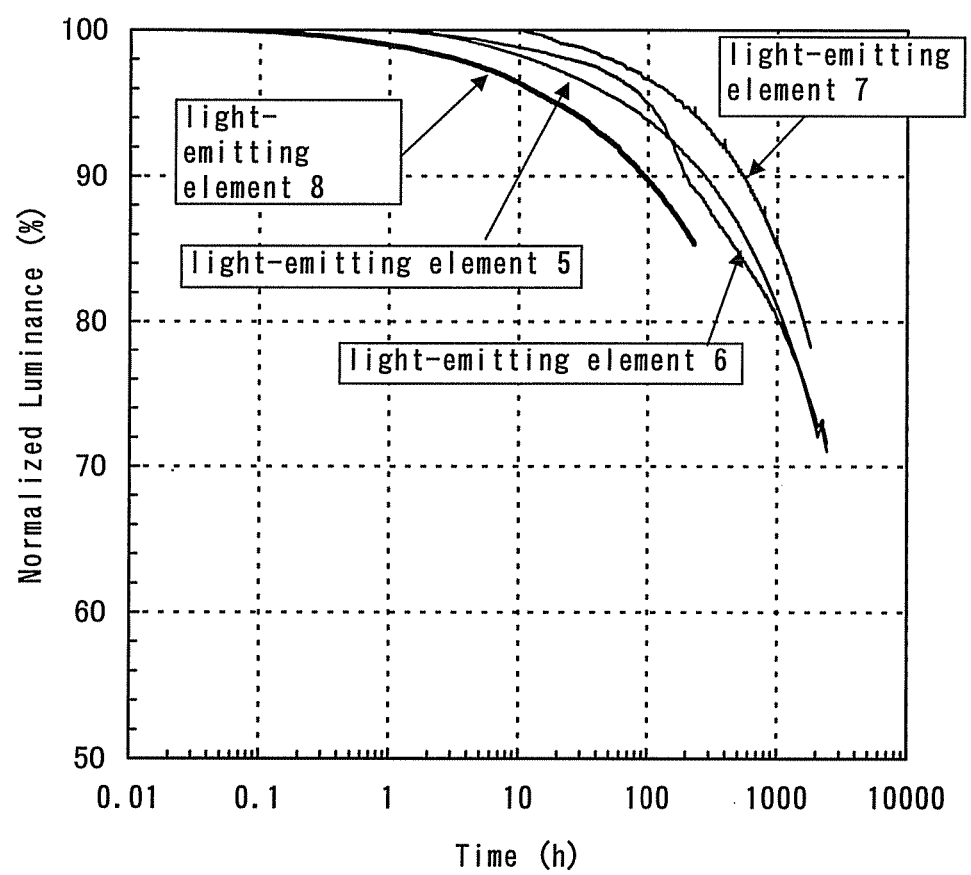
FIG. 25 illustrates results of continuous lighting tests of the light-emitting elements 5 to 8 by constant current driving.

The current density vs. luminance characteristics of the light-emitting element 5 are shown in FIG. 21. In addition, the voltage vs. luminance characteristics are shown in FIG. 22. In addition, the luminance vs. current efficiency characteristics are shown in FIG. 23. In addition, the emission spectrum at current of 1 mA is shown in FIG. 24. Further, FIG. 25 shows the results of continuous lighting tests in which the light-emitting element 5 was continuously lit by constant current driving with the initial luminance set at 5000 cd/m$^2$ (the vertical axis indicates the relative luminance on the assumption that 5000 cd/m$^2$ is 100%).

The CIE chromaticity coordinate of the light-emitting element 5 at a luminance of 5000 cd/m$^2$ was (x=0.29, y=0.63), and green light which derives from 2PCAPA was emitted. In addition, at a luminance of 5000 cd/m$^2$, the current efficiency was 19 cd/A, meaning that high efficiency was exhibited. At a luminance of 5000 cd/m$^2$, the driving voltage was 8.4 V.

Furthermore, the continuous lighting tests were conducted in which the light-emitting element 5 was continuously lit by constant current driving with the initial luminance set at 5000 cd/m$^2$. As a result, 81% of the initial luminance was maintained even after 1000 hours. Thus, it was proved that the light-emitting element 5 has a long life in addition to high efficiency.

(Fabrication of Light-Emitting Element 6)

The light-emitting element 6 is a light-emitting element having the structure described using FIG. 4A in Embodiment Mode 2. Specifically, the light-emitting element 6 is a light-emitting element of the case where the HOMO level of the second layer 1612 of FIG. 16A is deeper (the absolute value is larger) than the HOMO levels of the first layer 1611 and the third layer 1613. Furthermore, the light-emitting element 6 is a light-emitting element of the case where the seventh layer thermodynamically controls carriers (electrons) as illustrated in the conceptual diagram of FIG. 7.

The light-emitting element 6 was fabricated in a similar manner to the light-emitting element 5 except that a co-evaporated film of Alq and N,N-diphenylquinacridone (abbreviation: DPQd) was used instead of a co-evaporated film of Alq and 2PCAPA, which was used for the seventh layer 1617 of the light-emitting element 5. Here, the evaporation rate was adjusted such that the weight ratio of Alq to DPQd could be 1:0.005 (=Alq:DPQd).

Sealing was performed in a glove box under a nitrogen atmosphere so that the obtained light-emitting element 6 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 6 are shown in FIG. 21. In addition, the voltage vs. luminance characteristics are shown in FIG. 22. In addition, the luminance vs. current efficiency characteristics are shown in FIG. 23. In addition, the emission spectrum at current of 1 mA is shown in FIG. 24. Further, FIG. 25 shows the results of continuous lighting tests in which the light-emitting element 6 was continuously lit by constant current driving with the initial luminance set at 5000 cd/m$^2$ (the vertical axis indicates the relative luminance on the assumption that 5000 cd/m$^2$ is assumed as 100%).

The CIE chromaticity coordinate of the light-emitting element 6 at a luminance of 5000 cd/m$^2$ was (x=0.29, y=0.62), and green light which derives from 2PCAPA was emitted. In addition, at a luminance of 5000 cd/m$^2$, the current efficiency was 15 cd/A, meaning that high efficiency was exhibited. At a luminance of 5000 cd/m$^2$, the driving voltage was 9 V.

Furthermore, the continuous lighting tests were conducted in which the light-emitting element 6 was continuously lit by constant current driving with the initial luminance set at 5000 cd/m$^2$. As a result, 80% of the initial luminance was maintained even after 1000 hours. Thus, it was proved that the light-emitting element 6 has a long life in addition to high efficiency.

(Fabrication of Light-Emitting Element 7)

The light-emitting element 7 is a light-emitting element having the structure described using FIG. 4A in Embodiment Mode 2. Specifically, the light-emitting element 6 is a light-emitting element of the case where the HOMO level of the second layer 1612 of FIG. 16A is deeper (the absolute value is larger) than the HOMO levels of the first layer 1611 and the third layer 1613. Furthermore, the light-emitting element 7 is a light-emitting element of the case where the seventh layer kinetically controls carriers (electrons) as illustrated in the conceptual diagram of FIGS. 6A and 6B.

The light-emitting element 7 was fabricated in a similar manner to the light-emitting element 5, using N,N'-bis[4-(9H-carbazol-9-yl)phenyl]-N,N'-diphenylbiphenyl-4,4'-diamine (abbreviation: YGABP) instead of YGASF used for the second layer 1612 of the light-emitting element 5.

Sealing was performed in a glove box under a nitrogen atmosphere so that the obtained light-emitting element 7 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 7 are shown in FIG. 21. In addition, the voltage vs. luminance characteristics are shown in FIG. 22. In addition, the luminance vs. current efficiency characteristics are shown in FIG. 23. In addition, the emission spectrum at current of 1 mA is shown in FIG. 24. Further, FIG. 25 shows the results of continuous lighting tests in which the light-emitting element 7 was continuously lit by constant current driving with the initial luminance set at 5000 cd/m$^2$ (the vertical axis indicates the relative luminance on the assumption that 5000 cd/m$^2$ is assumed as 100%).

The CIE chromaticity coordinate of the light-emitting element 7 at a luminance of 5000 cd/m$^2$ was (x=0.29, y=0.63), and green light which derives from 2PCAPA was emitted. In addition, at a luminance of 5000 cd/m$^2$, the current efficiency was 17 cd/A, meaning that high efficiency was exhibited. At a luminance of 5000 cd/m$^2$, the driving voltage was 8.1 V.

Furthermore, the continuous lighting tests were conducted in which the light-emitting element 7 was continuously lit by constant current driving with the initial luminance set at 5000 cd/m$^2$. As a result, 85% of the initial luminance was maintained even after 1000 hours. Thus, it was proved that the light-emitting element 7 has a long life in addition to high efficiency.

(Fabrication of Light-Emitting Element 8)

Next, as a light-emitting element for comparison, a light-emitting element 8 having a structure shown in FIG. 16B (a structure in which the second layer 1612 and the seventh layer 1617 of the above light-emitting elements 5 to 7 are not provided) is fabricated. The fabrication method is described below.

First, indium tin oxide containing silicon oxide was deposited over the glass substrate 1601 by a sputtering method to form the first electrode 1602. Note that the thickness thereof was set to be 110 nm and the area thereof was set to be 2 mm×2 mm.

Next, the substrate provided with the first electrode 1602 was fixed on a substrate holder that was provided in a vacuum evaporation apparatus so that a surface provided with the first electrode 1602 faced downward. The pressure in the vacuum evaporation apparatus was reduced to approximately 10$^{-4}$ Pa. Then, over the first electrode 1602, 4,4'-bis[N-(1-naphthyl)-N-phenylamino]biphenyl (abbreviation: NPB) and molybdenum(VI) oxide were co-evaporated to form the first layer 1611 which is the hole-injecting layer. The thickness thereof was set to be 50 nm, and the evaporation rate was adjusted such that the weight ratio of NPB to molybdenum(VI) oxide was adjusted to be 4:1 (=NPB:molybdenum oxide). Note that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited to a thickness of 10 nm by an evaporation method using resistive heating to form the third layer 1613 that is the hole-transporting layer.

Next, the fourth layer 1614 which is the light-emitting layer is formed over the third layer 1613. By co-evaporation of 9-[4-(N-carbazolyl)phenyl]-10-phenylanthracene (abbreviation: CzPA) and N-(9,10-diphenyl-2-anthryl)-N,9-diphenyl-9H-carbazol-3-amine (abbreviation: 2PCAPA), the fourth layer 1614 with a thickness of 40 nm was formed. Here, the evaporation rate was adjusted such that the weight ratio of CzPA to 2PCAPPA could be 1:0.05 (=CzPA: 2PCAPA).

Then, tris(8-quinolinolato)aluminum(M) (abbreviation: Alq) was deposited over the fourth layer 1614 to a thickness of 30 nm by an evaporation method using resistive heating to form the fifth layer 1615 that is the electron-transporting layer.

Next, lithium fluoride (LiF) was deposited over the fifth layer 1615 to a thickness of 1 nm to form the sixth layer 1616 that is the electron-injecting layer.

Lastly, aluminum was deposited to a thickness of 200 nm by an evaporation method using resistive heating to form the second electrode 1604. Accordingly, the light-emitting element 8 was fabricated.

Sealing was performed in a glove box under a nitrogen atmosphere so that the light-emitting element 8 obtained as described above was not exposed to the atmosphere, and then operation characteristics of the light-emitting element 8 were measured. Note that the measurements were performed at room temperature (in an atmosphere kept at 25° C.).

The current density vs. luminance characteristics of the light-emitting element 8 are shown in FIG. 21. In addition, the voltage vs. luminance characteristics are shown in FIG. 22. In addition, the luminance vs. current efficiency characteristics are shown in FIG. 23. Further, FIG. 25 shows the results of continuous lighting tests in which the light-emitting element 8 was continuously lit by constant current driving with the initial luminance set at 5000 cd/m² (the vertical axis indicates the relative luminance on the assumption that 5000 cd/m² is assumed as 100%).

The CIE chromaticity coordinate of the light-emitting element 8 at a luminance of 5000 cd/m² was (x=0.30, y=0.62), the current efficiency was 13 cd/A, and green light which derives from 2PCAPA was emitted similarly to the light-emitting elements 5 to 7. It is found that the current efficiency was lower than those of the light-emitting elements 5 to 7. Further, the continuous lighting tests were conducted in which the light-emitting element 8 was continuously lit by constant current driving with the initial luminance set at 5000 cd/m². As a result, the luminance has decreased to 85% of the initial luminance after 220 hours, as shown in FIG. 25. Thus, the light-emitting element 8 exhibited a life shorter than the light-emitting elements 5 to 7.

As described above, it can be seen that the light-emitting elements 5 to 7 have higher efficiency than the light-emitting element 8 and further has a long life. Thus, it is understood that a light-emitting element having high efficiency and a long life can be obtained by applying the present invention.

Example 3

In Example 3, fabrication methods of light-emitting elements (light-emitting elements 9 to 11) having a structure that is the same as the element structure described in Example 2 and measurement results of the element characteristics thereof are described. Note that this example is also described with reference to FIGS. 16A and 16B. Further, organic compounds used in Example 3 are referred to Example 1 or 2 and the description thereof is omitted here.
(Fabrication of Light-Emitting Element 9)

The light-emitting element 9 is a light-emitting element having the structure described using FIG. 4A in Embodiment Mode 2. Specifically, the light-emitting element 9 is a light-emitting element of the case where the HOMO level of the second layer 1612 of FIG. 16A is deeper (the absolute value is larger) than the HOMO levels of the first layer 1611 and the third layer 1613. Furthermore, the light-emitting element 9 is a light-emitting element of the case where the seventh layer kinetically controls carriers (electrons) as illustrated in the conceptual diagrams of FIGS. 6A and 6B.

First, indium tin oxide containing silicon oxide was deposited over the glass substrate 1601 by a sputtering method to form the first electrode 1602. Note that the thickness thereof was set to be 110 nm and the area thereof was set to be 2 mm×2 mm.

Next, the EL layer 1603 in which a plurality of layers is stacked over the first electrode 1602 is formed. In this example, the EL layer 1603 has a structure in which the first layer 1611 which is the hole-injecting layer, the second layer 1612 which is the hole-transporting layer, the third layer 1613 which is the hole-transporting layer, the fourth layer 1614 which is the light-emitting layer, the seventh layer 1617 which is a carrier control layer for controlling transport of electron carriers, the fifth layer 1615 which is the electron-transporting layer, and the sixth layer 1616 which is the electron-injecting layer are stacked in that order.

The substrate provided with the first electrode 1602 was fixed on a substrate holder that was provided in a vacuum evaporation apparatus so that a surface provided with the first electrode 1602 faced downward. The pressure in the vacuum evaporation apparatus was reduced to approximately $10^{-4}$ Pa. Then, over the first electrode 1602, 4,4'-bis[N-(1-naphthyl)-N-phenylamino]biphenyl (abbreviation: NPB) and molybdenum(VI) oxide were co-evaporated to form the first layer 1611 which is the hole-injecting layer. The thickness thereof was set to be 30 nm, and the evaporation rate was adjusted such that the weight ratio of NPB to molybdenum(VI) oxide was adjusted to be 4:1 (=NPB: molybdenum oxide). Note that a co-evaporation method is an evaporation method in which evaporation is performed using a plurality of evaporation sources in one treatment chamber at the same time.

Next, N-[4-(9H-carbazol-9-yl)phenyl]-N-phenyl-spiro-9, 9'-bifluoren-2-amine (abbreviation: YGASF) was deposited over the first layer 1611 to a thickness of 10 nm by an evaporation method using resistive heating to form the second layer 1612 that is the hole-transporting layer.

Next, 4,4'-bis[N-(1-naphthyl)-N-phenylamino]biphenyl (abbreviation: NPB) was deposited over the second layer 1612 to a thickness of 20 nm by an evaporation method using resistive heating to form the third layer 1613 that is the hole-transporting layer.

Next, the fourth layer 1614 which is the light-emitting layer is formed over the third layer 1613. By co-evaporation of 9-[4-(N-carbazolyl)phenyl]-10-phenylanthracene (abbreviation: CzPA) and N-(9,10-diphenyl-2-anthryl)-N,9-diphenyl-9H-carbazol-3-amine (abbreviation: 2PCAPA), the fourth layer 1614 with a thickness of 30 nm was formed. Here, the evaporation rate was adjusted such that the weight ratio of CzPA to 2PCAPA could be 1:0.05 (=CzPA: 2PCAPA).

Furthermore, over the fourth layer 1614, tris(8-quinolinolato)aluminum(III) (abbreviation: Alq) and N-(9,10-diphenyl-2-anthryl)-N,9-diphenyl-9H-carbazol-3-amine (abbreviation: 2PCAPA) were co-evaporated to form the seventh layer 1617 which is the carrier control layer for controlling electron carriers with a thickness of 10 nm. Here, the evaporation rate was adjusted such that the weight ratio of Alq to 2PCAPA could be 1:0.1 (=Alq:2PCAPA).

Then, bathophenanthroline (abbreviation: BPhen) was deposited over the seventh layer 1617 to a thickness of 30 nm by an evaporation method using resistive heating to form the fifth layer 1615 that is the electron-transporting layer.

Lithium fluoride (LiF) was deposited over the fifth layer 1615 to a thickness of 1 nm to form the sixth layer 1616 that is the electron-injecting layer.

Lastly, aluminum was deposited to a thickness of 200 nm by an evaporation method using resistive heating to form the second electrode 1604. Accordingly, the light-emitting element 9 was fabricated.

Sealing was performed in a glove box under a nitrogen atmosphere so that the light-emitting element 9 of the present invention which is obtained as described above was not exposed to the atmosphere, and then operation characteristics of this light-emitting element were measured. Note that the measurements were performed at room temperature (in an atmosphere kept at 25° C.).

Figure 26:
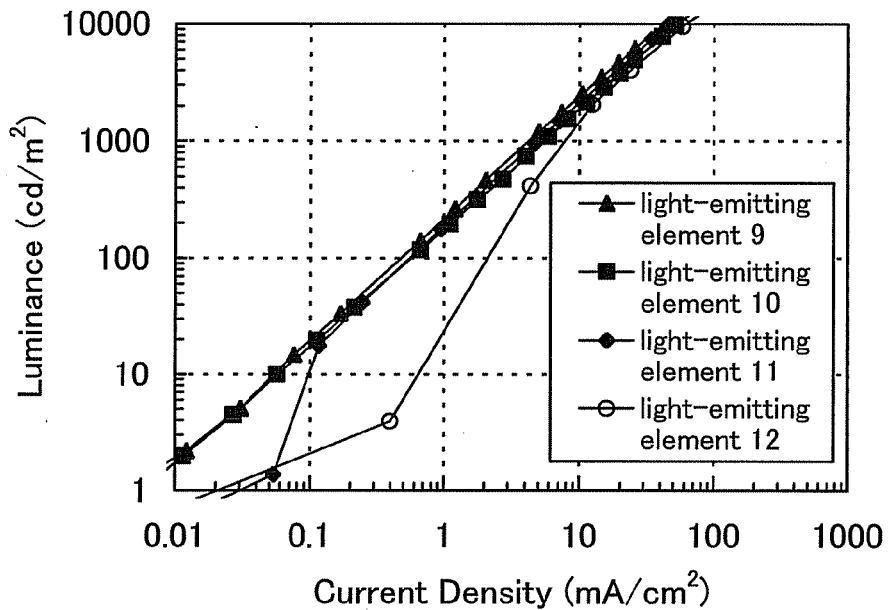
FIG. 26 illustrates current density vs. luminance characteristics of light-emitting elements 9 to 12.
Figure 27:
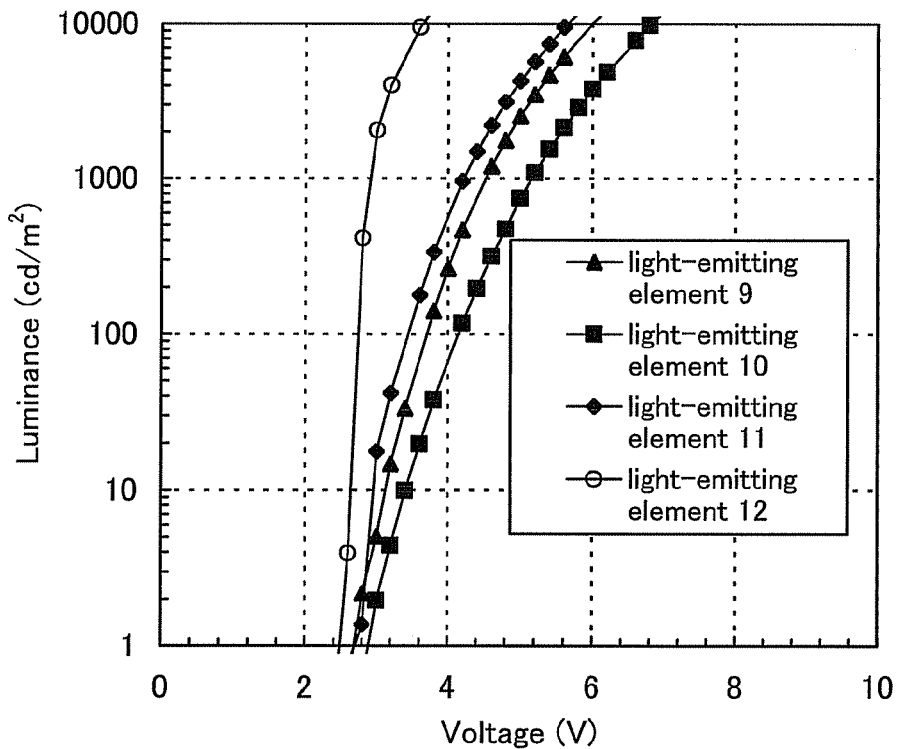
FIG. 27 illustrates voltage vs. luminance characteristics of the light-emitting elements 9 to 12.
Figure 28:
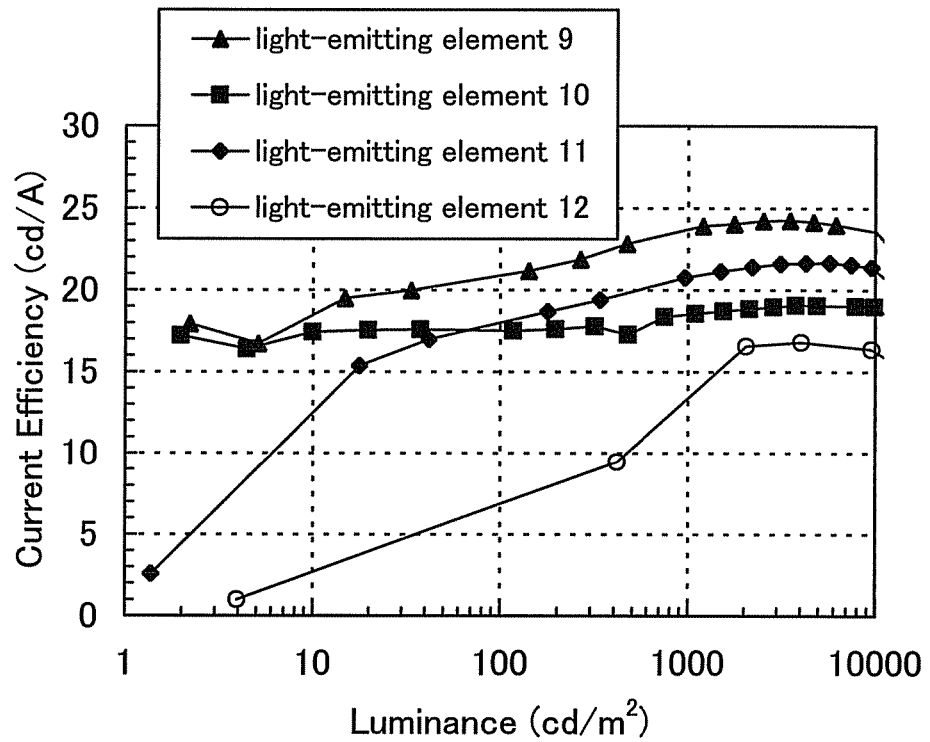
FIG. 28 illustrates luminance vs. current efficiency characteristics of the light-emitting elements 9 to 12.
Figure 29:
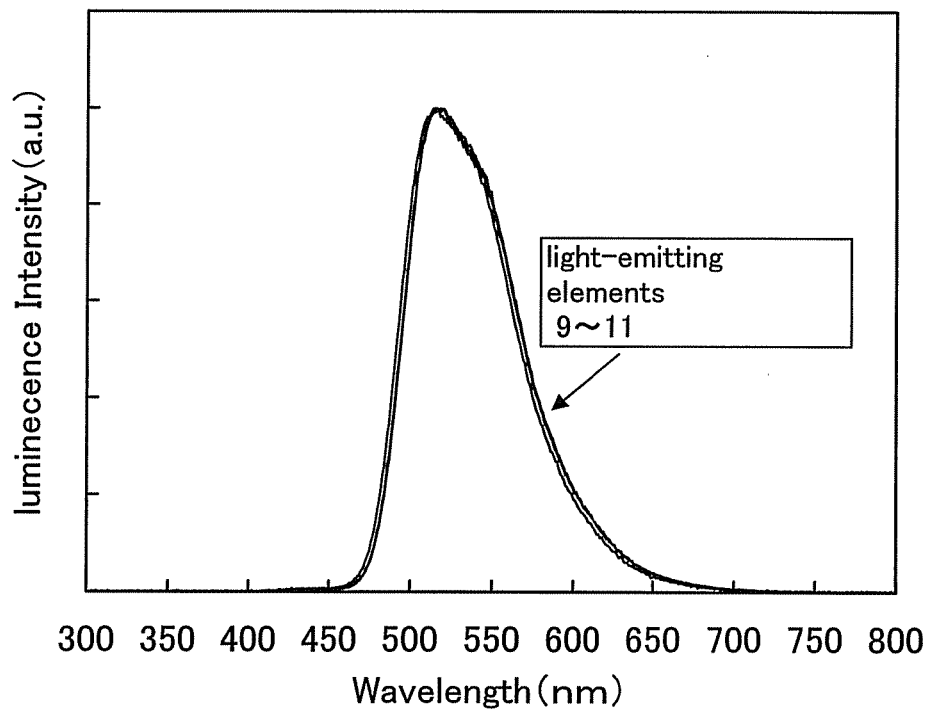
FIG. 29 illustrates emission spectra of the light-emitting elements 9 to 11.
Figure 30:
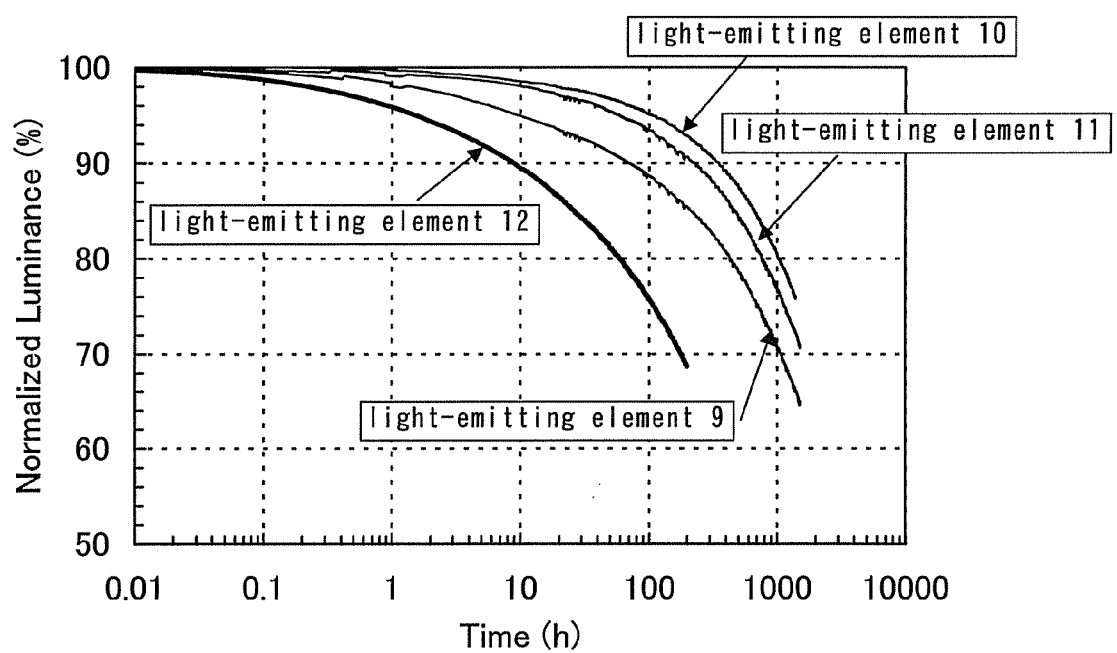
FIG. 30 illustrates results of continuous lighting tests of the light-emitting elements 9 to 12 by constant current driving.

The current density vs. luminance characteristics of the light-emitting element 9 are shown in FIG. 26. In addition, the voltage vs. luminance characteristics are shown in FIG. 27. In addition, the luminance vs. current efficiency characteristics are shown in FIG. 28. In addition, the emission spectrum at current of 1 mA is shown in FIG. 29. Further, FIG. 30 shows the results of continuous lighting tests in which the light-emitting element 9 was continuously lit by constant current driving with the initial luminance set at 5000 cd/m² (the vertical axis indicates the relative luminance on the assumption that 5000 cd/m² is assumed as 100%).

The CIE chromaticity coordinate of the light-emitting element 9 at a luminance of 5000 cd/m$^2$ was (x=0.29, y=0.63), and green light which derives from 2PCAPA was emitted. In addition, at a luminance of 5000 cd/m$^2$, the current efficiency was 24 cd/A, meaning that extremely high efficiency was exhibited. At a luminance of 5000 cd/m$^2$, the driving voltage was 5.4 V.

Furthermore, the continuous lighting tests were conducted in which the light-emitting element 9 was continuously lit by constant current driving with the initial luminance set at 5000 cd/m$^2$. As a result, 71% of the initial luminance was maintained even after 1000 hours. Thus, it was proved that the light-emitting element 9 has a long life in addition to high efficiency.

(Fabrication of Light-Emitting Element 10)

The light-emitting element 10 is a light-emitting element having the structure described using FIG. 4A in Embodiment Mode 2. Specifically, the light-emitting element 10 is a light-emitting element of the case where the HOMO level of the second layer 1612 of FIG. 16A is deeper (the absolute value is larger) than the HOMO levels of the first layer 1611 and the third layer 1613. Furthermore, the light-emitting element 10 is a light-emitting element of the case where the seventh layer thermodynamically controls carriers (electrons) as illustrated in the conceptual diagram of FIG. 7.

The light-emitting element 10 was fabricated in a similar manner to the light-emitting element 9 except that a co-evaporated film of Alq and N,N'-diphenylquinacridone (abbreviation: DPQd) was used instead of a co-evaporated film of Alq and 2PCAPA which was used for the seventh layer 1617 of the light-emitting element 9. Here, the evaporation rate was adjusted such that the weight ratio of Alq to DPQd could be 1:0.005 (=Alq:DPQd).

Sealing was performed in a glove box under a nitrogen atmosphere so that the obtained light-emitting element 10 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 10 are shown in FIG. 26. In addition, the voltage vs. luminance characteristics are shown in FIG. 27. In addition, the luminance vs. current efficiency characteristics are shown in FIG. 28. In addition, the emission spectrum at current of 1 mA is shown in FIG. 29. Further, FIG. 30 shows the results of continuous lighting tests in which the light-emitting element 10 was continuously lit by constant current driving with the initial luminance set at 5000 cd/m$^2$ (the vertical axis indicates the relative luminance on the assumption that 5000 cd/m$^2$ is assumed as 100%).

The CIE chromaticity coordinate of the light-emitting element 10 at a luminance of 5000 cd/m$^2$ was (x=0.28, y=0.62), and green light which derives from 2PCAPA was emitted. In addition, at a luminance of 5000 cd/m$^2$, the current efficiency was 19 cd/A, meaning that extremely high efficiency was exhibited. At a luminance of 5000 cd/m$^2$, the driving voltage was 6.4 V.

Furthermore, the continuous lighting tests were conducted in which the light-emitting element 10 was continuously lit by constant current driving with the initial luminance set at 5000 cd/m$^2$. As a result, 80% of the initial luminance was maintained even after 1000 hours. Thus, it was proved that the light-emitting element 10 has a long life in addition to high efficiency.

(Fabrication of Light-Emitting Element 11)

The light-emitting element 11 is a light-emitting element having the structure described using FIG. 4A in Embodiment Mode 2. Specifically, the light-emitting element 11 is a light-emitting element of the case where the HOMO level of the second layer 1612 of FIG. 16A is deeper (the absolute value is larger) than the HOMO levels of the first layer 1611 and the third layer 1613. By co-evaporation of Furthermore, the light-emitting element 11 is a light-emitting element of the case where the seventh layer kinetically controls carriers (electrons) as illustrated in the conceptual diagrams of FIGS. 6A and 6B.

The light-emitting element 11 was fabricated in a similar manner to the light-emitting element 9 except that YGASF which was used for the second layer 1612 of the light-emitting element 9 was replaced by N,N'-bis[4-(9H-carbazol-9-yl)phenyl-N,N'-diphenylbiphenyl-4,4'-diamine (abbreviation: YGABP).

Sealing was performed in a glove box under a nitrogen atmosphere so that the obtained light-emitting element 11 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 11 are shown in FIG. 26. In addition, the voltage vs. luminance characteristics are shown in FIG. 27. In addition, the luminance vs. current efficiency characteristics are shown in FIG. 28. In addition, the emission spectrum at current of 1 mA is shown in FIG. 29. Further, FIG. 30 shows the results of continuous lighting tests in which the light-emitting element 11 was continuously lit by constant current driving with the initial luminance set at 5000 cd/m$^2$ (the vertical axis indicates the relative luminance on the assumption that 5000 cd/m$^2$ is assumed as 100%).

The CIE chromaticity coordinate of the light-emitting element 11 at a luminance of 5000 cd/m$^2$ was (x=0.29, y=0.63), and green light which derives from 2PCAPA was emitted. In addition, at a luminance of 5000 cd/m$^2$, the current efficiency was 22 cd/A, meaning that extremely high efficiency was exhibited. At a luminance of 5000 cd/m$^2$, the driving voltage was 5.2 V.

Furthermore, the continuous lighting tests were conducted in which the light-emitting element 11 was continuously lit by constant current driving with the initial luminance set at 5000 cd/m$^2$. As a result, 77% of the initial luminance was maintained even after 1000 hours. Thus, it was proved that the light-emitting element 11 has a long life in addition to high efficiency.

(Fabrication of Light-Emitting Element 12)

Next, as a light-emitting element for comparison, the light-emitting element 12 having a structure shown in FIG. 16B (a structure in which the second layer 1612 and the seventh layer 1617 of the above light-emitting elements 9 to 11 are not provided) is fabricated. The fabrication method is described below.

First, indium tin oxide containing silicon oxide was deposited over the glass substrate 1601 by a sputtering method to form the first electrode 1602. Note that the thickness thereof was set to be 110 nm and the area thereof was set to be 2 mm×2 mm.

Next, the substrate provided with the first electrode 1602 was fixed on a substrate holder that was provided in a vacuum evaporation apparatus so that a surface provided with the first electrode 1602 faced downward. The pressure in the vacuum evaporation apparatus was reduced to approximately $10^{-4}$ Pa. Then, over the first electrode 1602, 4,4'-bis[N-(1-naphthyl)-N-phenylamino]biphenyl (abbreviation: NPB) and molybdenum(VI) oxide were co-evaporated to form the first layer 1611 which is the hole-injecting layer. The thickness thereof was set to be 50 nm, and the evaporation rate was adjusted such that the weight ratio of NPB to molybdenum(VI) oxide was adjusted to be 4:1 (=NPB:molybdenum oxide). Note that a co-evaporation method is an evaporation method in which evaporation is performed using a plurality of evaporation sources in one treatment chamber at the same time.

Next, 4,4'-bis[N-(1-naphthyl)-N-phenylamino]biphenyl (abbreviation: NPB) was deposited to a thickness of 10 nm by an evaporation method using resistive heating to form the third layer 1613 that is the hole-transporting layer.

Next, the fourth layer 1614 which is the light-emitting layer is formed over the third layer 1613. By co-evaporation of 9-[4-(N-carbazolyl)phenyl]-10-phenylanthracene (abbreviation: CzPA) and N-(9,10-diphenyl-2-anthryl)-N,9-diphenyl-9H-carbazol-3-amine (abbreviation: 2PCAPA), the fourth layer 1614 with a thickness of 40 nm was formed. Here, the evaporation rate was adjusted such that the weight ratio of CzPA to 2PCAPA could be 1:0.05 (=CzPA: 2PCAPA).

Then, bathophenanthroline (abbreviation: BPhen) was deposited over the fourth layer 1614 to a thickness of 30 nm by an evaporation method using resistive heating to form the fifth layer 1615 that is the electron-transporting layer.

Next, lithium fluoride (LiF) was deposited over the fifth layer 1615 to a thickness of 1 nm to form the sixth layer 1616 that is the electron-injecting layer.

Lastly, aluminum was deposited to a thickness of 200 nm by an evaporation method using resistive heating to form the second electrode 1604. Accordingly, the light-emitting element 12 was fabricated.

Sealing was performed in a glove box under a nitrogen atmosphere so that the light-emitting element 12 obtained as described above was not exposed to the atmosphere, and then operation characteristics of this light-emitting element 12 were measured. Note that the measurements were performed at room temperature (in an atmosphere kept at 25° C.).

The current density vs. luminance characteristics of the light-emitting element 12 are shown in FIG. 26. In addition, the voltage vs. luminance characteristics are shown in FIG. 27. In addition, the luminance vs. current efficiency characteristics are shown in FIG. 28. Further, FIG. 30 shows the results of continuous lighting tests in which the light-emitting element 12 was continuously lit by constant current driving with the initial luminance set at 5000 cd/m² (the vertical axis indicates the relative luminance on the assumption that 5000 cd/m² is assumed as 100%).

The CIE chromaticity coordinate of the light-emitting element 12 at a luminance of 5000 cd/m² was (x=0.30, y=0.62), the current efficiency was 17 cd/A, and green light which derives from 2PCAPA was emitted similarly to the light-emitting elements 9 to 11. It is found that the current efficiency was lower than those of the light-emitting elements 9 to 11. Further, the continuous lighting tests were conducted in which the light-emitting element 12 was continuously lit by constant current driving with the initial luminance set at 5000 cd/m². As a result, the luminance has decreased to 70% of the initial luminance after 180 hours, as shown in FIG. 30. Thus, the light-emitting element 8 exhibited a life shorter than the light-emitting elements 9 to 11.

As described above, it can be seen that the light-emitting elements 9 to 11 have higher efficiency than the light-emitting element 12 and further has a long life. Thus, it is understood that a light-emitting element having high efficiency and a long life can be obtained by applying the present invention.

Example 4

In this example, the oxidation characteristics of N-[4-(9H-carbazol-9-yl)phenyl]-N-phenyl-spiro-9,9'-bifluoren-2-amine (abbreviation: YGASF), N,N'-bis[4-(9H-carbazol-9-yl)phenyl-N,N'-diphenylbiphenyl-4,4'-diamine (abbreviation: YGABP), 4,4',4"-tris(N-carbazolyl)triphenylamine (abbreviation: TCTA), and 4,4'-bis[N-(1-naphthyl)-N-phenylamino]biphenyl (abbreviation: NPB), which were used for the second layers (the second layer 1512 of FIG. 15A and the second layer 1612 of FIG. 16A) and the third layers (the third layer 1513 of FIGS. 15A and 15B and the third layer 1613 of FIGS. 16A and 16B) which were the hole-transporting layers of the light-emitting elements fabricated in Example 1 to 3 (the light-emitting elements 1 to 3, the light-emitting elements 5 to 7, and the light-emitting elements 9 to 11) were evaluated by cyclic voltammetry (CV) measurements.

Further, from the measurements, the LUMO levels of YGASF, YGABP, TCTA, and NPB were obtained. Note that an electrochemical analyzer (ALS model 600A or 600C, manufactured by BAS Inc.) was used for the measurements.

As for a solution used for the CV measurements, dehydrated dimethylformamide (DMF) (product of Sigma-Aldrich Inc., 99.8%, Catalog No. 22705-6) was used as a solvent, and tetra-n-butylammonium perchlorate (n-Bu$_4$NClO$_4$, product of Tokyo Chemical Industry Co., Ltd., Catalog No. T0836), which was a supporting electrolyte, was dissolved in the solvent such that the concentration of tetra-n-butylammonium perchlorate was 100 mmol/L. Furthermore, the object of the measurements was also dissolved in the solvent and adjusted such that the concentration thereof was 10 mmol/L. Note that in the case where the object was not completely dissolved, the supernatant fluid was used for the CV measurements. Further, a platinum electrode (a PTE platinum electrode, product of BAS Inc.) was used as a working electrode; a platinum electrode (a VC-3 Pt counter electrode (5 cm), product of BAS Inc.) was used as an auxiliary electrode; and an Ag/Ag$^+$ electrode (an RE5 nonaqueous solvent reference electrode, product of BAS Inc.) was used as a reference electrode. Note that the CV measurements were conducted at room temperature (greater than or equal to 20° C. and less than or equal to 25° C.).

(Calculation of Potential Energy of Reference Electrode with Respect to Vacuum Level)

First, the potential energy (eV) of the reference electrode (an Ag/Ag$^+$ electrode) used in Example 4 with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). On the other hand, when the oxidation-reduction potential of ferrocene in methanol was calculated using the reference electrode used in Example 4, the result was +0.20 [V vs. Ag/Ag$^+$]. Therefore, it was found that the potential energy of the reference electrode used in Example 4 was lower than that of the standard hydrogen electrode by 0.41 [eV].

Here, it is known that the potential energy of the standard hydrogen electrode with respect to the vacuum level is −4.44 eV (Reference: Toshihiro Ohnishi and Tamami Koyama, High Molecular EL Material, Kyoritsu Shuppan, pp. 64-67). Accordingly, the potential energy of the reference electrode used in Example 4 with respect to the vacuum level could be determined to be −4.44−0.41=−4.85 [eV].

Measurement Example 1: YGASF

Figure 31:
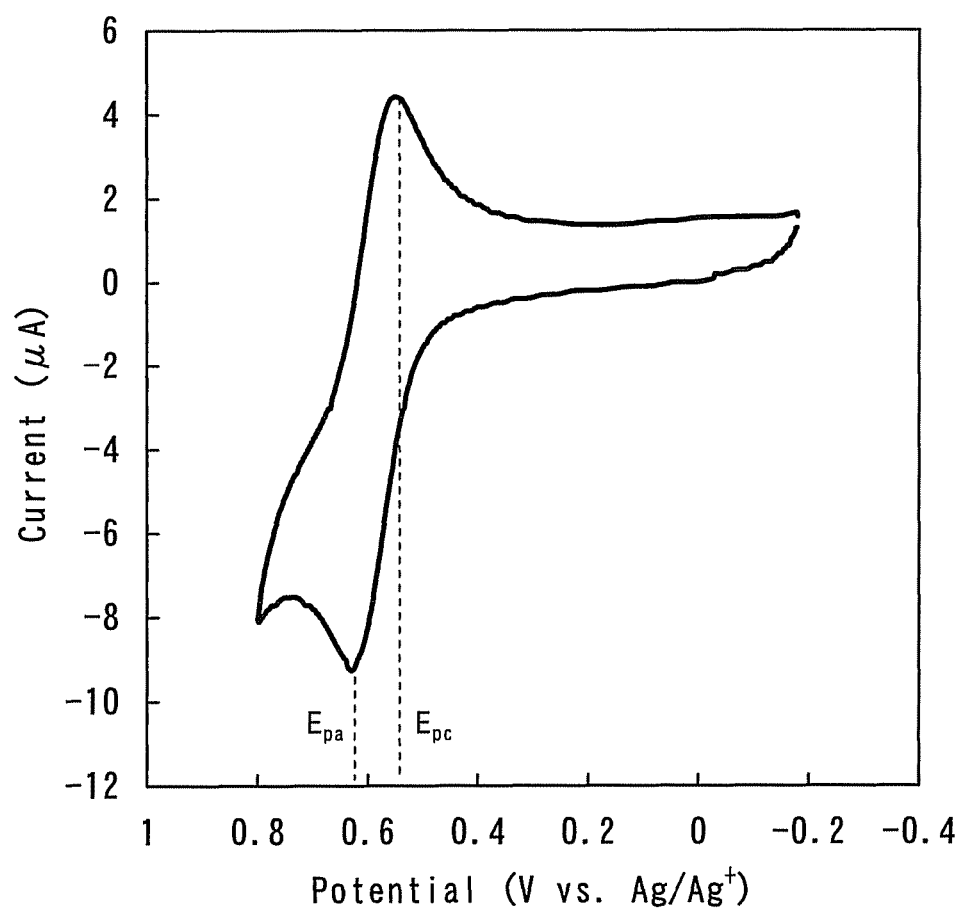
FIG. 31 is a graph illustrating CV characteristics of YGASF.

In Measurement Example 1, the oxidation characteristics of YGASF were evaluated by cyclic voltammetry (CV) measurements. The scan rate was set to be 0.1 V/sec. FIG. 31 shows the measurement results. Note that the measurements of the oxidation characteristics were performed by scanning the potential of the working electrode with respect to the reference electrode in the ranges of −0.18 V to +1.80 V and then +1.80 V to −0.18 V.

As shown in FIG. 31, it can be seen that an oxidation peak potential $E_{pa}$ is +0.63 V and a reduction peak potential $E_{pc}$ is +0.55 V. Therefore, a half-wave potential (an intermediate potential between $E_{pc}$ and $E_{pa}$) can be calculated to be +0.59 V. This shows that YGASF is oxidized by an electrical energy of +0.59 [V vs. Ag/Ag$^+$], and this energy corresponds to the HOMO level. Here, as described above, the potential energy of the reference electrode used in Example 4 with respect to the vacuum level is −4.85 [eV]. Therefore, the HOMO level of YGASF can be calculated to be −4.85−(+0.59)=−5.44 [eV].

Measurement Example 2: YGABP

Figure 32:
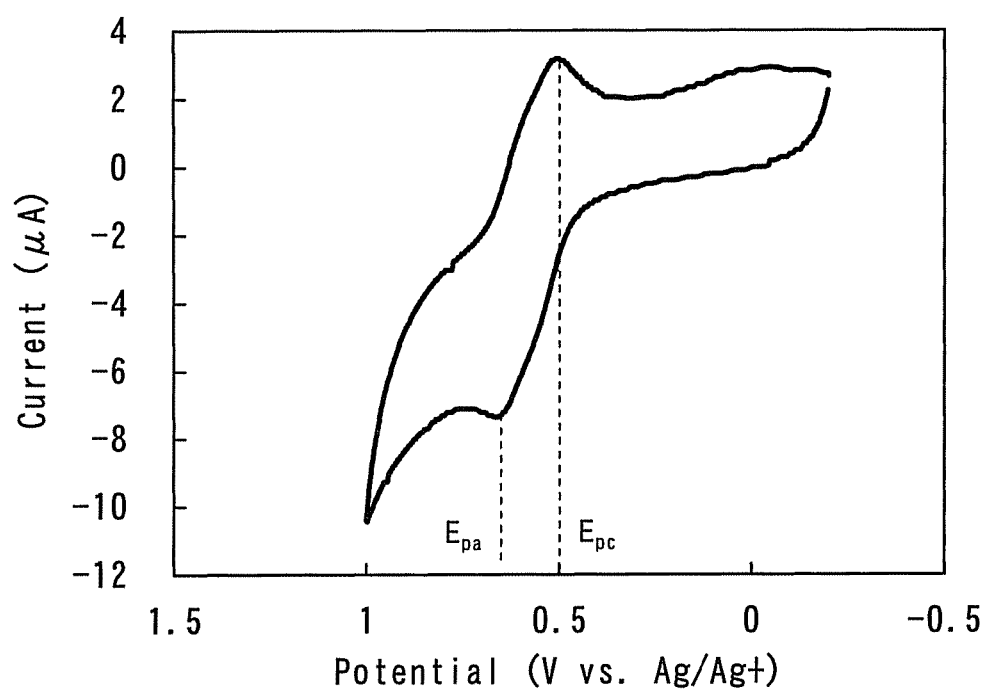
FIG. 32 is a graph illustrating CV characteristics of YGABP.

In Measurement Example 2, the oxidation characteristics of YGABP were evaluated by cyclic voltammetry (CV) measurements. The scan rate was set to be 0.1 V/sec. FIG. 32 shows the measurement results. Note that the measurements of the oxidation characteristics were performed by scanning the potential of the working electrode with respect to the reference electrode in the ranges of −0.20 V to +1.00 V and then +1.00 V to −0.20 V.

As shown in FIG. 32, it can be seen that an oxidation peak potential $E_{pa}$ is +0.66 V and a reduction peak potential $E_{pc}$ is +0.50 V. Therefore, a half-wave potential (an intermediate potential between $E_{pc}$ and $E_{pa}$) can be calculated to be +0.58 V. This shows that YGABP can be oxidized by an electrical energy of +0.58 [V vs. Ag/Ag$^+$], and this energy corresponds to the HOMO level. Here, as described above, the potential energy of the reference electrode used in Example 4 with respect to the vacuum level is −4.85 [eV]. Therefore, the HOMO level of YGABP can be calculated to be −4.85−(+0.58)=−5.43 [eV].

Measurement Example 3: TCTA

Figure 33:
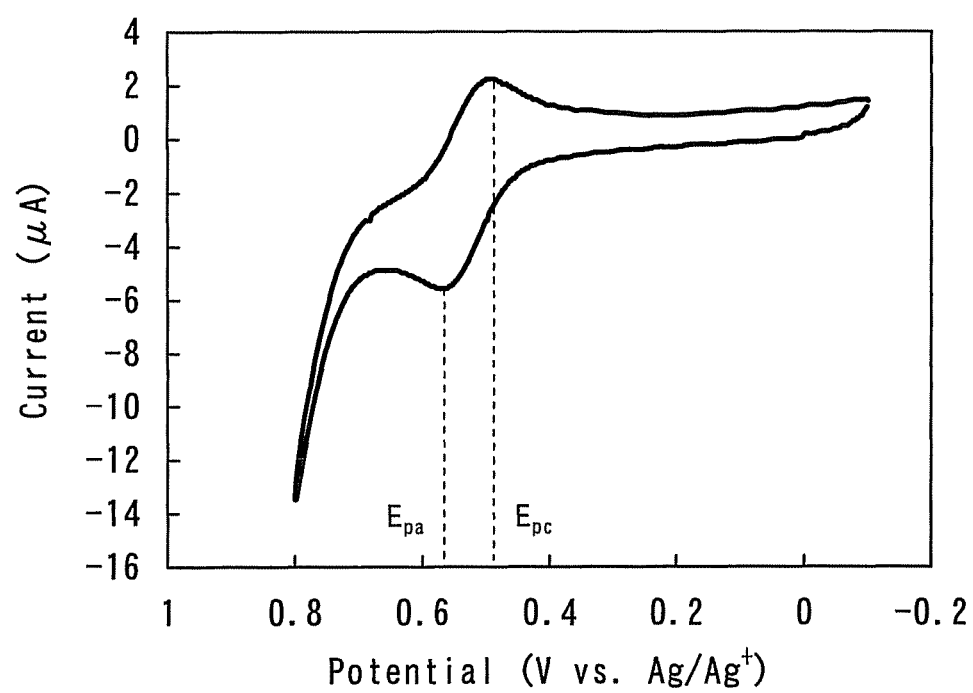
FIG. 33 is a graph illustrating CV characteristics of TCTA.

In Measurement Example 3, the oxidation characteristics of TCTA were evaluated by cyclic voltammetry (CV) measurements. The scan rate was set to be 0.1 V/sec. FIG. 33 shows the measurement results. Note that the measurements of the oxidation characteristics were performed by scanning the potential of the working electrode with respect to the reference electrode in the ranges of −0.10 V to +0.80 V and then +0.80 V to −0.10 V.

As shown in FIG. 33, it can be seen that an oxidation peak potential $E_{pa}$ is +0.57 V and a reduction peak potential $E_{pc}$ is +0.49 V. Therefore, a half-wave potential (an intermediate potential between $E_{pc}$ and $E_{pa}$) can be calculated to be +0.53 V. This shows that TCTA can be oxidized by an electrical energy of +0.53 [V vs. Ag/Ag$^+$], and this energy corresponds to the HOMO level. Here, as described above, the potential energy of the reference electrode used in Example 4 with respect to the vacuum level is −4.85 [eV]. Therefore, the HOMO level of TCTA can be calculated to be −4.85−(+0.53)=−5.38 [eV].

Measurement Example 4: NPB

Figure 34:
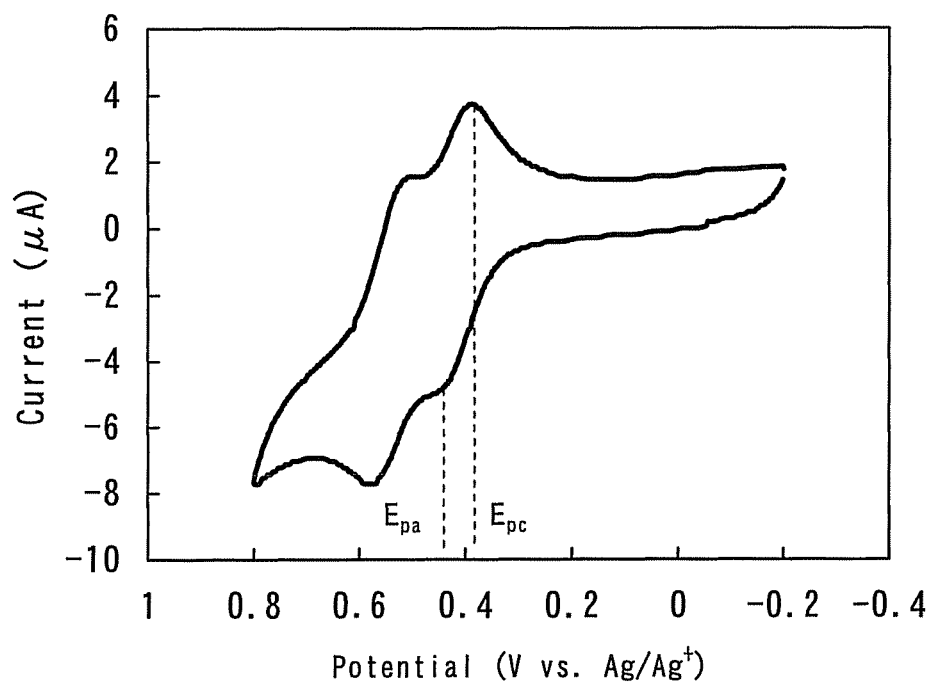
FIG. 34 is a graph illustrating CV characteristics of NPB.

In Measurement Example 4, the oxidation characteristics of NPB were evaluated by cyclic voltammetry (CV) measurements. The scan rate was set to be 0.1 V/sec. FIG. 34 shows the measurement results. Note that the measurements of the oxidation characteristics were performed by scanning the potential of the working electrode with respect to the reference electrode in the ranges of −0.20 V to +0.80 V and then +0.80 V to −0.20 V.

As shown in FIG. 34, it can be seen that an oxidation peak potential $E_{pa}$ is +0.45 V and a reduction peak potential $E_{pc}$ is +0.39 V. Therefore, a half-wave potential (an intermediate potential between $E_{pc}$ and $E_{pa}$) can be calculated to be +0.42 V. This shows that NPB can be oxidized by an electrical energy of +0.42 [V vs. Ag/Ag$^+$], and this energy corresponds to the HOMO level. Here, as described above, the potential energy of the reference electrode used in Example 4 with respect to the vacuum level is −4.85 [eV]. Therefore, the HOMO level of NPB can be calculated to be −4.85−(+0.42)=−5.27 [eV].

Measurement Example 5: DNTPD

Figure 35:
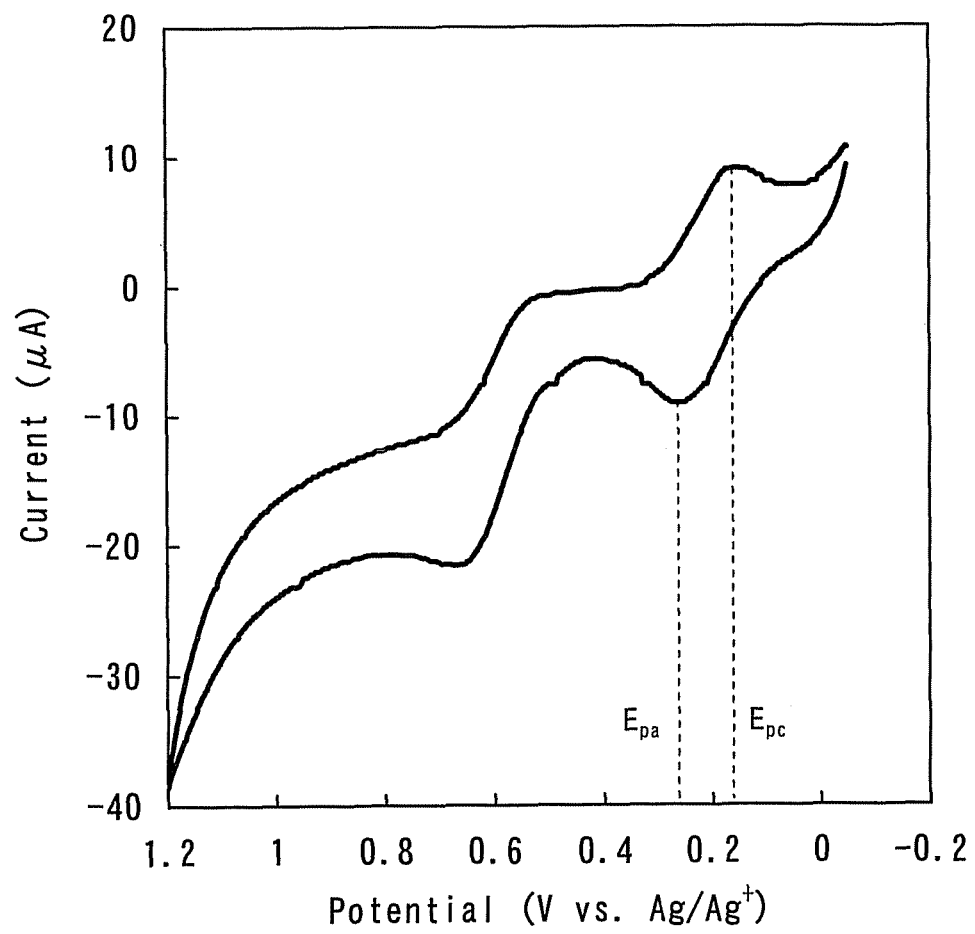
FIG. 35 is a graph illustrating CV characteristics of DNTPD.

In Measurement Example 5, the oxidation characteristics of DNTPD were evaluated by cyclic voltammetry (CV) measurements. The scan rate was set to be 0.1 V/sec. FIG. 35 shows the measurement results. Note that the measurements of the oxidation characteristics were performed by scanning the potential of the working electrode with respect to the reference electrode in the ranges of −0.05 V to +1.20 V and then +1.20 V to −0.05 V.

As shown in FIG. 35, it can be seen that an oxidation peak potential $E_{pa}$ is +0.26 V and a reduction peak potential $E_{pc}$ is +0.15 V. Therefore, a half-wave potential (an intermediate potential between $E_{pc}$ and $E_{pa}$) can be calculated to be +0.21 V. This shows that DNTPD can be oxidized by an electrical energy of +0.21 [V vs. Ag/Ag$^+$], and this energy corresponds to the HOMO level. Here, as described above, the potential energy of the reference electrode used in Example 4 with respect to the vacuum level is −4.85 [eV]. Therefore, the HOMO level of DNTPD can be calculated to be −4.85−(+0.21)=−5.06 [eV].

Note that by comparison among the HOMO levels of YGASF, YGABP, TCTA, and NPB which were calculated in the above-described manner, it can be found that the HOMO level of YGASF is lower than that of NPB by 0.17 [eV], the HOMO level of YGABP is lower than that of NPB by 0.16 [eV], and the HOMO level of TCTA is lower than that of NPB by 0.16 [eV]. Further, by comparison among the HOMO levels of DNTPD and NPB which were calculated in the above-described manner, it can be found that the HOMO level of DNTPD is higher than that of NPB by 0.21 [eV].

This implies that by forming the second layer which is the first hole-transporting layers (second layer 1512 of FIG. 15A or the second layer 1612 of FIG. 16A) using YGASF, YGABP, TCTA, or DNTPD and forming the third layer which is the second hole-transporting layers (third layer 1513 of FIG. 15A or 15B and the third layer 1613 of FIGS. 16A and 16B) using NPB, an energy gap that suppresses transport of holes are generated between the second layer the third layer. That is, the second layer (second layer 1512 of FIG. 15A or the second layer 1612 of FIG. 16A) can suppress the amount of holes injected into the third layer (third layer 1513 of FIGS. 15A and 15B or the third layer 1613 of FIGS. 16A and 16B) and reduce the rate of transport of holes.

Thus, it can be said that the element structures of Example 1 to 3 in which YGASF, YGABP, TCTA, or DNTPD is used for the second layer which is the first hole-transporting layer of the light-emitting element of the present invention are suitable for the present invention.

Example 5

In this example, the reduction characteristics of tris(8-quinolinolato)aluminum(III) (abbreviation: Alq), N,N-diphenylquinacridone (abbreviation: DPQd), and N-(9,10-diphenyl-2-anthryl)-N,9-diphenyl-9H-carbazol-3-amine (abbreviation: 2PCAPA), which were used for the seventh layer which is the carrier control layer for controlling the transport of electron carriers (the seventh layer 1617 of FIG. 16A) in the light-emitting elements fabricated in Example 2 (the light-emitting elements 5 to 7) and the light-emitting elements fabricated in Example 3 (the light-emitting elements 9 to 11), were evaluated by cyclic voltammetry (CV) measurements. Further, from the measurements, the LUMO levels of Alq, DPQd, and 2PCAPA were obtained. Note that an electrochemical analyzer (ALS model 600A or 600C, manufactured by BAS Inc.) was used for the measurements.

As for a solution used for the CV measurements, dehydrated dimethylformamide (DMF) (product of Sigma-Aldrich Inc., 99.8%, Catalog No. 22705-6) was used as a solvent, and tetra-n-butylammonium perchlorate (n-Bu$_4$NClO$_4$, product of Tokyo Chemical Industry Co., Ltd., Catalog No. T0836), which was a supporting electrolyte, was dissolved in the solvent such that the concentration of tetra-n-butylammonium perchlorate was 100 mmol/L. Furthermore, the object of the measurements was also dissolved in the solvent and adjusted such that the concentration thereof was 10 mmol/L. Note that in the case where the object was not completely dissolved, the supernatant fluid was used for the CV measurements. Further, a platinum electrode (a PTE platinum electrode, product of BAS Inc.) was used as a working electrode; a platinum electrode (a VC-3 Pt counter electrode (5 cm), product of BAS Inc.) was used as an auxiliary electrode; and an Ag/Ag$^+$ electrode (an RE5 nonaqueous solvent reference electrode, product of BAS Inc.) was used as a reference electrode. Note that the CV measurements were conducted at room temperature (greater than or equal to 20° C. and less than or equal to 25° C.).

(Calculation of Potential Energy of Reference Electrode with Respect to Vacuum Level)

First, the potential energy (eV) of the reference electrode (an Ag/Ag$^+$ electrode) used in Example 5 with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., J. Am. Chem. Soc., Vol. 124, No. 1, pp. 83-96, 2002). On the other hand, when the oxidation-reduction potential of ferrocene in methanol was calculated using the reference electrode used in Example 5, the result was +0.20 [V vs. Ag/Ag$^+$]. Therefore, it was found that the potential energy of the reference electrode used in Example 5 was lower than that of the standard hydrogen electrode by 0.41 [eV].

Here, it is known that the potential energy of the standard hydrogen electrode with respect to the vacuum level is −4.44 eV (Reference: Toshihiro Ohnishi and Tamami Koyama, High Molecular EL Material, Kyoritsu Shuppan, pp. 64-67). Accordingly, the potential energy of the reference electrode used in Example 5 with respect to the vacuum level could be determined to be −4.44−0.41=−4.85 [eV].

Measurement Example 6: Alq

Figure 36:
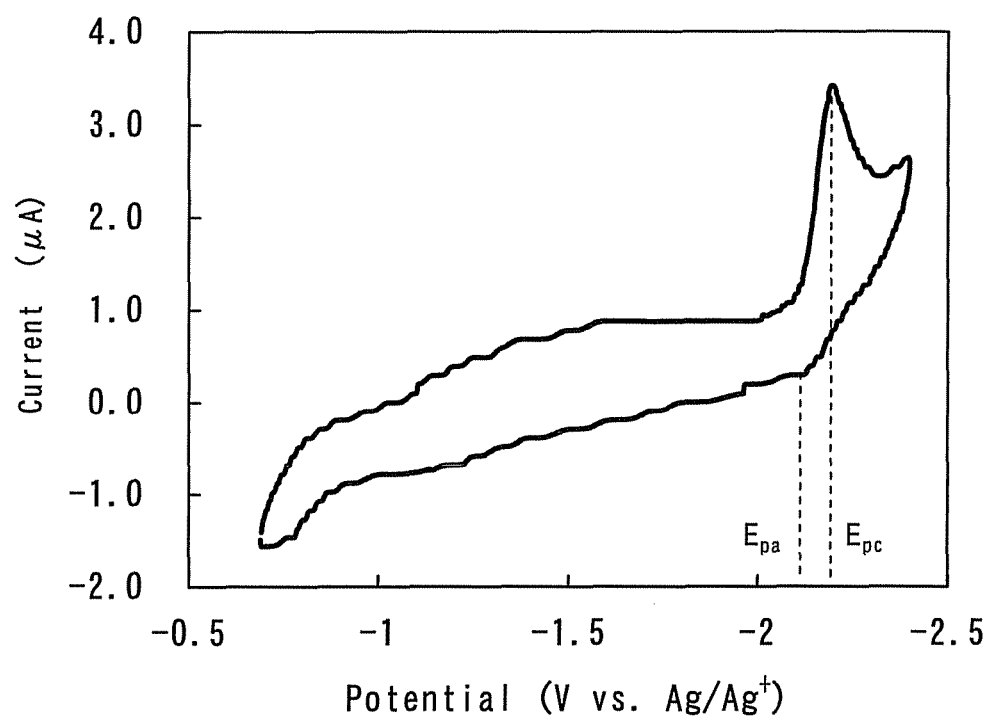
FIG. 36 is a graph illustrating CV characteristics of Alq.

In Measurement Example 6, the reduction characteristics of Alq were evaluated by cyclic voltammetry (CV) measurements. The scan rate was set to be 0.1 V/sec. FIG. 36 shows the measurement results. Note that the measurements of the reduction characteristics were performed by scanning the potential of the working electrode with respect to the reference electrode in the ranges of −0.69 V to −2.40 V and then −2.40 V to −0.69 V.

As shown in FIG. 36, it can be seen that a reduction peak potential $E_{pc}$ is −2.20 V and an oxidation peak potential $E_{pa}$ is −2.12 V. Therefore, a half-wave potential (an intermediate potential between $E_{pc}$ and $E_{pa}$) can be calculated to be −2.16 V. This shows that Alq can be reduced by an electrical energy of −2.16 [V vs. Ag/Ag$^+$], and this energy corresponds to the LUMO level. Here, as described above, the potential energy of the reference electrode used in Example 5 with respect to the vacuum level is −4.85 [eV]. Therefore, the LUMO level of Alq can be calculated to be −4.85−(−2.16) =−2.69 [eV].

Measurement Example 7: DPQd

Figure 37:
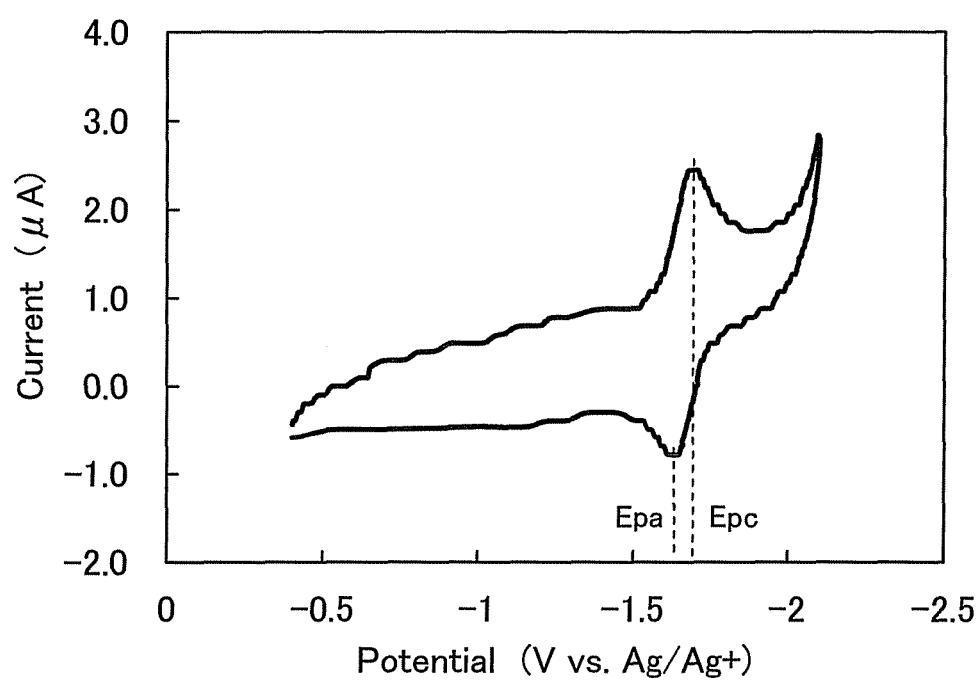
FIG. 37 is a graph illustrating CV characteristics of DPQd.

In Measurement Example 7, the reduction characteristics of DPQd were evaluated by cyclic voltammetry (CV) measurements. The scan rate was set to be 0.1 V/sec. FIG. 37 shows the measurement results. Note that the measurements of the reduction characteristics were performed by scanning the potential of the working electrode with respect to the reference electrode in the ranges of −0.40 V to −2.10 V and then −2.10 V to −0.40 V. Further, since DPQd has low solubility and could not be completely dissolved in a solvent even when the solution was adjusted to contain DPQd at a concentration of 10 mmol/L, the supernatant fluid was extracted with the undissolved residue precipitated and used for the measurements.

As shown in FIG. 37, it can be seen that a reduction peak potential $E_{pc}$ is −1.69 V and an oxidation peak potential $E_{pa}$ is −1.63 V. Therefore, a half-wave potential (an intermediate potential between $E_{pc}$ and $E_{pa}$) can be calculated to be −1.66 V. This shows that DPQd can be reduced by an electrical energy of −1.66 [V vs. Ag/Ag$^+$], and this energy corresponds to the LUMO level. Here, as described above, the potential energy of the reference electrode used in Example 5 with respect to the vacuum level is −4.85 [eV]. Therefore, the LUMO level of DPQd can be calculated to be −4.85−(−1.66)=−3.19 [eV].

Measurement Example 8: 2PCAPA

Figure 38:
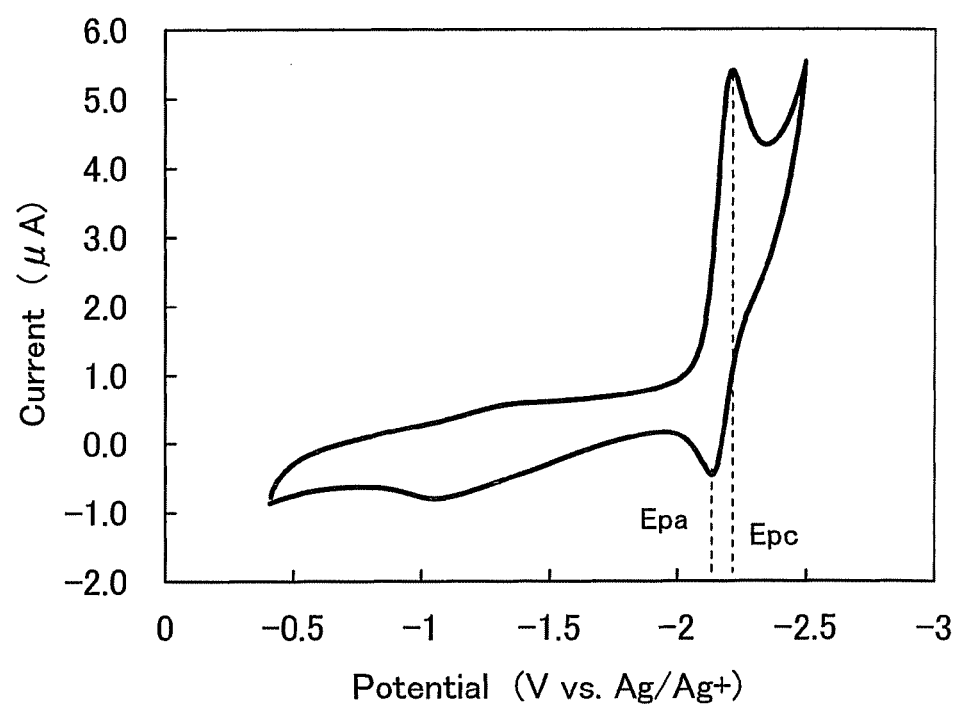
FIG. 38 is a graph illustrating CV characteristics of 2PCAPA.

In Measurement Example 8, the reduction characteristics of 2PCAPA were evaluated by cyclic voltammetry (CV) measurements. The scan rate was set to be 0.1 V/sec. FIG. 38 shows the measurement results. Note that the measurements of the reduction characteristics were performed by scanning the potential of the working electrode with respect to the reference electrode in the ranges of −0.41 V to −2.50 V and then −2.50 V to −0.41 V.

As shown in FIG. 38, it can be seen that a reduction peak potential $E_{pc}$ is −2.21 V and an oxidation peak potential $E_{pa}$ is −2.14 V. Therefore, a half-wave potential (an intermediate potential between $E_{pc}$ and $E_{pa}$) can be calculated to be −2.18 V. This shows that 2PCAPA can be reduced by an electrical energy of −2.18 [V vs. Ag/Ag$^+$], and this energy corresponds to the LUMO level. Here, as described above, the potential energy of the reference electrode used in Example 5 with respect to the vacuum level is −4.85 [eV]. Therefore, the LUMO level of 2PCAPA can be calculated to be −4.85−(−2.18)=−2.67 [eV].

Note that by comparison between the LUMO levels of Alq and DPQd which were calculated in the above-described manner, it can be found that the LUMO level of DPQd is lower than that of Alq by as much as 0.50 [eV]. This means that by adding DPQd to Alq, DPQd acts as an electron trap. This is the case described in Embodiment Mode 2 in which the seventh layer thermodynamically controls transport of carriers (electrons) and is formed of a metal complex which is a material having an electron-transporting property (Alq) and a quinacridone derivative having an electron-trapping property (DPQd).

Further, by comparison between the LUMO levels of Alq and 2PCAPA which were calculated in the above-described manner, it can be found that a difference between the LUMO levels of 2PCAPA and Alq is only 0.02 [eV]. This means that by adding 2PCAPA to Alq, electrons can be easily transported to 2PCAPA, and the rate of transport of electrons of the whole layer is reduced. This is the case described in Embodiment Mode 2 in which the seventh layer controls transport of carriers kinetically and is formed of a metal complex that is a material having an electron-transporting property (Alq) and an aromatic amine compound having an electron-transporting property (2PCAPA).

Thus, an element structure including a carrier control layer formed of a combination of Alq and DPQd or a combination of Alq and 2PCAPA is suitable for the present invention.

This application is based on Japanese Patent Application serial no. 2007-250934 filed with Japan Patent Office on Sep. 27, 2007, the entire contents of which are hereby incorporated by reference.

What is claimed is:

1. A light-emitting element comprising:
a first electrode;
a second electrode; and
an EL layer between the first electrode and the second electrode, the EL layer comprising:
a first layer including a substance having an acceptor property and a first substance having a hole-transporting property over the first electrode;
a second layer including a second substance having a hole-transporting property over the first layer;
a third layer including the first substance having a hole-transporting property over the second layer; and
a fourth layer including a substance having a light-emitting property over the third layer,
wherein the second layer is provided between the first layer and the third layer, and
wherein an absolute value of a highest occupied molecular orbital level of the second substance is larger than an absolute value of highest occupied molecular orbital level of the first substance.

2. The light-emitting element according to claim 1,
wherein the absolute value of the highest occupied molecular orbital level of the second substance is larger than the absolute value of the highest occupied molecular orbital level of the first substance by 0.1 eV or more.

3. A light-emitting element comprising:
an anode;
an cathode; and
an EL layer between the anode and the cathode, the EL layer comprising:
a first layer including a substance having an acceptor property and a first substance having a hole-transporting property over the anode;
a second layer including a second substance having a hole-transporting property over the first layer;
a third layer including the first substance having a hole-transporting property over the second layer; and
a fourth layer including a substance having a light-emitting property over the third layer,
wherein the second layer is provided between the first layer and the third layer, and
wherein an absolute value of a highest occupied molecular orbital level of the second substance is smaller than an absolute value of highest occupied molecular orbital level of the first substance.

4. The light-emitting element according to claim 3,
wherein the absolute value of the highest occupied molecular orbital level of the second substance is smaller than the absolute value of the highest occupied molecular orbital level of the first substance by 0.1 eV or more.

5. A light-emitting element comprising:
a first electrode;
a second electrode; and
an EL layer between the first electrode and the second electrode, the EL layer comprising:
a first layer including a substance having an acceptor property and a first substance having a hole-transporting property over the first electrode;
a second layer including a second substance having a hole-transporting property over the first layer;
a third layer including the first substance having a hole-transporting property over the second layer; and
a fourth layer including a substance having a light-emitting property over the third layer; and
a fifth layer controlling transport of electrons between the second electrode and the fourth layer,
wherein the second layer is provided between the first layer and the third layer,
wherein an absolute value of a highest occupied molecular orbital level of the second substance is larger than an absolute value of a highest occupied molecular orbital level of the first substance, and
wherein the fifth layer comprises a first organic compound having an electron-transporting property and a second organic compound having a hole-transporting property, and a content of the second organic compound is less than 50% of the total in mass ratio.

6. A light-emitting element comprising:
an anode;
an cathode; and
an EL layer between the anode and the cathode, the EL layer comprising:
a first layer including a substance having an acceptor property and a first substance having a hole-transporting property over the anode;
a second layer including a second substance having a hole-transporting property over the first layer,
a third layer including the first substance having a hole-transporting property over the second layer;

a fourth layer including a substance having a light-emitting property over the third layer; and
a fifth layer controlling transport of electrons between the cathode and the fourth layer,
wherein the second layer is provided between the first layer and the third layer,
wherein an absolute value of a highest occupied molecular orbital level of the second substance is smaller than an absolute value of highest occupied molecular orbital level of the first substance, and
wherein the fifth layer comprises a first organic compound having an electron-transporting property and a second organic compound having a hole-transporting property, and a content of the second organic compound is less than 50% of the total in mass ratio.

7. The light-emitting element according to claim 5,
wherein a difference between an absolute value of a lowest unoccupied molecular orbital level of the second organic compound and an absolute value of a lowest unoccupied molecular orbital level of the first organic compound is 0.3 eV or less, and
wherein a relationship of $P_1/P_2 \geq 3$ is satisfied where a dipole moment of the first organic compound is $P_1$ and a dipole moment of the second organic compound is $P_2$.

8. The light-emitting element according to claim 6,
wherein a difference between an absolute value of a lowest unoccupied molecular orbital level of the second organic compound and an absolute value of a lowest unoccupied molecular orbital level of the first organic compound is 0.3 eV or less, and
wherein a relationship of $P_1/P_2 \geq 3$ is satisfied where a dipole moment of the first organic compound is $P_1$ and a dipole moment of the second organic compound is $P_2$.

9. The light-emitting element according to claim 5,
wherein a difference between an absolute value of a lowest unoccupied molecular orbital level of the second organic compound and an absolute value of a lowest unoccupied molecular orbital level of the first organic compound is 0.3 eV or less,
wherein the first organic compound is a metal complex, and
wherein the second organic compound is an aromatic amine compound.

10. The light-emitting element according to claim 6,
wherein a difference between an absolute value of a lowest unoccupied molecular orbital level of the second organic compound and an absolute value of a lowest unoccupied molecular orbital level of the first organic compound is 0.3 eV or less,
wherein the first organic compound is a metal complex, and
wherein the second organic compound is an aromatic amine compound.

11. A light-emitting element comprising:
a first electrode;
a second electrode; and
an EL layer between the first electrode and the second electrode, the EL layer comprising:
a first layer including a substance having an acceptor property and a first substance having a hole-transporting property over the first electrode;
a second layer including a second substance having a hole-transporting property over the first layer
a third layer including the first substance having a hole-transporting property over the second layer;
a fourth layer including a substance having a light-emitting property over the third layer; and
a fifth layer controlling transport of electrons between the second electrode and the fourth layer,
wherein the second layer is provided between the first layer and the third layer,
wherein an absolute value of a highest occupied molecular orbital level of the second substance is larger than an absolute value of a highest occupied molecular orbital level of the first substance, and
wherein the fifth layer comprises a first organic compound having an electron-transporting property and a second organic compound having an electron-trapping property, and a content of the second organic compound is less than 50% of the total in mass ratio.

12. A light-emitting element comprising:
a first electrode;
a second electrode; and
an EL layer between the first electrode and the second electrode, the EL layer comprising:
a first layer including a substance having an acceptor property and a first substance having a hole-transporting property over the first electrode;
a second layer including a second substance having a hole-transporting property over the first layer;
a third layer including the first substance having a hole-transporting property over the second layer;
a fourth layer including a substance having a light-emitting property over the third layer; and
a fifth layer controlling transport of electrons between the second electrode and the fourth layer,
wherein the second layer is provided between the first layer and the third layer,
wherein an absolute value of a highest occupied molecular orbital level of the second substance is smaller than an absolute value of highest occupied molecular orbital level of the first substance, and
wherein the fifth layer comprises a first organic compound having an electron-transporting property and a second organic compound having an electron-trapping property, and a content of the second organic compound is less than 50% of the total in mass ratio.

13. The light-emitting element according to claim 11,
wherein an absolute value of a lowest unoccupied molecular orbital level of the second organic compound is larger than an absolute value of lowest unoccupied molecular orbital level of the first organic compound by 0.3 eV or more.

14. The light-emitting element according to claim 12,
wherein an absolute value of a lowest unoccupied molecular orbital level of the second organic compound is larger than an absolute value of lowest unoccupied molecular orbital level of the first organic compound by 0.3 eV or more.

15. The light-emitting element according to claim 11,
wherein the first organic compound is a metal complex, and
wherein the second organic compound is a coumarin derivative.

16. The light-emitting element according to claim 12,
wherein the first organic compound is a metal complex, and
wherein the second organic compound is a coumarin derivative.

17. The light-emitting element according to claim 11,
wherein the first organic compound is a metal complex, and
wherein the second organic compound is a quinacridone derivative.

18. The light-emitting element according to claim 12,
wherein the first organic compound is a metal complex, and
wherein the second organic compound is a quinacridone derivative.

19. The light-emitting element according to claim 1,
wherein the fourth layer comprises a substance having an electron-transporting property.

20. The light-emitting element according to claim 3,
wherein the fourth layer comprises a substance having an electron-transporting property.

21. The light-emitting element according to claim 5,
wherein the fourth layer comprises a substance having an electron-transporting property.

22. The light-emitting element according to claim 6,
wherein the fourth layer comprises a substance having an electron-transporting property.

23. The light-emitting element according to claim 11,
wherein the fourth layer comprises a substance having an electron-transporting property.

24. The light-emitting element according to claim 12,
wherein the fourth layer comprises a substance having an electron-transporting property.

25. The light-emitting element according to claim 5,
wherein a thickness of the fifth layer is greater than or equal to 5 nm and less than or equal to 20 nm.

26. The light-emitting element according to claim 6,
wherein a thickness of the fifth layer is greater than or equal to 5 nm and less than or equal to 20 nm.

27. The light-emitting element according to claim 11,
wherein a thickness of the fifth layer is greater than or equal to 5 nm and less than or equal to 20 nm.

28. The light-emitting element according to claim 12,
wherein a thickness of the fifth layer is greater than or equal to 5 nm and less than or equal to 20 nm.

29. A light-emitting device comprising the light-emitting element according to claim 1.

30. A light-emitting device comprising the light-emitting element according to claim 3.

31. A light-emitting device comprising the light-emitting element according to claim 5.

32. A light-emitting device comprising the light-emitting element according to claim 6.

33. A light-emitting device comprising the light-emitting element according to claim 11.

34. A light-emitting device comprising the light-emitting element according to claim 12.

35. An electronic appliance comprising the light-emitting device according to claim 29.

36. An electronic appliance comprising the light-emitting device according to claim 30.

37. An electronic appliance comprising the light-emitting device according to claim 31.

38. An electronic appliance comprising the light-emitting device according to claim 32.

39. An electronic appliance comprising the light-emitting device according to claim 33.

40. An electronic appliance comprising the light-emitting device according to claim 34.

41. The light-emitting element according to claim 6,
wherein a difference between a wavelength of the highest peak of an emission spectrum of the second organic compound and a wavelength of the highest peak of an emission spectrum of the substance in the fourth layer is within 30 nm.

42. The light-emitting element according to claim 6,
wherein a substance in the fourth layer is a phosphorescent compound, and
wherein the second organic compound is a phosphorescent compound.

* * * * *